US012812838B2

(12) United States Patent
Chen et al.

(10) Patent No.: US 12,812,838 B2
(45) Date of Patent: Nov. 24, 2026

(54) SEMICONDUCTOR STRUCTURE AND METHOD FOR FORMING THE SAME

(71) Applicant: Taiwan Semiconductor Manufacturing Company, Ltd., Hsinchu (TW)

(72) Inventors: Jui-Lin Chen, Taipei City (TW); Shau-Wei Lu, Taoyuan City (TW); Lien-Jung Hung, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 102 days.

(21) Appl. No.: 18/903,654

(22) Filed: Oct. 1, 2024

(65) Prior Publication Data

US 2025/0374514 A1 Dec. 4, 2025

Related U.S. Application Data

(60) Provisional application No. 63/652,352, filed on May 28, 2024.

(51) Int. Cl.
*G11C 11/41* (2006.01)
*G11C 11/412* (2006.01)
(Continued)

(52) U.S. Cl.
CPC ............ *H10B 12/10* (2023.02); *G11C 11/412* (2013.01); *G11C 11/419* (2013.01);
(Continued)

(58) Field of Classification Search
CPC ...... H10B 12/10; H10B 10/125; H10B 10/12; G11C 11/412; G11C 11/419; H10D 30/014; H10D 30/43; H10D 30/6735; H10D 30/6757; H10D 62/121; H10D 64/017; H10D 64/018; H10D 84/017;
(Continued)

(56) References Cited

U.S. PATENT DOCUMENTS 9,209,247 B2 12/2015 Colinge et al.
9,236,267 B2 1/2016 De et al.
(Continued)

FOREIGN PATENT DOCUMENTS

TW 201725630 A 7/2017
TW 201729348 A 8/2017
TW 202337027 A 9/2023

*Primary Examiner* — Xiaochun L Chen
(74) *Attorney, Agent, or Firm* — Birch, Stewart, Kolasch & Birch, LLP

(57) ABSTRACT

A method for forming a semiconductor structure is provided. The method includes forming a first active region and a second active region in an n-type well and a p-type well of a substrate, respectively. Each of the first active region and the second active region includes first semiconductor layers and second semiconductor layers alternatingly stacked. The method also includes replacing the first semiconductor layers of the first active region with dielectric layers, removing the dielectric layers to form a plurality of first gaps, removing the first semiconductor layers of the second active region to form a plurality of second gaps, and forming a first gate stack to fill the plurality of first gaps and the plurality of second gaps.

20 Claims, 70 Drawing Sheets

(51) Int. Cl.

| | |
|---|---|
| ***G11C 11/419*** | (2006.01) |
| ***H10B 12/10*** | (2023.01) |
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 64/01*** | (2025.01) |
| ***H10D 84/01*** | (2025.01) |
| ***H10D 84/03*** | (2025.01) |

(52) U.S. Cl.
CPC ........... *H10D 30/014* (2025.01); *H10D 30/43* (2025.01); *H10D 30/6735* (2025.01); *H10D 30/6757* (2025.01); *H10D 62/121* (2025.01); *H10D 64/017* (2025.01); *H10D 64/018* (2025.01); *H10D 84/017* (2025.01); *H10D 84/0188* (2025.01); *H10D 84/038* (2025.01)

(58) Field of Classification Search
CPC ............. H10D 84/0188; H10D 84/038; H10D 84/0167; H10D 84/8311; H10D 84/85; H10D 84/0165; H10D 84/851
See application file for complete search history.

(56) References Cited

U.S. PATENT DOCUMENTS

| | | | | |
|---|---|---|---|---|
| 9,412,817 | B2 | 8/2016 | Yang et al. | |
| 9,412,828 | B2 | 8/2016 | Ching et al. | |
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 2012/0007051 | A1* | 1/2012 | Bangsaruntip ......... | B82Y 10/00 977/762 |
| 2013/0341704 | A1* | 12/2013 | Rachmady ........... | H10D 62/122 977/890 |
| 2021/0233909 | A1* | 7/2021 | Bao .................... | H10D 84/0167 |
| 2023/0046028 | A1* | 2/2023 | Pao .................... | H10D 30/6735 |

* cited by examiner

SEMICONDUCTOR STRUCTURE AND METHOD FOR FORMING THE SAME

PRIORITY CLAIM

This application claims the benefit of U.S. Provisional Application No. 63/652,352, filed on May 28, 2024 and entitled "SRAM DEVICE AND METHOD FOR FORMING THE SAME," which is incorporated herein by reference.

BACKGROUND

The electronics industry is experiencing an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure, which can extend around the channel region and provide access to the channel on two or four sides. GAA devices are compatible with conventional complementary metal-oxide-semiconductor (CMOS) processes, and their structure allows them to be aggressively scaled-down while maintaining gate control and mitigating SCEs. In conventional processes, GAA devices provide a channel in a silicon nanowire. However, integration of fabrication of the GAA features around the nanowire can be challenging. For example, while current methods have been satisfactory in many respects, continued improvements are still needed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 5A-1, 5A-2 and 5A-3 are cross-sectional views illustrating the formation of a semiconductor structure of SRAM cells at one of the intermediate stages corresponding to line X1-X1, line X2-X2 and line Y-Y of FIG. 4, in accordance with some embodiments of the disclosure.

FIGS. 5B-1, 5B-2 and 5B-3 are cross-sectional views illustrating the formation of a semiconductor structure of SRAM cells at one of the intermediate stages corresponding to line X1-X1, line X2-X2 and line Y-Y of FIG. 4, in accordance with some embodiments of the disclosure.

FIGS. 5C-1, 5C-2 and 5C-3 are cross-sectional views illustrating the formation of a semiconductor structure of SRAM cells at one of the intermediate stages corresponding to line X1-X1, line X2-X2 and line Y-Y of FIG. 4, in accordance with some embodiments of the disclosure.

FIGS. 5G-1, 5G-2 and 5G-3 are cross-sectional views illustrating the formation of a semiconductor structure of SRAM cells at one of the intermediate stages corresponding to line X1-X1, line X2-X2 and line Y-Y of FIG. 4, in accordance with some embodiments of the disclosure.

FIGS. 5J-1 and 5J-2 are cross-sectional views illustrating the formation of a semiconductor structure of SRAM cells at one of the intermediate stages corresponding to line X1-X1 and line X2-X2 of FIG. 4, in accordance with some embodiments of the disclosure.

FIGS. 5K-1, 5K-2 and 5K-3 are cross-sectional views illustrating the formation of a semiconductor structure of SRAM cells at one of the intermediate stages corresponding to line X1-X1, line X2-X2 and line Y-Y of FIG. 4, in accordance with some embodiments of the disclosure.

FIGS. 5L-1, 5L-2 and 5L-3 are cross-sectional views illustrating the formation of a semiconductor structure of SRAM cells at one of the intermediate stages corresponding to line X1-X1, line X2-X2 and line Y-Y of FIG. 4, in accordance with some embodiments of the disclosure.

FIGS. 5M-1, 5M-2 and 5M-3 are cross-sectional views illustrating the formation of a semiconductor structure of SRAM cells at one of the intermediate stages corresponding to line X1-X1, line X2-X2 and line Y-Y of FIG. 4, in accordance with some embodiments of the disclosure.

FIG. 5M-4 is a plan view corresponding to plan A-A of FIG. 5M-1, in accordance with some embodiments of the disclosure.

FIG. 5M-5 is a plan view corresponding to plan B-B of FIG. 5M-1, in accordance with some embodiments of the disclosure.

FIGS. 6A-1 and 6A-2 are cross-sectional views illustrating the formation of a semiconductor structure of SRAM cells at one of the intermediate stages corresponding to line X1-X1 and line X2-X2 of FIG. 4, in accordance with some embodiments of the disclosure.

FIGS. 6C-1 and 6C-2 are cross-sectional views illustrating the formation of a semiconductor structure of SRAM cells at one of the intermediate stages corresponding to line X1-X1 and line X2-X2 of FIG. 4, in accordance with some embodiments of the disclosure.

FIGS. 6D-1 and 6D-2 are cross-sectional views illustrating the formation of a semiconductor structure of SRAM cells at one of the intermediate stages corresponding to line X1-X1 and line X2-X2 of FIG. 4, in accordance with some embodiments of the disclosure.

FIGS. 6E-1 and 6E-2 are cross-sectional views illustrating the formation of a semiconductor structure of SRAM cells at one of the intermediate stages corresponding to line X1-X1 and line X2-X2 of FIG. 4, in accordance with some embodiments of the disclosure.

FIGS. 6F-1 and 6F-2 are cross-sectional views illustrating the formation of a semiconductor structure of SRAM cells at one of the intermediate stages corresponding to line X1-X1 and line X2-X2 of FIG. 4, in accordance with some embodiments of the disclosure.

FIG. 6F-3 is a plan view corresponding to plan A-A of FIG. 6F-1, in accordance with some embodiments of the disclosure.

FIGS. 7A-1 and 7A-2 are cross-sectional views illustrating the formation of a semiconductor structure of SRAM cells at one of the intermediate stages corresponding to line X1-X1 and line X2-X2 of FIG. 4, in accordance with some embodiments of the disclosure.

FIGS. 7B-1 and 7B-2 are cross-sectional views illustrating the formation of a semiconductor structure of SRAM cells at one of the intermediate stages corresponding to line X1-X1 and line X2-X2 of FIG. 4, in accordance with some embodiments of the disclosure.

FIGS. 7C-1 and 7C-2 are cross-sectional views illustrating the formation of a semiconductor structure of SRAM cells at one of the intermediate stages corresponding to line X1-X1 and line X2-X2 of FIG. 4, in accordance with some embodiments of the disclosure.

FIGS. 7D-1 and 7D-2 are cross-sectional views illustrating the formation of a semiconductor structure of SRAM cells at one of the intermediate stages corresponding to line X1-X1 and line X2-X2 of FIG. 4, in accordance with some embodiments of the disclosure.

FIG. 7D-3 is a plan view corresponding to plan A-A of FIG. 17D-1, in accordance with some embodiments of the disclosure.

FIGS. 9A-1 and 9A-2 are cross-sectional views illustrating the formation of a semiconductor structure of SRAM cells at one of the intermediate stages corresponding to line X1-X1 and line Y-Y of FIG. 8, in accordance with some embodiments of the disclosure.

FIGS. 9B-1 and 9B-2 are cross-sectional views illustrating the formation of a semiconductor structure of SRAM cells at one of the intermediate stages corresponding to line X1-X1 and line Y-Y of FIG. 8, in accordance with some embodiments of the disclosure.

FIG. 9B-3 is a plan view corresponding to plan A-A of FIG. 9B-1, in accordance with some embodiments of the disclosure.

DETAILED DESCRIPTION

Figure 1:
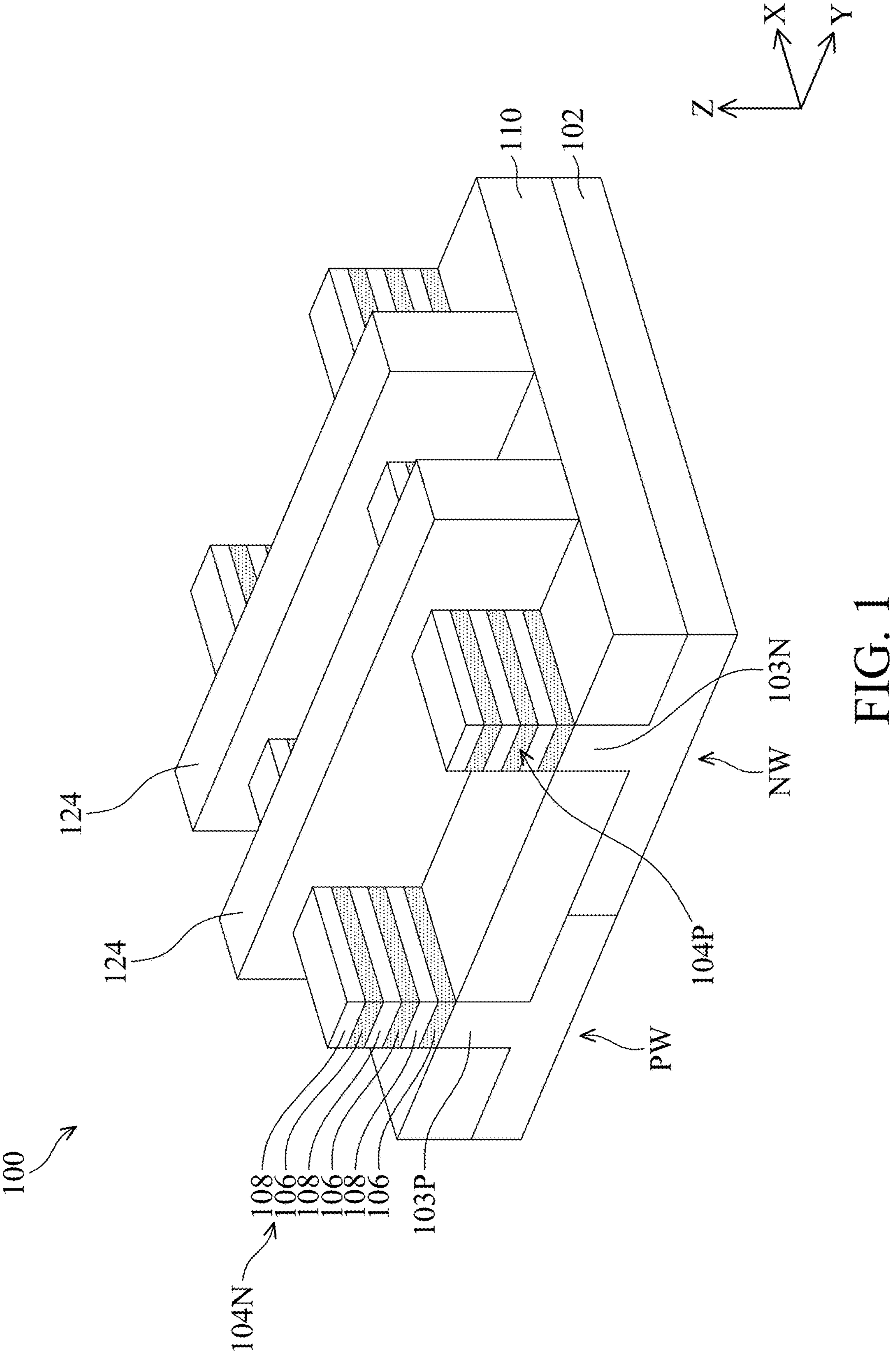
FIG. 1 is a perspective view of a semiconductor structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

The nanostructure transistor (e.g., nanosheet transistor, nanowire transistor, multi-bridge channel, nano-ribbon FET, gate all around (GAA) transistor structures) described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

As the feature sizes continue to decrease, SRAM devices have also begun to adopt nanostructure transistor (e.g., GAA FET) solutions to improve cell performance, e.g., cell current, operation voltage (e.g., Vmax, Vmin, etc.), SRAM margin (e.g., write margin and/or read margin) and/or operation speed. A type of the SRAM device is 7T SRAM device, which includes seven transistors in each SRAM cell. 7T SRAM device has good space utilization, especially for small area arrays because it saves peripheral area. However, compared with 8T SRAM device, 7T SRAM device may suffer higher Vddr (Voltage Dynamic Data Retention), lower operation voltage (e.g., Vmax), and the weak read margin is weaker due to weak performance of its p-channel transistors.

The aspect of the present disclosure is directed to forming a semiconductor structure of a 7T SRAM device including nanostructure transistors. The method of the embodiments includes a DOI process in which SiGe layers of an active region are replaced with the dielectric layers. Due to the relatively high etching selectivity between the dielectric layers (e.g., SiO) and Si layers of the active region, the resulting transistors may have a greater effective channel width. For example, the formation of the p-channel transistors of an SRAM cell may include the DOI process, and therefore the performance (e.g., operation speed) of the resulting SRAM device may be enhanced.

FIG. 1 is a perspective view of a semiconductor structure 100, in accordance with some embodiments of the disclosure. The semiconductor structure 100 includes a substrate 102 and fin structures 104 (including 104N and 104P) over the substrate 102, as shown in FIG. 1, in accordance with some embodiments. In some embodiments, the semiconductor structure 100 is used to form an SRAM cell array. The substrate 102 includes a p-type well PW and an n-type well NW immediately adjacent to the p-type well PW, in accordance with some embodiments. The fin structure 104N is formed in the p-type well PW of the substrate 102, and the fin structure 104P is formed in the n-type well NW of the substrate 102, in accordance with some embodiments. The fin structures 104N and 104P are the active regions of the semiconductor structure 100, in accordance with some embodiments.

For a better understanding of the semiconductor structure 100, the X-Y-Z coordinate reference is provided in the figures of the present disclosure. The X-axis and the Y-axis are generally orientated along the lateral (or horizontal) directions that are parallel to the main surface of the substrate 102. The Y-axis is transverse (e.g., substantially perpendicular) to the X-axis. The Z-axis is generally oriented along the vertical direction that is perpendicular to the main surface of the substrate 102 (or the X-Y plane).

The fin structure 104N includes a lower fin element 103P formed from the p-type well PW, and the fin structure 104P includes a lower fin element 103N formed from the n-type well NW, in accordance with some embodiments. The lower fin elements 103P and 103N are surrounded by an isolation structure 110, in accordance with some embodiments. Each of the fin structures 104N and 104P further includes an upper fin element formed from an epitaxial stack including alternating first semiconductor layers 106 and second semiconductor layer 108, in accordance with some embodiments. The second semiconductor layers 108 will form nanostructures (e.g., nanowires or nanosheets) and serve as a channel for the resulting semiconductor devices, in accordance with some embodiments.

The fin structures 104N and 104P extend in the X direction, in accordance with some embodiments. That is, the fin structures 104N and 104P have longitudinal axes parallel to the X direction, in accordance with some embodiments. The X direction may also be referred to as the channel direction. The current of the resulting semiconductor device (i.e., nanostructure transistor) flows in the X direction through the channel. Each of the fin structures 104 is defined as several channel regions and several source/drain regions, where the channel regions and the source/drain regions are alternately arranged, in accordance with some embodiments. It is noted that in the present disclosure, source/drain region(s) or source/drain feature(s) may refer to a source or a drain, individually or collectively dependent upon the context.

Gate structures 124 are formed with longitudinal axes parallel to the Y direction and extending across and/or surrounding the channel regions of the fin structures 104N and 104P, in accordance with some embodiments. The source/drain regions of the fin structures 104N and 104P are exposed from the gate structures 124, in accordance with some embodiments. The Y direction may also be referred to as a gate-routing direction. Although two fin structures 104 are illustrated in FIG. 1, the semiconductor structure 100 may include more than two fin structures 104. In addition, FIG. 1 shows two gate structures 124 (or channel regions) for illustrative purposes and is not intended to be limiting. The number of fin structures and the gate structures may be dependent on the design demand of an integrated circuit and/or performance consideration of semiconductor devices.

Figure 2:
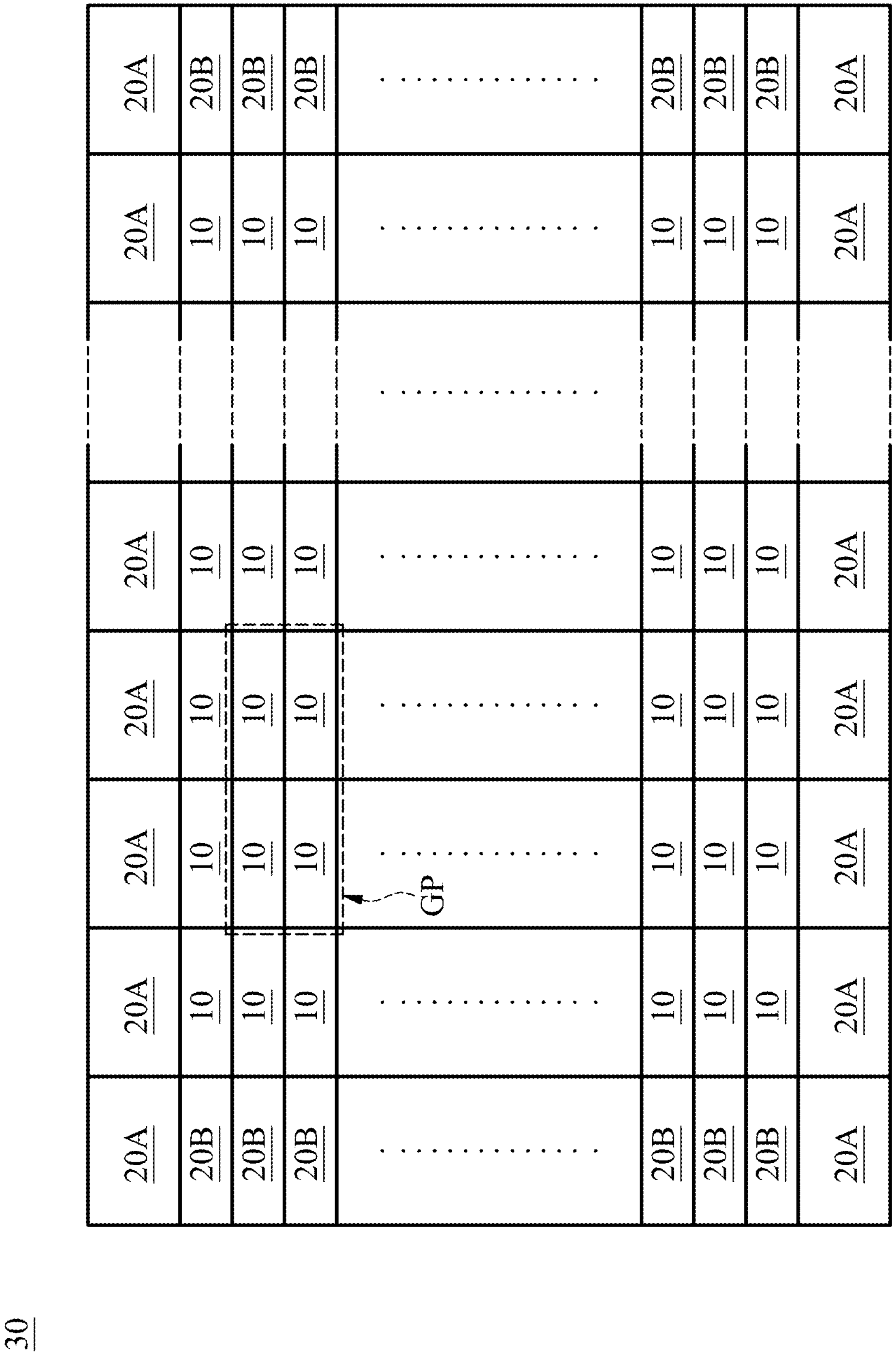
FIG. 2 illustrates a simplified diagram of a static random access memory (SRAM), in accordance with some embodiments of the disclosure.

FIG. 2 illustrates a simplified diagram of an SRAM 30, in accordance with some embodiments of the disclosure. The SRAM 30 can be an independent device or be implemented in an IC (e.g. System-on-Chip (SOC)). The SRAM 30 includes a cell array formed by multiple SRAM cells (or called bit cells) 10, and the SRAM cells 10 are arranged in multiple rows and multiple columns in the cell array. In the fabrication of SRAM cells, the cell array may be surrounded by multiple strap cells 20A and multiple edge cells 20B, and the strap cells 20A and the edge cells 20B are dummy cells for the cell array. In some embodiments, the strap cells 20A are arranged to surround the cell array horizontally, and the edge cells 20B are arranged to surround the cell array vertically. The shapes and sizes of the strap cells 20A and the edge cells 20B are determined according to actual application.

In some embodiments, the shapes and sizes of the strap cells 20A and the edge cells 20B are the same as the SRAM cells 10. In some embodiments, the shapes and sizes of the strap cells 20A, the edge cells 20B and the SRAM cells 10 are different. Moreover, in the SRAM 30, each SRAM cell 10 has the same rectangular shape/region, e.g., the widths and heights of the SRAM cells 10 are the same. In the cell array of the SRAM 30, although only one group GP is shown in FIG. 2, the SRAM cells 10 can be divided into multiple groups GP, and each of the groups GP includes four adjacent SRAM cells 10.

Figure 3:
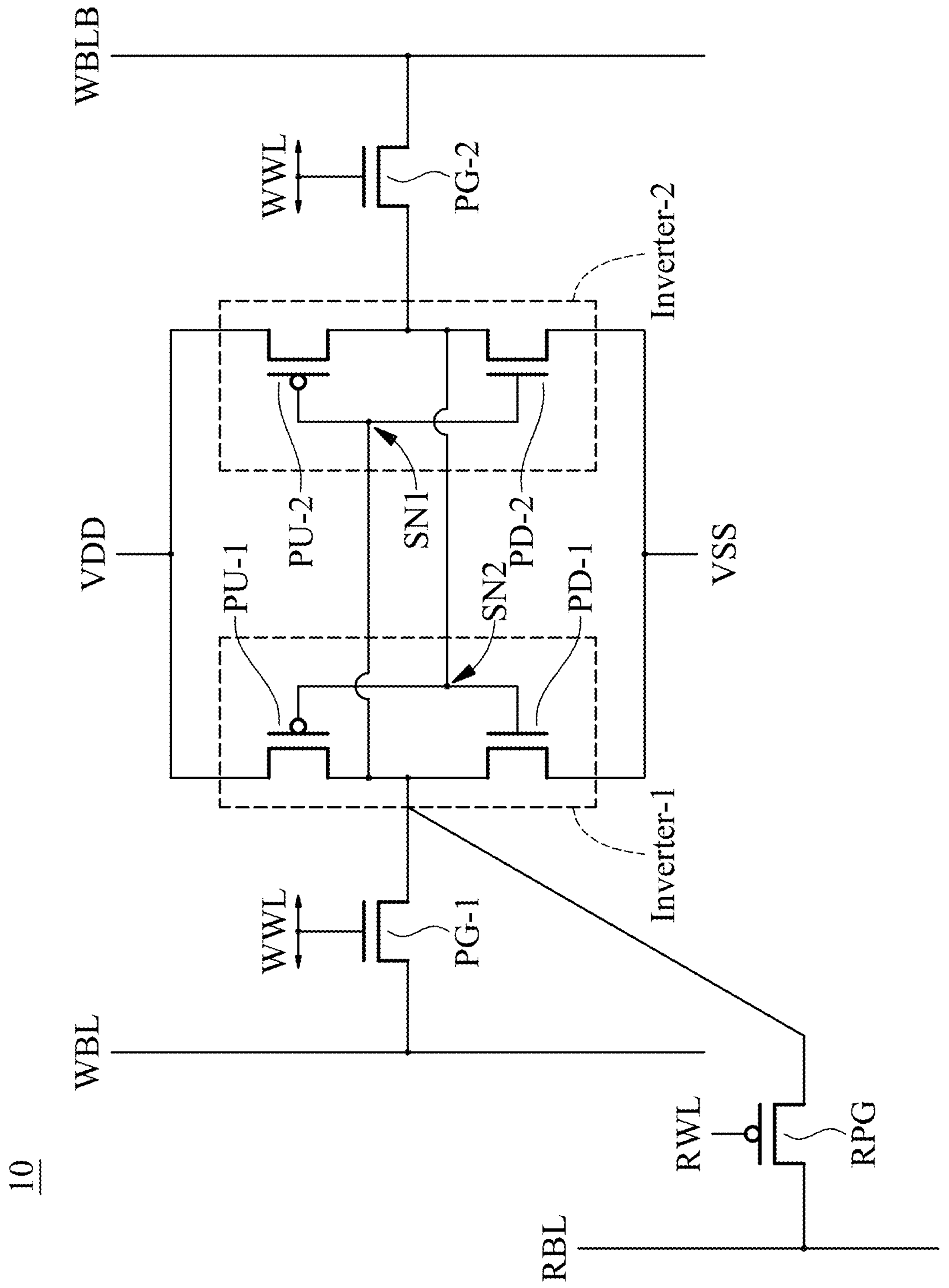
FIG. 3 illustrates a two-port SRAM cell, in accordance with some embodiments of the disclosure.

FIG. 3 illustrates a two-port SRAM cell 10 of FIG. 2, in accordance with some embodiments of the disclosure. The SRAM cell 10 includes a write-port and a read port, in accordance with some embodiments. The write-port includes pull-up transistors PU-1 and PU-2, pull-down transistors PD-1 and PD-2, and pass-gate transistors PG-1 and PG-2, in accordance with some embodiments. The read-port includes a read-port pass-gate transistor RPG, in accordance with some embodiments.

The pull-up transistor PU-1 and the pull-down transistor PD-1 are coupled together to form a first inventer Inventer-1, in accordance with some embodiments. The pull-up transistor PU-1 is a PMOS transistor, and the pull-down transistor PD-1 is an NMOS transistor. The drain of the pull-up transistor PU-1 and the drain of the pull-down transistor PD-1 are coupled to a storage node SN1 connecting the pass-gate transistor PG-1. The gates of the pull-up transistor PU-1 and the pull-down transistor PD-1 are coupled to a storage node SN2 connecting the pass-gate transistor PG-2. Furthermore, the source of the pull-up transistor PU-1 is coupled to a power supply node VDD, and the source of the pull-down transistor PD-1 is coupled to a ground VSS.

Similarly, the pull-up transistor PU-2 and the pull-down transistor PD-2 are coupled together to form a second inverter Inventer-2, in accordance with some embodiments. The pull-up transistor PU-2 is a PMOS transistor, and the pull-down transistor PD-2 is an NMOS transistor. The drains of the pull-up transistor PU-2 and the pull-down transistor PD-2 are coupled to the storage node SN2 connecting the pass-gate transistor PG-2. The gates of the pull-up transistor PU-2 and the pull-down transistor PD-2 are coupled to the storage node SN1 connecting the pass gate transistor PG-1. Furthermore, the source of the pull-up transistor PU-2 is coupled to the power supply node VDD, and the source of the pull-down transistor PD-2 is coupled to the ground VSS.

The first and second inverters Inventer-1 and Inventer-2 are cross-coupled between the storage node SN1 and SN2, and form a latch. The storage node SN1 and the storage node SN2 are complementary nodes that are often at opposite logic levels (logic high or logic low). The pass-gate transistor PG-1 is coupled between a bit line WBL of the write-port and the storage node SN1, and the pass-gate transistor PG-2 is coupled between a complementary bit line WBLB of the write-port and the storage node SN2, and the complementary bit line WBLB is complementary to the bit line WBL. The gates of the pass-gate transistors PG-1 and PG-2 are coupled to the same word-line WWL of the write-port. The pass-gate transistors PG-1 and PG-2 are NMOS transistors.

The gate of the read-port pass-gate transistor RPG is coupled to a word line RWL of the read-port. The read-port pass-gate transistor RPG is coupled between the bit line RBL of the read-port and the storage node SN1. The read-port pass-gate transistor RPG is a PMOS transistor. In some embodiments, transistors PG-1, PG-2, PU-1, PU-2, PD-1, PD-2 and RPG of the SRAM cell 10 are nanostructure transistors (such as gate-all-around transistors).

Figure 4:
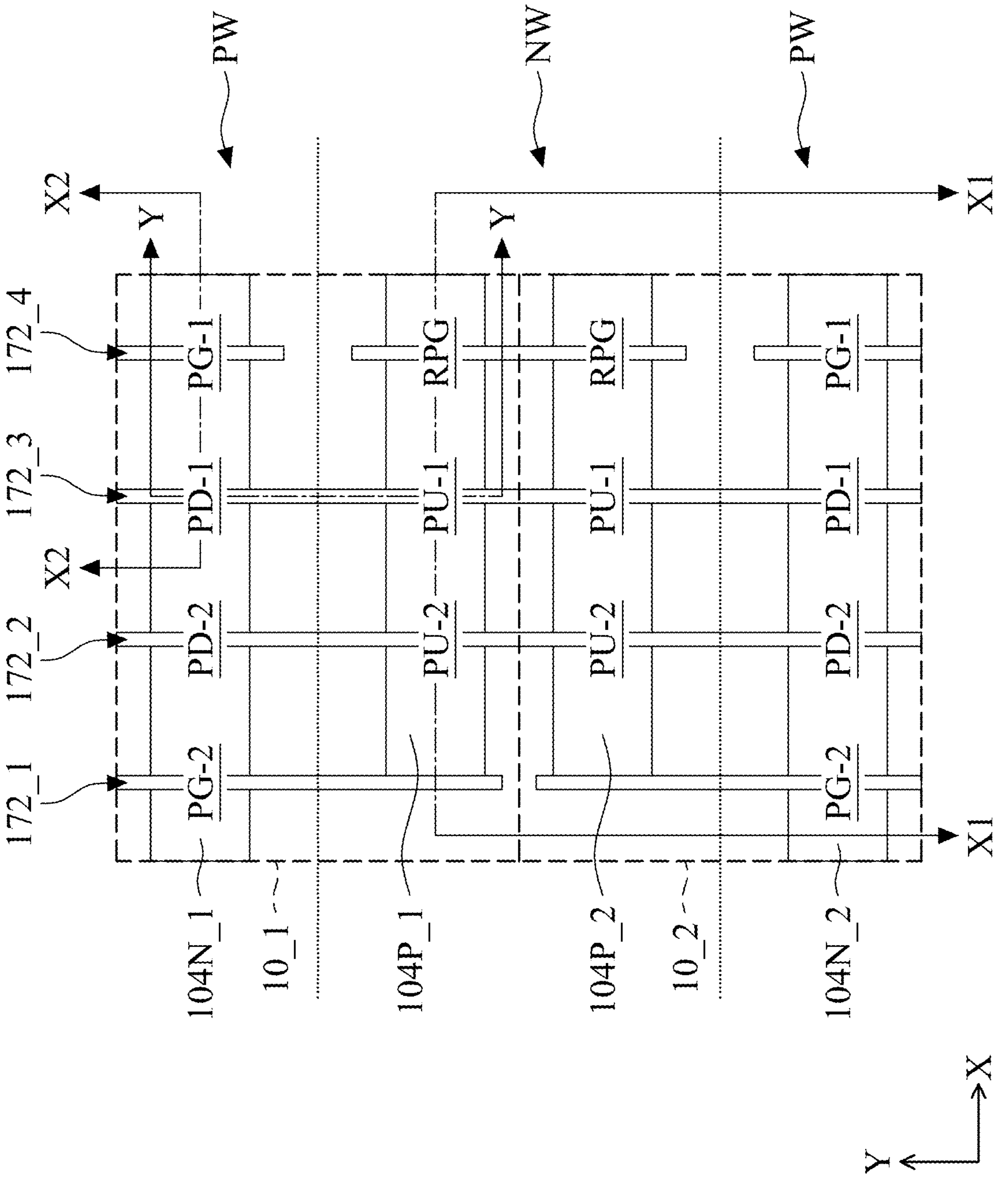
FIG. 4 illustrates a layout showing two SRAM cells in FIG. 2, in accordance with some embodiments of the disclosure.

FIG. 4 illustrates a layout showing two SRAM cells 10 in FIG. 2, in accordance with some embodiments of the disclosure. The SRAM cells 10_1 and 10_2 in FIG. 4 are immediately arranged to each other, and are half of a group GP of FIG. 2, in accordance with some embodiments. The SRAM cells 10_1 and 10_2 are formed by active regions 104 (including 104N_1, 104P_1, 104P_2 and 104N_2) and gate stacks 172 (including 172_1 to 172_4), in accordance with some embodiments. The active region 104N_1 is formed in a p-type well PW, the active regions 104P_1 and 104P_2 are formed in an n-type well NW, and the active region 104N_2 in another p-type well PW, in accordance with some embodiments. The n-type well NW is arranged between the two p-type wells PW, in accordance with some embodiments.

The active regions 104 may be the fin structures 104 as shown in FIG. 1. Each of the active regions 104 includes a lower fin element and sets of nanostructures over the lower fin element, in accordance with some embodiments. As the term is used herein, "a set of nanostructures" refers to active regions of a semiconductor structure that includes multiple semiconductor layers with cylindrical shape, bar shape and/or sheet shape. The lower fin elements of the active regions 104 extend in the X direction (row direction), in accordance with some embodiments. In some embodiments, the active regions 104N_1 and 104N_2 are continuous oxide definition (CNOD), which are elongated semiconductor strips extend continuously across several SRAM cells 10. Each of the active regions 104P_1 and 104P_2 may include several segments within respective SRAM cells 10, in accordance with some embodiments.

The gate stacks 172 extend in the Y direction (column direction) across the lower fin elements and wrap around the nanostructures, in accordance with some embodiments. In some embodiments, each of the gate stacks 172 may include several segments electrically and physically isolated from each other, in accordance with some embodiments. In some embodiments, each of the SRAM cells 10 includes the seven functional transistors PG, PD and PU and RPG which are nanostructure transistors. In some embodiments, the pass-gate transistors PG-1 and PG-2 and the pull-down transistors PD-1 and PD-2 are n-channel nanostructure transistors, and the pull-up transistors PU-1 and PU-2 and the read-port pass-gate transistor RPG are p-channel nanostructure transistors.

In the SRAM cell 10_1, the pass-gate transistor PG-1 is formed at the cross point of the active region 104N_1 and the gate stack 172_4. The pull-down transistor PD-1 is formed at the cross point of the active region 104N_1 and the gate stack 172_3. The pass-gate transistor PG-2 is formed at the cross point of the active region 104N_1 and the gate stack 172_2. The pull-down transistor PD-2 is formed at the cross point of the active region 104N_1 and the gate stack 172_1. In the SRAM cell 10_1, the pull-up transistor PU-1 is formed at the cross point of the active region 104P_1 and the gate stack 172_3. The pull-up transistor PU-2 is formed at the cross point of the active region 104P_1 and the gate stack 172_2. The read-port pass-gate transistor RPG is formed at the cross point of the active region 104P_1 and the gate stack 172_4. In addition, no functional transistor is formed at the cross point of the active region 104P_1 and the gate stack 172_1. In some embodiments, the SRAM cell 10_2 is a duplicate cell for the SRAM cell 10_1 but flipped over the X-axis.

FIG. 4 further illustrates reference cross-sections that are used in later figures, in accordance with some embodiments. Cross-section X1-X1 is in a plane parallel to the longitudinal axis (X direction) of an active region 104 and through the active region 104P_1. Cross-section X2-X2 is in a plane parallel to the longitudinal axis (X direction) of an active region 104 and through the active region 104N_1. Cross-section Y-Y is in a plane parallel to the longitudinal axis (Y direction) of a gate stack 172 and through the gate stack 172_4 of the pull-down transistor PD-1 and the pull-up transistor PU-1.

FIGS. 5A-1 through 5M-3 are cross-sectional views illustrating the formation of a semiconductor structure 100_1 of SRAM cells of FIG. 4 at various intermediate stages, in accordance with some embodiments. FIGS. 5A-1, 5B-1, 5C-1, 5G-1, 5H, 5I, 5J-1, 5K-1, 5L-1 and 5M-1 correspond to cross-section X1-X1, FIGS. 5A-2, 5B-2, 5C-2, 5D, 5E, 5F, 5G-2, 5J-2, 5K-2, 5L-2 and 5M-2 correspond to cross-section X2-X2, and FIGS. 5A-3, 5B-3, 5C-3, 5G-3, 5K-3, 5L-3 and 5M-3 correspond to cross-section Y-Y, in accordance with some embodiments.

FIGS. 5A-1, 5A-2 and 5A-3 illustrate a semiconductor structure 100_1 after the formation of active regions 104 and an isolation structure 110, in accordance with some embodiments. A substrate 102 is provided, as shown in FIGS. 5A-1, 5A-2 and 5A-3, in accordance with some embodiments. The substrate 102 may be a portion of a semiconductor wafer, a semiconductor chip (or die), and the like. In some embodiments, the substrate 102 is a silicon substrate. In some embodiments, the substrate 102 includes an elementary semiconductor such as germanium; a compound semiconductor such as gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor such as SiGe, GaAsP, AlInAs, AlGaAs, GaInAs, GaInP, and/or GaInAsP; or a combination thereof. Furthermore, the substrate 102 may optionally include an epitaxial layer (epi-layer), may be strained for performance enhancement, may include a silicon-on-insulator (SOI) structure, and/or have other suitable enhancement features.

Figures 1, 5A:
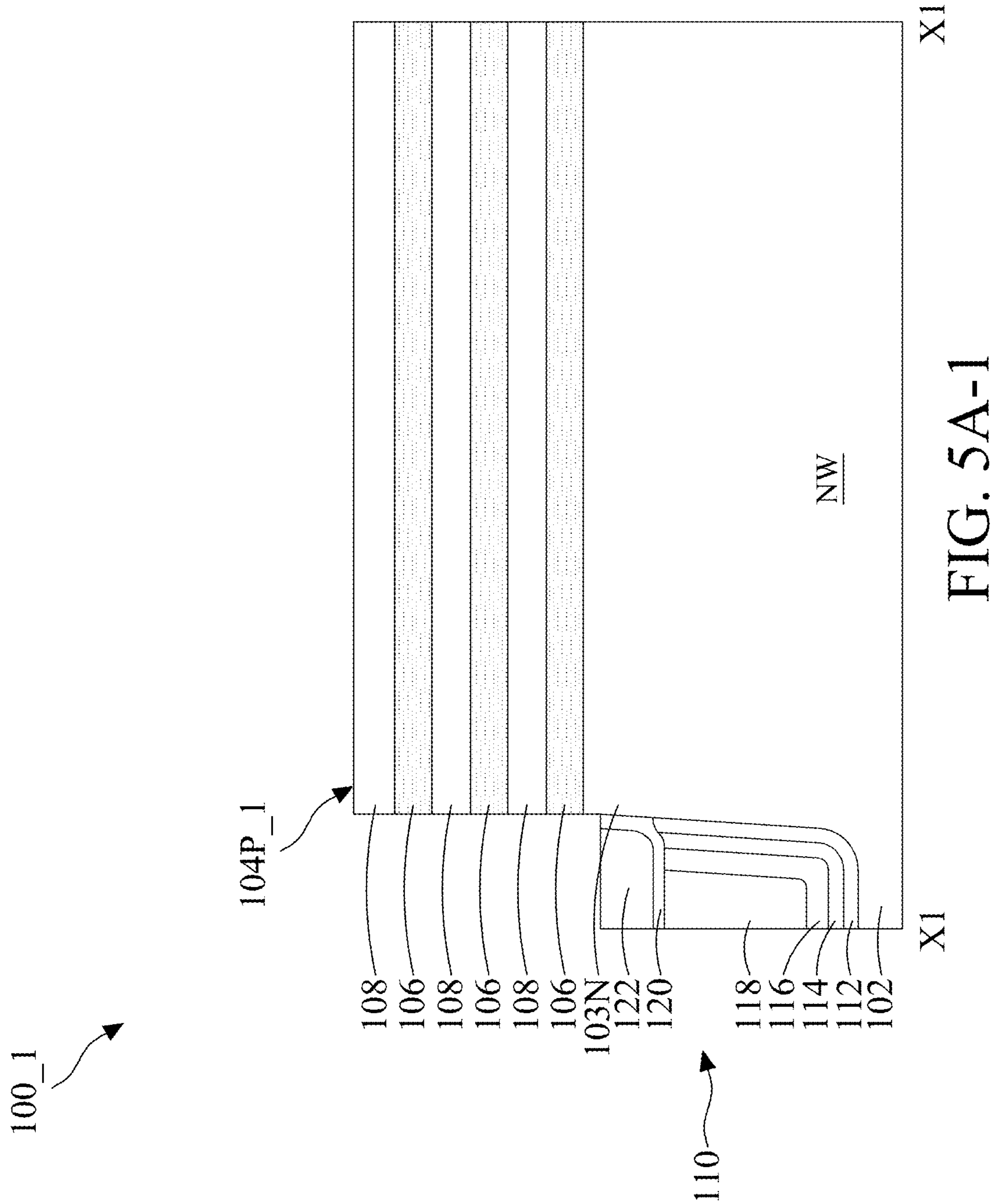
Figures 2, 5A:
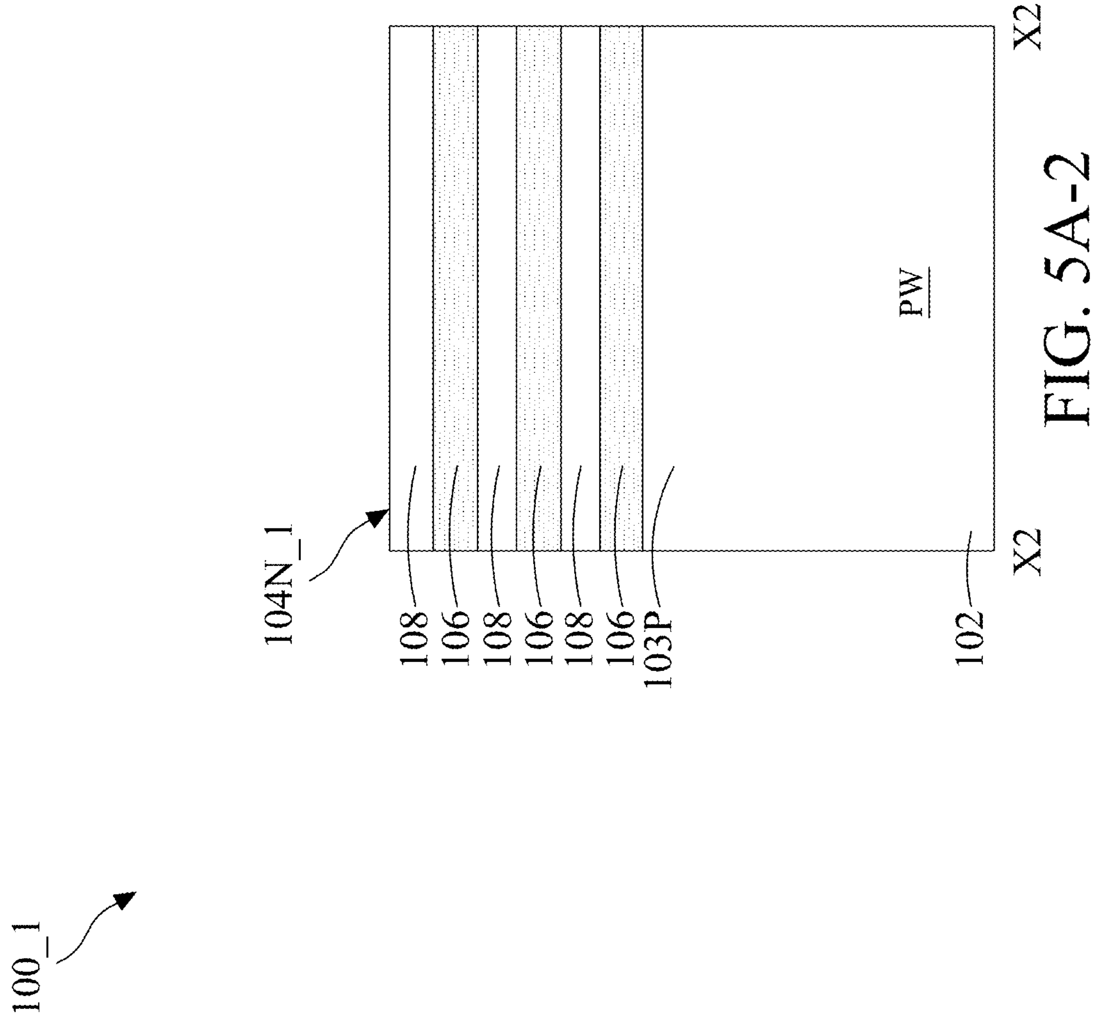
Figures 3, 5A:
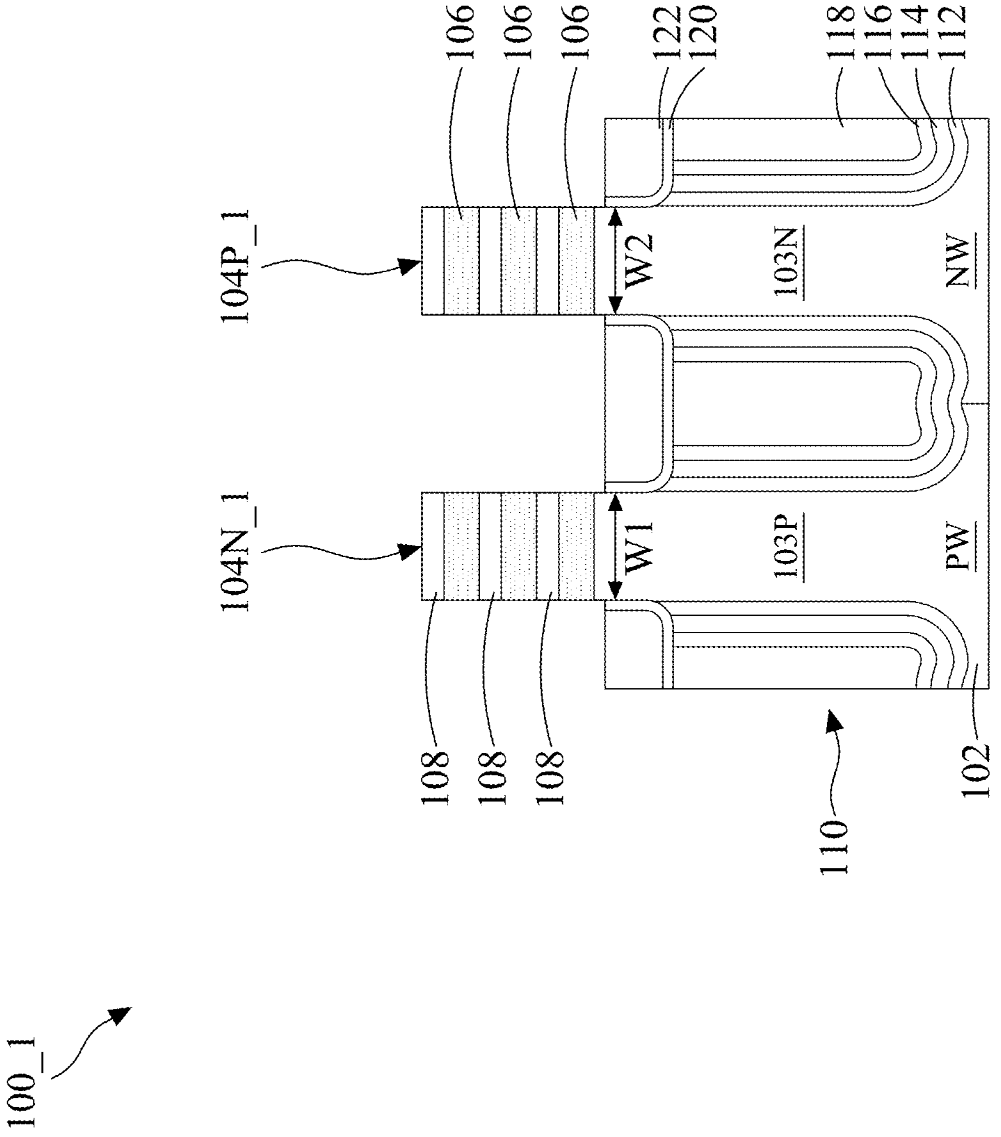

N-type well regions NW and p-type well regions PW are formed in the substrate 102, as shown in FIGS. 5A-1 to 5A-3, in accordance with some embodiments. In some embodiments, the n-type well regions NW and the p-type well regions PW are formed by ion implantation processes. In some embodiments, the n-type well regions NW and the p-type well regions PW have different electrically conductive types. For example, a patterned mask layer (such as photoresist layer and/or hard mask layer) is formed to cover regions of the substrate 102 where the p-type well regions are predetermined to be formed, and then n-type dopants (such as phosphorus or arsenic) are implanted into the substrate 102, thereby forming the n-type well regions NW, in accordance with some embodiments. Similarly, a patterned mask layer (such as photoresist layer and/or hard mask layer) is formed to cover regions of the substrate 102 where the n-type well regions are predetermined to be formed, and then p-type dopants (such as boron or $BF_2$) are implanted into the substrate 102, thereby forming the p-type well regions PW, in accordance with some embodiments.

Active regions 104 (including 104N and 104P) are formed over the substrate 102, as shown in FIGS. 5A-1 to 5A-3, in accordance with some embodiments. The active regions 104N are formed over in-the p-type well regions PW, while the active regions 104P are formed over the n-type region NW, in accordance with some embodiments. In some embodiments, the active regions 104N and 104P extend in the X direction. That is, the active regions 104N and 104P have longitudinal axes parallel to the X direction, in accordance with some embodiments. The formation of the 104N and 104P includes forming an epitaxial stack over the substrate 102 using an epitaxial growth process, in accordance with some embodiments. The epitaxial stack includes alternating first semiconductor layers 106 and second semiconductor layers 108, in accordance with some embodiments. The epitaxial growth process may be molecular beam epitaxy (MBE), metal organic chemical vapor deposition (MOCVD), or vapor phase epitaxy (VPE), or another suitable technique.

In some embodiments, the first semiconductor layers 106 are made of a first semiconductor material and the second semiconductor layers 108 are made of a second semiconductor material. The first semiconductor material for the first semiconductor layers 106 has a different lattice constant than the second semiconductor material for the second semiconductor layers 108, in accordance with some embodiments. In some embodiments, the first semiconductor material and the second semiconductor material have different oxidation rates and/or etching selectivity. In some embodiments, the first semiconductor layers 106 are made of SiGe, where the percentage of germanium (Ge) in the SiGe is in a range from about 20 atomic % to about 50 atomic %, and the second semiconductor layers 108 are made of pure or substantially pure silicon. In some embodiments, the first semiconductor layers 106 are $Si_{1-x}Ge_x$, where x is more than about 0.3, or Ge (x=1.0) and the second semiconductor layers 108 are Si or $Si_{1-y}Ge_y$, where y is less than about 0.4, and x>y.

The first semiconductor layers 106 are configured as sacrificial layers and will be removed to form gaps to accommodate gate materials, and the second semiconductor layers 108 will form nanostructures (e.g., nanowires or nanosheets) that laterally extend between source/drain features and serve as a channel for the resulting semiconductor device (such as a nanostructure transistor), in accordance with some embodiments. In some embodiments, the thickness of each of the first semiconductor layers 106 is in a range from about 3 nm to about 20 nm, such as about 4 nm to about 12 nm. In some embodiments, the thickness of each of the second semiconductor layers 108 is in a range from about 2 nm to about 20 nm, such as about 2 nm to about 10 nm. Although three first semiconductor layers 106 and three second semiconductor layers 108 are shown in FIGS. 5A-1 to 5A-3, the numbers are not limited to three, and can be 1, 2, or more than 3, and less than 10.

In some embodiments, the active regions 104N have a width W1 in a range from about 15 nm to about 50 nm. In some embodiments, the active regions 104P have a width W2 in a range from about 15 nm to about 50 nm. In some embodiments, the width W1 of the active regions 104N is equal to the width W2 of the active region 104P because the resulting p-channel transistors (e.g., RPG) may have a greater performance. In some other embodiments, the active region 104N may be wider than the active region 104P, e.g., the ratio (W1/W2) of the width W1 to the width W2 is in a range from about 1.5 about to about 4.

The epitaxial stack including the first semiconductor layers 106 and the second semiconductor layers 108 and underlying well regions NW and PW are patterned into the active regions 104N and 104P, in accordance with some embodiments. In some embodiments, the patterning process includes forming a patterned hard mask layer (not shown) over the epitaxial stack using a photolithography process. An etching process is then performed to remove portions of the epitaxial stack and well regions NW and PW uncovered by the patterned hard mask layer, thereby forming trenches and the active regions 104N and 104P protruding from between the trenches, in accordance with some embodiments. The etching process may be an anisotropic etching process, e.g., dry plasma etching.

The portion of the p-type well PW protruding from between the trenches forms lower fin element 103P of the active region 104N, in accordance with some embodiments. The portion of the n-type well NW protruding from between the trenches forms lower fin element 103N of the active region 104P, in accordance with some embodiments. A remainder of the epitaxial stack (including the first semiconductor layers 106 and the second semiconductor layers 108) forms the upper fin elements of the active regions 104N and 104P over the respective lower fin elements 103P and 103N, in accordance with some embodiments.

A second active region patterning process may be performed to cut the active region 104P (e.g., 104P_1), in accordance with some embodiments. Although only one segment of the active regions 104P_1 is shown, the active regions 104P may be patterned into several segments within respective SRAM cell regions 10. The second active region patterning process may include photolithography and etching processes. In the second patterning process, the upper fin elements of the active regions 104P are removed, and the lower fin elements 103N of the active regions 104P may also be recessed, as shown in FIG. 5A-1, in accordance with some embodiments. The active region 104P may be also referred to as cut OD (COD) features.

An isolation structure 110 is formed to surround the lower fin elements 103N and 103P of the active regions 104N and 104P, as shown in FIGS. 5A-1 and 5A-3, in accordance with some embodiments. The isolation structure 110 is configured to electrically isolate the active regions 104N and 104P and is also referred to as shallow trench isolation (STI) feature, in accordance with some embodiments. In some embodiments, the isolation structure 110 includes a first lining layer 112, a second lining layer 114, a third lining layer 116, a first bulk layer 118, a fourth lining layer 120 and a second bulk layer 122. In some other embodiments, the isolation structure 110 may be made of a single layer of dielectric material, or a dual layer of dielectric materials.

In some embodiments, the first lining layer 112 extends conformally along the active regions 104N and 104P and the substrate 102; the second lining layer 114 is located over the first lining layer 112; the third lining layer 116 is located over the second lining layer 114; the first bulk layer 118 is nested within the third lining layer 116, the fourth lining layer 120 is located over the first lining layer 112, the second lining layer 114, the third lining layer 116 and the first bulk layer 118; and the second bulk layer 122 is nested within the fourth lining layer 120.

In some embodiments, the first, second, third and fourth lining layers 112, 114, 116 and 120 and the first and second bulk layers 118 and 122 are made of silicon-containing dielectric materials, such as silicon oxide ($SiO_2$), silicon nitride (SiN), silicon oxynitride (SiON), silicon carbon nitride (SiCN), silicon oxycarbonitride (SiOCN), and/or oxygen-doped silicon carbonitride (Si(O)CN). In an embodiment, the first lining layer 112 and the fourth lining layer 120 are made of silicon oxide (SiO), and the second lining layer 114 and the third lining layer 116 are made of low-k dielectric material (e.g., with a k value less than 7.9) such as silicon oxycarbonitride (SiOCN). In an embodiment, the first bulk layer 118 and the second bulk layer 122 are made of different materials and have a great difference in etching selectivity. For example, the first bulk layer 118 is made of silicon oxide (SiO), and the second bulk layer 122 is made of silicon nitride (SiN).

The formation of the isolation structure 110 includes depositing the first, second and third lining layers 112, 114 and 116 to partially fill the trenches, depositing the first bulk layer 118 to overfill the remainder of the trenches, and planarizing and etching back these dielectric materials 112-118 to form trenches again. The formation of the isolation structure 110 further includes depositing the fourth lining layer 120 to partially fill the trenches, depositing the second bulk layer 122 to overfill the remainder of the trenches, and planarizing and etching back these dielectric materials 120-122 until the upper fin elements of the active regions 104N and 104P are exposed, in accordance with some embodiments. In some embodiments, the deposition processes include in situ steam generation (ISSG), thermal oxidation, CVD (such as low-pressure CVD (LPCVD), plasma-enhanced CVD (PECVD), high density plasma CVD (HDP-CVD), high aspect ratio process (HARP), or flowable CVD (FCVD)), atomic layer deposition (ALD), another suitable technique, and/or a combination thereof. The planarization processes may be chemical mechanical polishing (CMP). The etching back processes may include dry plasma etching and/or wet chemical etching.

Figures 1, 5B:
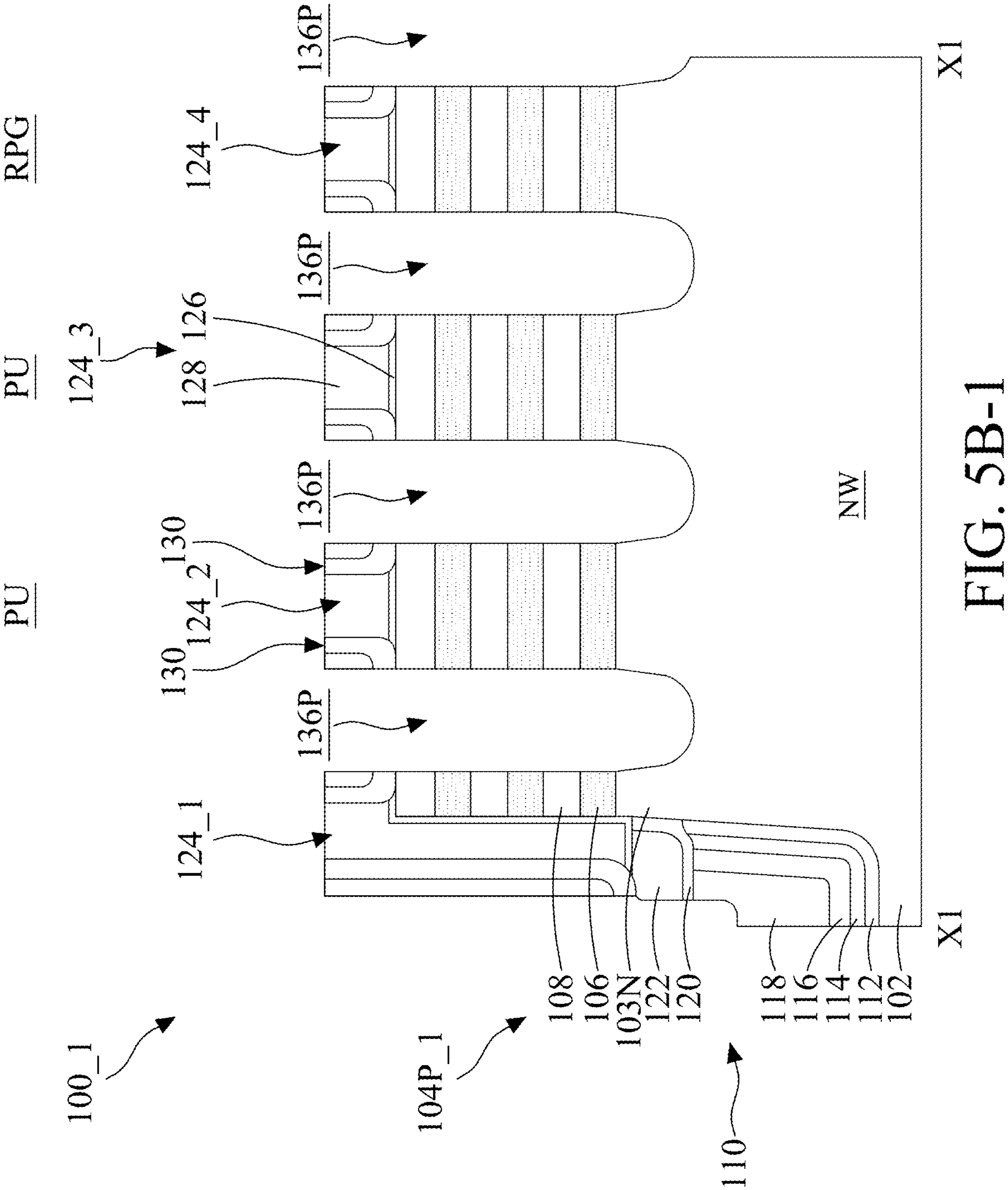
Figures 2, 5B:
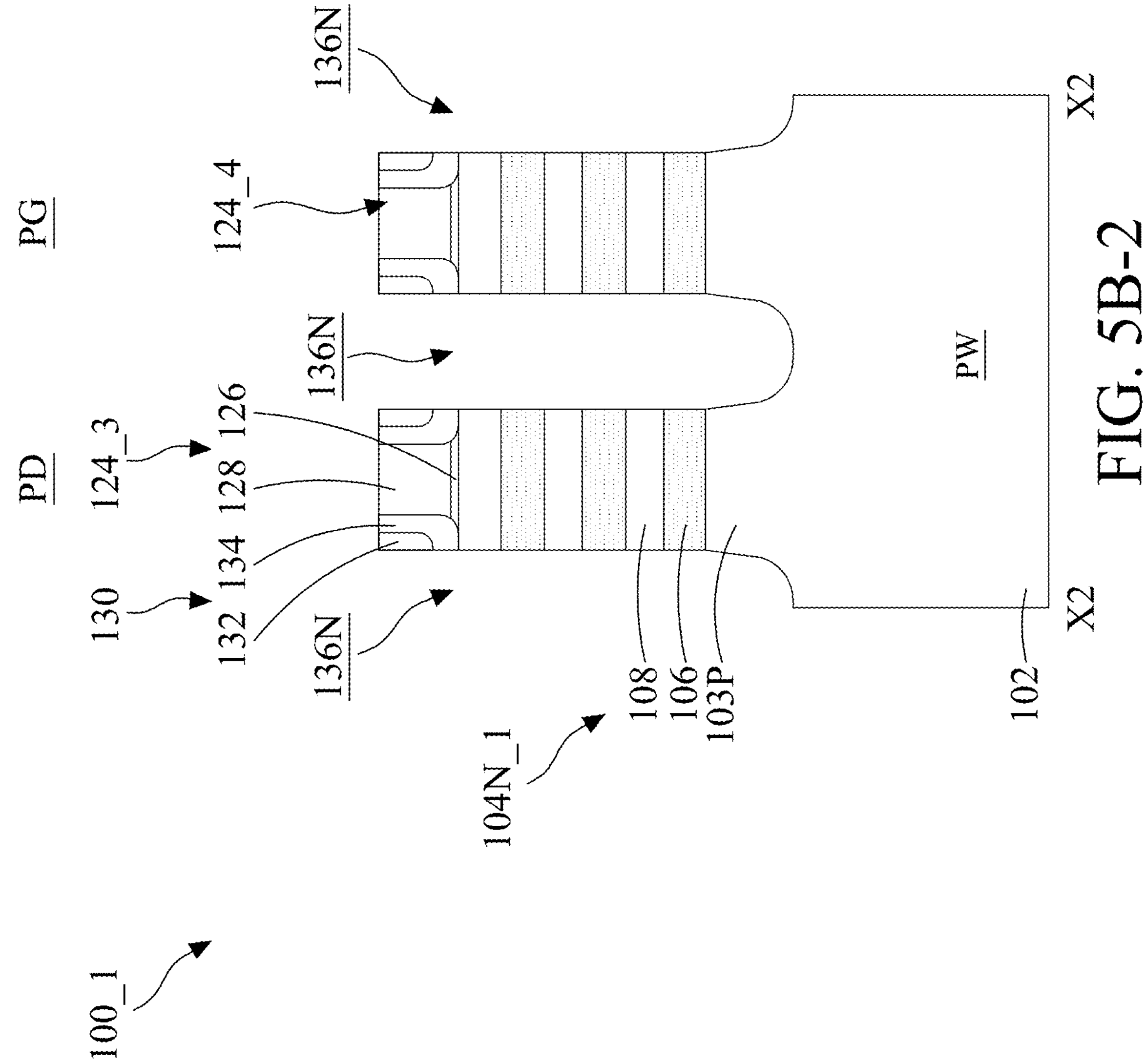
Figures 3, 5B:
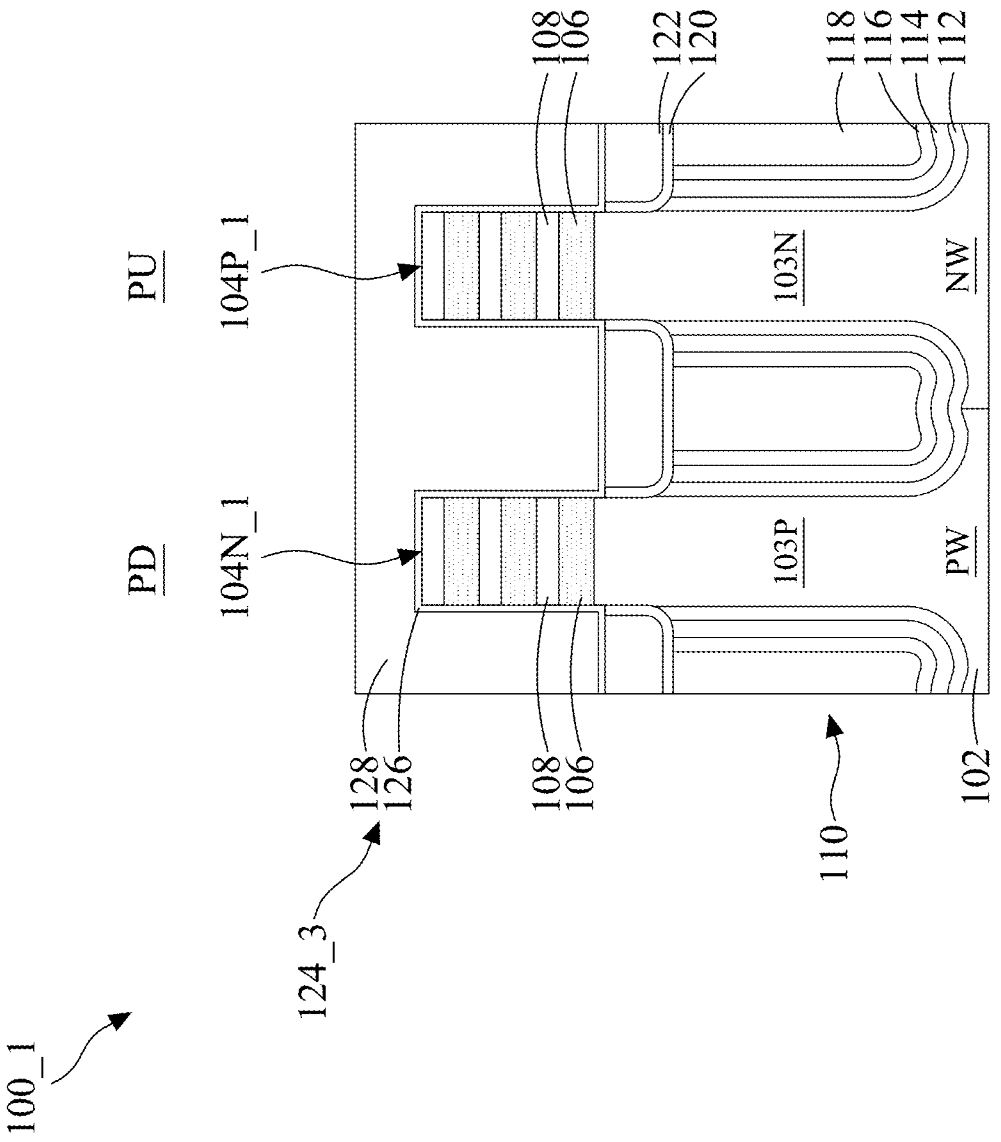

FIGS. 5B-1, 5B-2 and 5B-3 illustrate a semiconductor structure 100_1 after the formation of dummy gate structures 124, gate spacer layers 130 and source/drain recesses 136N and 136P, in accordance with some embodiments. Dummy gate structures 124 (including 124_1 to 124_4) are formed over the semiconductor structure 100_1, as shown in FIGS. 5B-1 to 5B-3, in accordance with some embodiments. The dummy gate structures 124 extend in the Y direction across the channel regions of the active regions 104N and 104P and the isolation structure 110, in accordance with some embodiments. The dummy gate structures 124 have longitudinal axes parallel to the Y direction, in accordance with some embodiments. The dummy gate structures 124 are configured as sacrificial structures and will be replaced with gate stacks (172_1 to 172_4 shown in FIG. 4), in accordance with some embodiments. The active regions 104 and the dummy gate structures 124 collectively define the locations where the transistors PD, PG and PU of the SRAM cell are to be formed, in accordance with some embodiments.

Each of the dummy gate structures 124 includes a dummy gate dielectric layer 126 and a dummy gate electrode layer 128 formed over the dummy gate dielectric layer 126, as shown in FIGS. 5B-1 and 5B-3, in accordance with some embodiments. In some embodiments, the dummy gate dielectric layer 126 is made of one or more dielectric materials, such as silicon oxide (SiO), silicon nitride (SiN), silicon oxynitride (SiON), $HfO_2$, HfZrO, HfSiO, HfTiO, HfAlO, and/or a combination thereof. In some embodiments, the dielectric material is formed using ALD, CVD, thermal oxidation, physical vapor deposition (PVD), another suitable technique, and/or a combination thereof.

In some embodiments, the dummy gate electrode layer 128 is made of semiconductor material such as polysilicon, poly-silicon germanium. In some embodiments, the dummy gate electrode layer 128 is made of a conductive material such as metallic nitrides, metallic silicides, metals, and/or a combination thereof. In some embodiments, the material for the dummy gate electrode layer 128 is formed using CVD, another suitable technique, and/or a combination thereof.

In some embodiments, the formation of the dummy gate structures 124 includes globally and conformally depositing a dielectric material for the dummy gate dielectric layer 126 over the semiconductor structure 100_1, depositing a material for the dummy gate electrode layer 128 over the dielectric material, planarizing the material for the dummy gate electrode layer 128, and patterning the dielectric material and the material for the dummy gate electrode layer 128 into the dummy gate structures 124. The patterning process includes forming a patterned hard mask layer (not shown) to cover the channel regions of the active regions 104N and 104P using a photolithography process, and etching away the material for the dummy gate electrode layer 128 and dielectric material until the source/drain regions of the active regions 104N and 104P are exposed, in accordance with some embodiments.

Gate spacer layers 130 are formed on the opposite sides of the dummy gate structures 124, as shown in FIGS. 5B-1 and 5B-2, in accordance with some embodiments. The gate spacer layers 130 extend in the Y direction and across the active regions 104N and 104P and the isolation structure 110, in accordance with some embodiments. The gate spacer layers 130 are used to offset and separate the subsequently formed source/drain features. In some embodiments, the formation of the gate spacer layers 130 include globally and conformally depositing spacer layers 132 and 134 using ALD, CVD (such as LPCVD, PECVD or HDP-CVD or a combination thereof, followed by an anisotropic etching process, in accordance with some embodiments.

In some embodiments, the spacer layers 132 and 134 are made of dielectric material, such as silicon nitride (SiN), silicon oxynitride (SiON), silicon oxide ($SiO_2$), oxygen-doped silicon carbide (SiC:O), oxygen-doped silicon carbonitride (Si(O)CN), silicon carbide (SiC), or another suitable dielectric material. In some embodiments, the spacer layer 132 and the spacer layer 134 are made of different materials and have different dielectric constant values. For example, the spacer layers 132 and 134 are made of SiOCN with different compositions (e.g., different carbon concentrations) and different dielectric constants. In some other embodiments, the spacer layers 132 and 134 are the same material. After the anisotropic etching process, the vertical portions of the spacer layers 132 and 134 left remaining on the opposite sides of the dummy gate structures 124 form the gate spacer layers 130, in accordance with some embodiments. Although not shown, the vertical portions of the spacer layers 132 and 134 may be left on the opposite sides of the active regions 104N and 104P and form fin spacer layers.

An etching process is performed to recess the source/drain regions of the active regions 104N and 104P, thereby forming source/drain recesses 136N and 136P, as shown in FIGS. 5B-1 and 5B-2, in accordance with some embodiments. The etching process may be an anisotropic etching process such as dry plasma etching, an isotropic etching process such as dry chemical etching, remote plasma etching or wet chemical etching, and/or a combination thereof. The gate spacer layers 130 and the dummy gate structure 124 may serve as etch masks such that the source/drain recesses 136N and 136P are formed self-aligned on opposite sides of the dummy gate structures 124, in accordance with some embodiments. The bottoms of the source/drain recesses 136N and 136P extend into the lower fin elements 103N and 103P, in accordance with some embodiments. In the etching process, the isolation structure 110 may also be recessed and the first bulk layer 118 is exposed, as shown in FIG. 5B-1, in accordance with some embodiments. In some other embodiments, the isolation structure 110 may be unrecessed, or slightly recessed.

Figures 1, 5C:
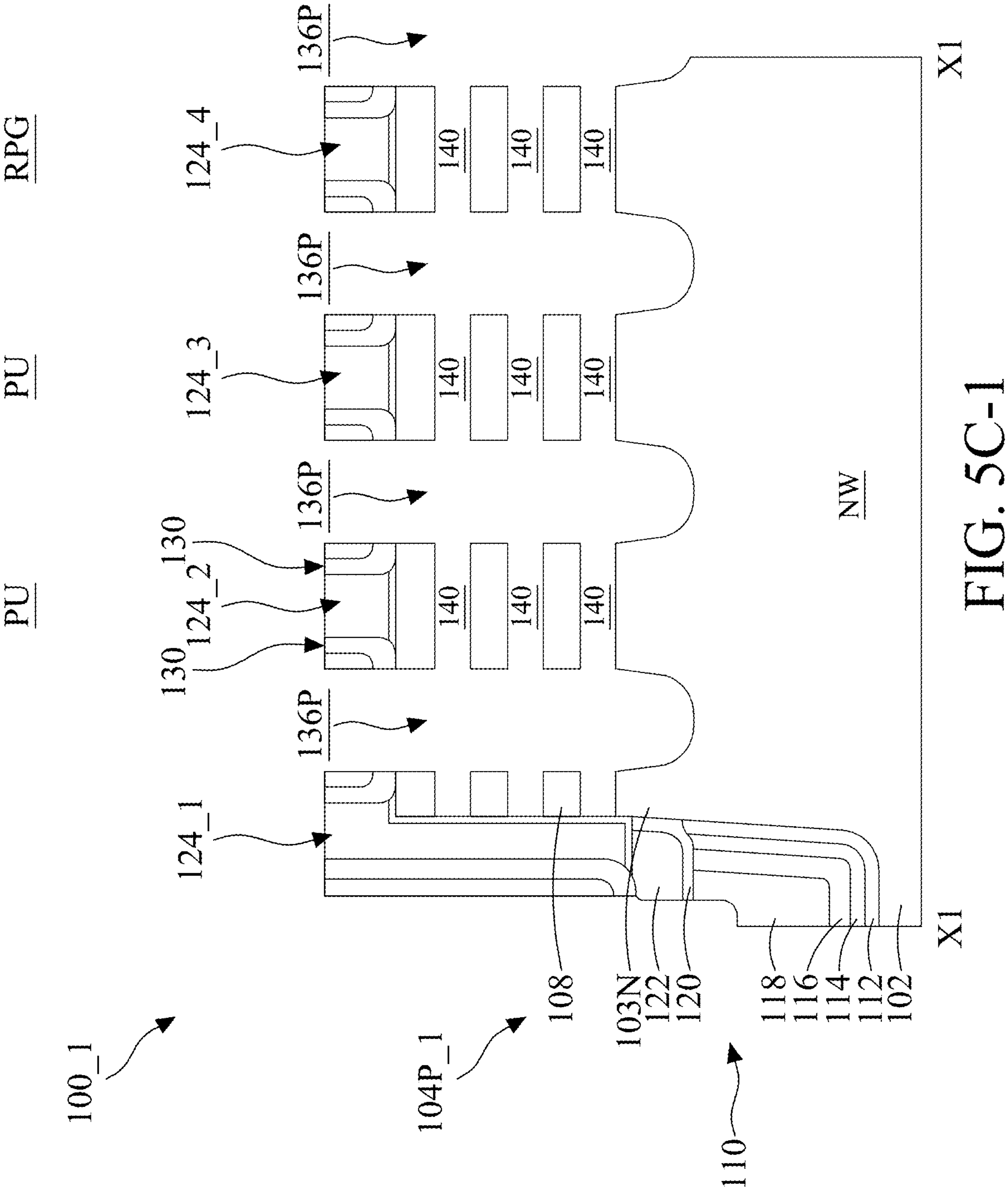
Figures 2, 5C:
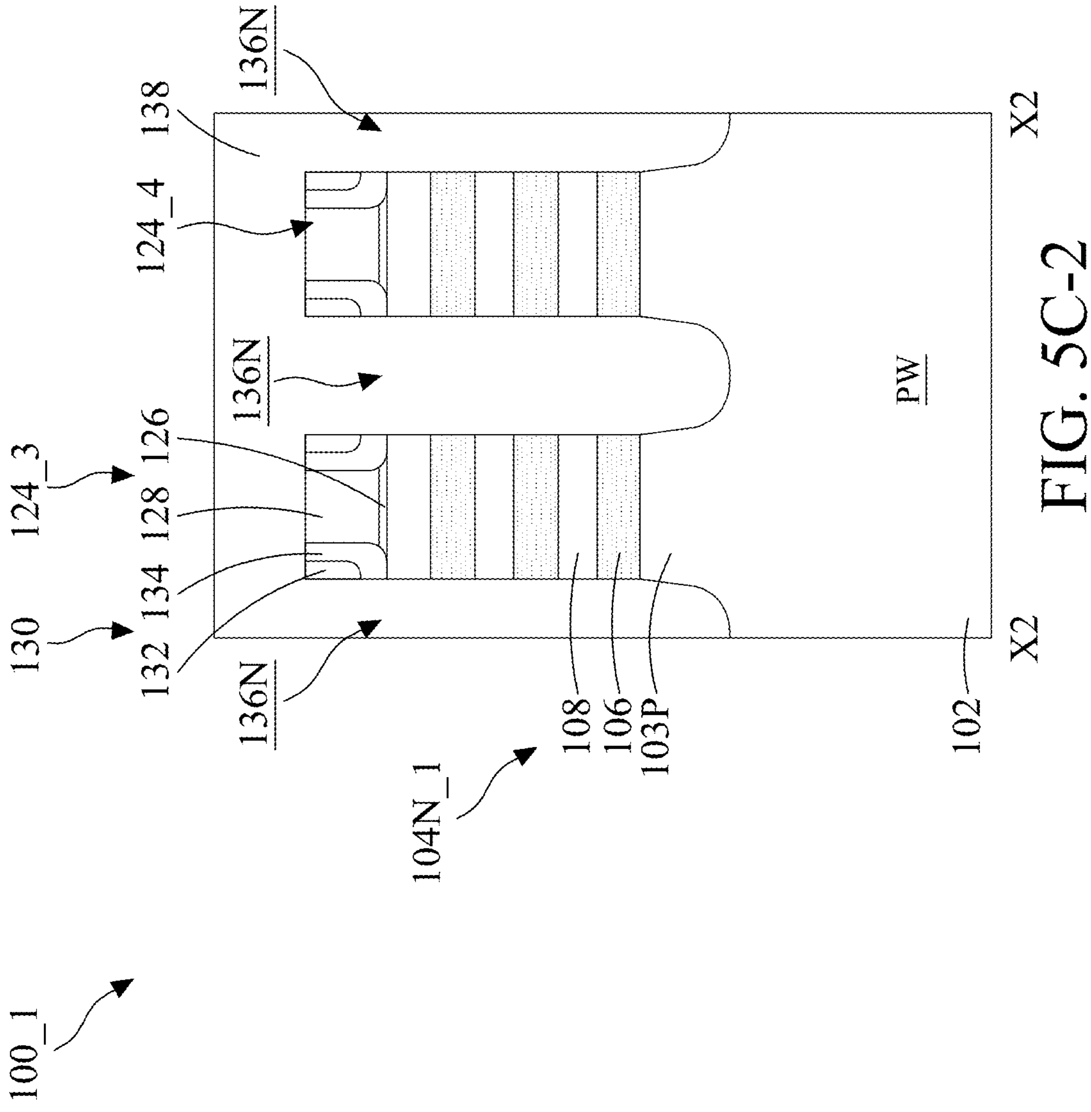
Figures 3, 5C:
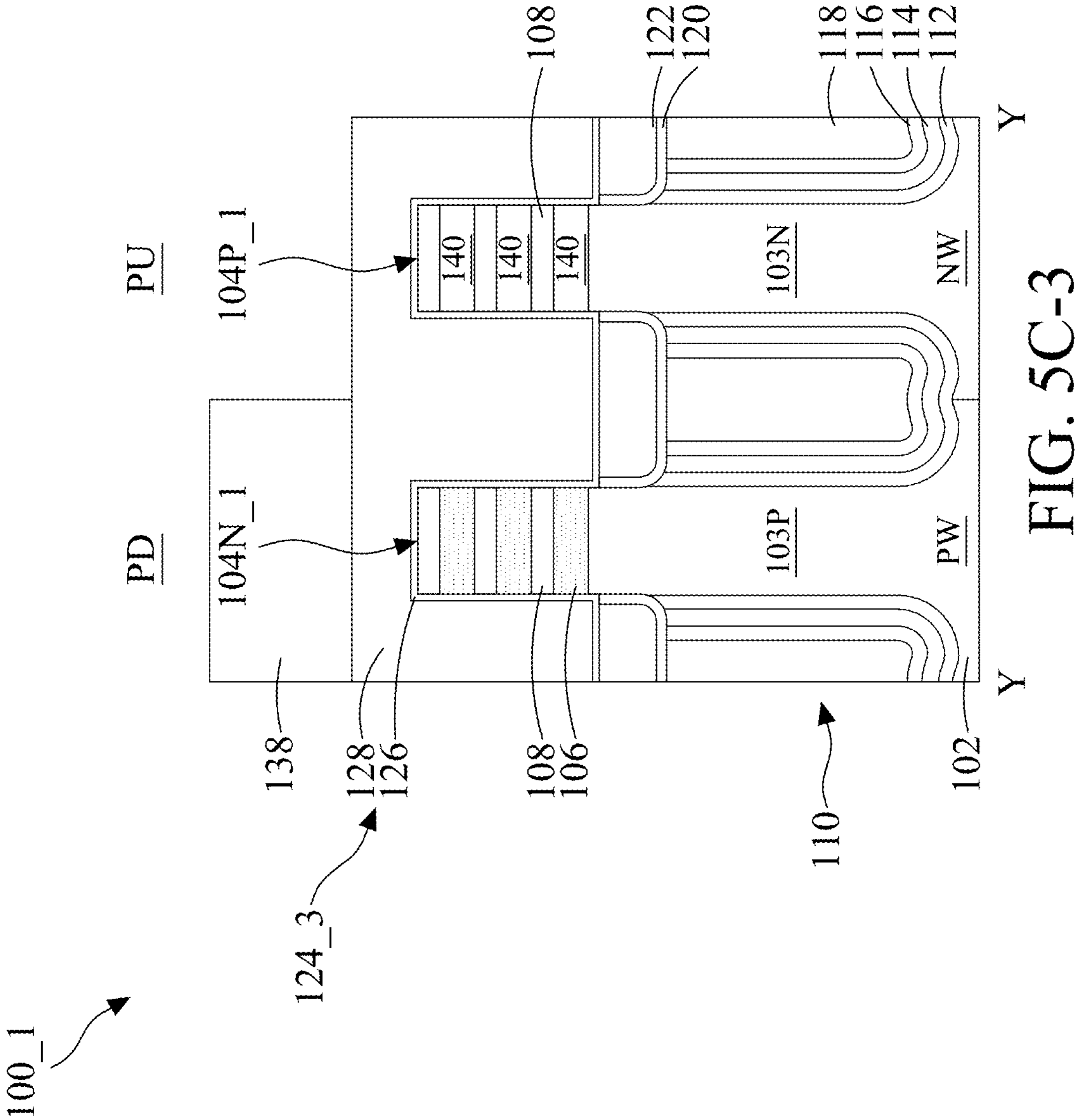
Figure 5D:
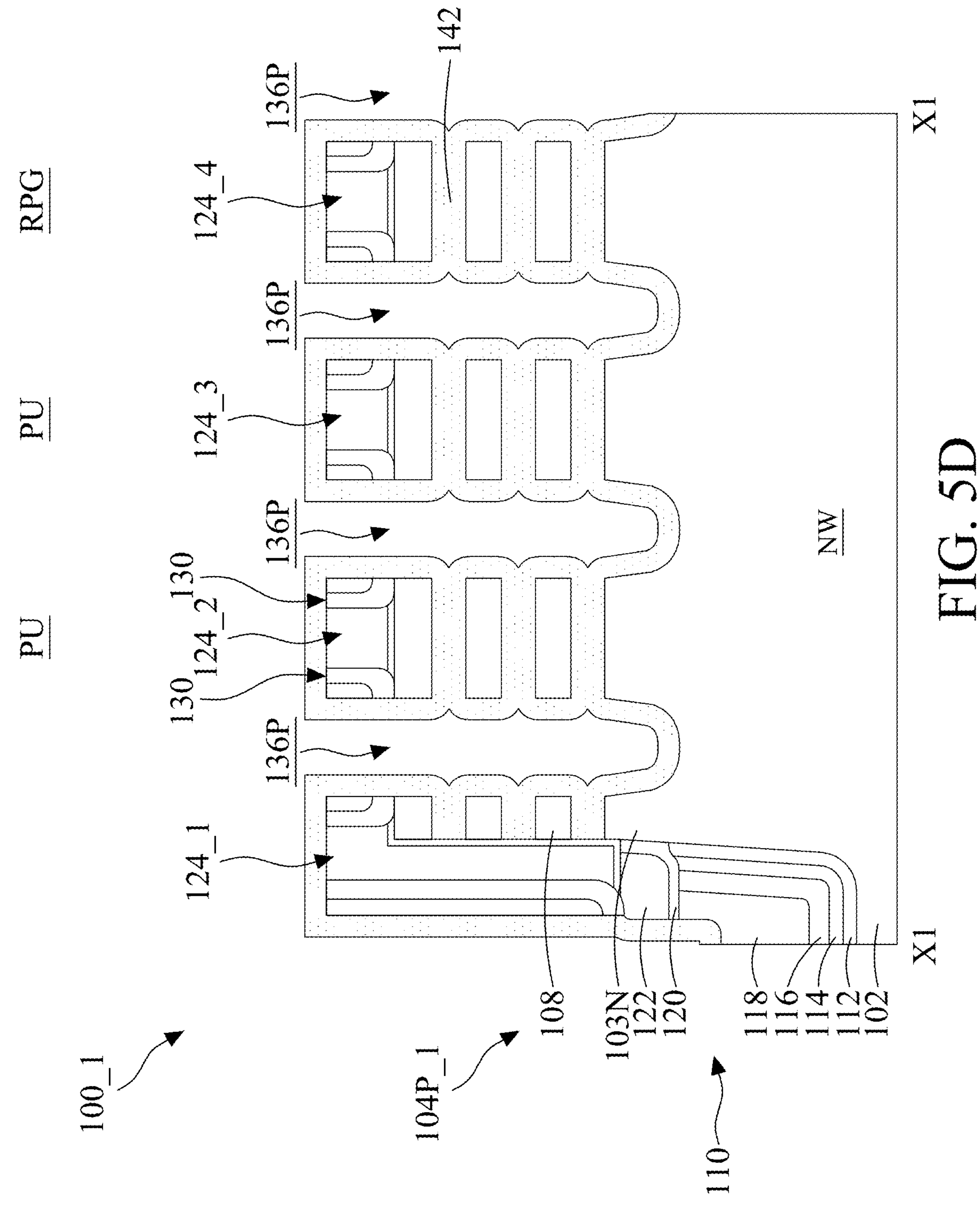
FIG. 5D is a cross-sectional view illustrating the formation of a semiconductor structure of SRAM cells at one of the intermediate stages corresponding to line X2-X2, of FIG. 4, in accordance with some embodiments of the disclosure.
Figure 5E:
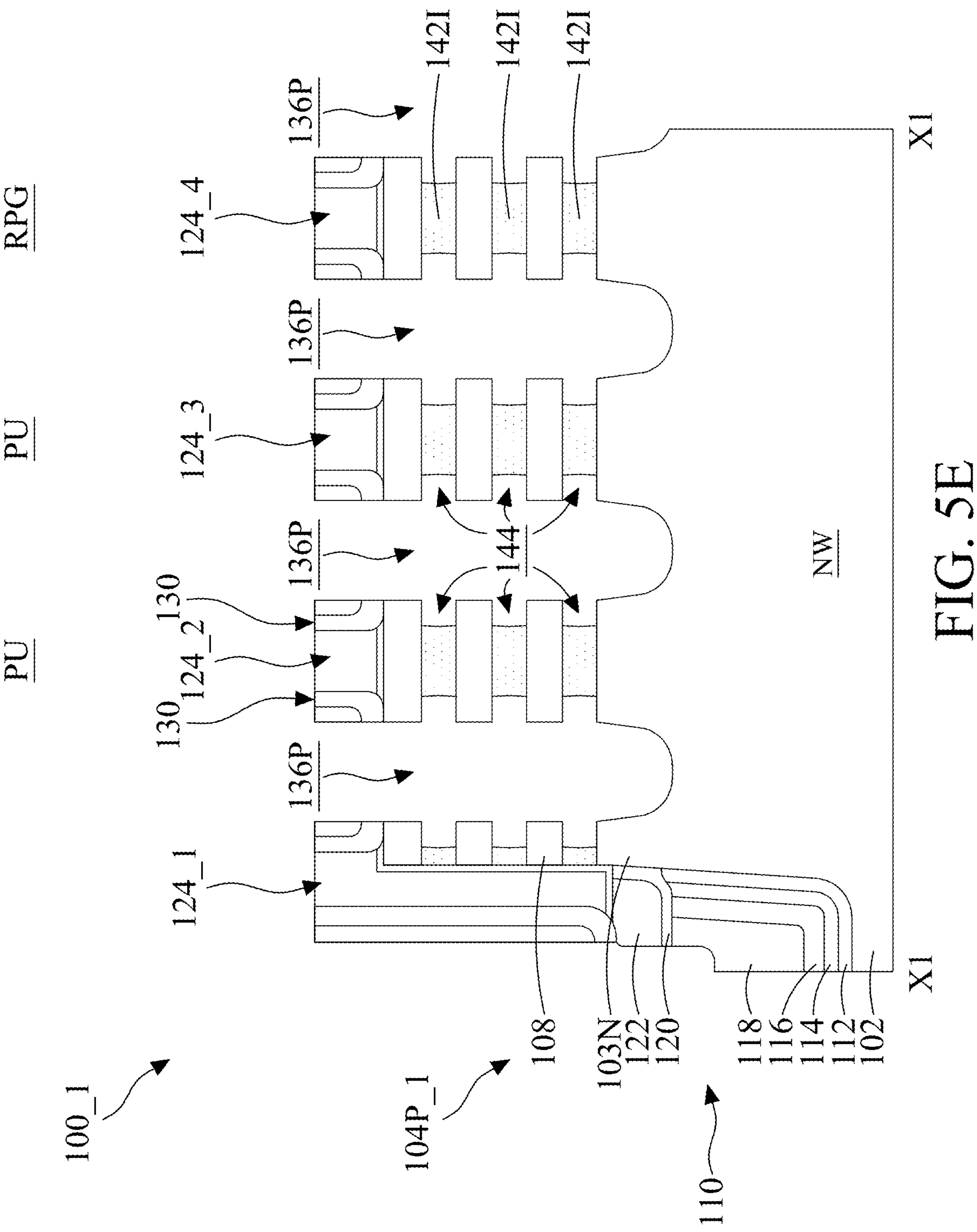
FIG. 5E is a cross-sectional view illustrating the formation of a semiconductor structure of SRAM cells at one of the intermediate stages corresponding to line X2-X2, of FIG. 4, in accordance with some embodiments of the disclosure.

FIGS. 5C-1 to 5E illustrate a replacement process of the first semiconductor layers 106, in accordance with some embodiments. The replacement process may also be referred to a Disposable Oxide Interposer (DOI) process. FIGS. 5C-1, 5C-2 and 5C-3 illustrate a semiconductor structure 100_1 after the removal of the first semiconductor layers 106, in accordance with some embodiments. A patterned mask layer 138 is formed to cover the active region 104N (or the p-type well PW) and exposes the active region 104P (or the n-type well NW), as shown in FIGS. 5C-1 to 5C-3, in accordance with some embodiments. The patterned mask layer 138 may be a patterned mask layer and/or a patterned photoresist layer.

For example, a BARC material (such as an inorganic material or an organic material (e.g., polymer, oligomer, or monomer)) is globally and conformally deposited using a spin-on coating process, a CVD process, and a patterned photoresist layer is formed on the BARC material and correspond to or overlap the n-type well NW using a photolithography process. The photolithography process may include forming a photoresist material, performing a pre-exposure baking process, performing an exposure process using a mask (or a reticle), performing a post-exposure baking process, and performing a developing process. Afterward, the BARC material is etched using the patterned photoresist layer, thereby forming the patterned mask layer 138, in accordance with some embodiments. In some embodiments, the etching process may be an anisotropic etching process such as dry plasma etching, an isotropic etching process such as dry chemical etching, remote plasma etching, wet chemical etching, or a combination thereof. The photoresist layer may be removed in the etching process or by an additional process (e.g., etching or ashing process).

An etching process is performed using the patterned mask layer 138 to remove the first semiconductor layers 106 of the active regions 104P, thereby forming gaps 140, as shown in FIGS. 5C-1 and 5C-3, in accordance with some embodiments. The first semiconductor layers 106 of the active regions 104N are protected by the patterned mask layer 138, and remain after the etching process, in accordance with some embodiments. The etching processes include an isotropic etching process such as dry chemical etching, remote plasma etching or wet chemical etching, or a combination thereof.

FIG. 5D illustrates a semiconductor structure 100_1 after the deposition of a dielectric material 142, in accordance with some embodiments. A dielectric material 142 is deposited over the semiconductor structure 100_1 to overfill the gaps 140, as shown in FIG. 5D, in accordance with some embodiments. In some embodiments, the source/drain recesses 136P are partially filled. In some embodiments, the source/drain recesses 136P are partially filled by the dielectric material 142. The dielectric material 142 is silicon oxide ($SiO_2$), silicon nitride (SiN), silicon carbide (SiC), silicon oxynitride (SiON), silicon carbon nitride (SiCN), silicon oxycarbonitride (SiOCN), and/or oxygen-doped silicon carbonitride (Si(O)CN). In some embodiments, the deposition process includes ALD, CVD (such as PECVD, LPCVD or HARP), another suitable technique, or a combination thereof.

FIG. 5E illustrates a semiconductor structure 100_1 after an etching process, in accordance with some embodiments. An etching process is performed to etch away the dielectric material 142 outside the gaps 140, as shown in FIG. 5E, in accordance with some embodiments. The dielectric material 142 left remaining in the gaps 140 are referred to as dielectric layers 142I. The etching process further laterally recesses, from the source/drain recesses 136P, the dielectric layers 142I thereby forming notches 144, in accordance with some embodiments. In some embodiments, the etching process includes an anisotropic etching process such as dry plasma etching, an isotropic etching process such as dry chemical etching, remote plasma etching or wet chemical etching, or a combination thereof.

Thus, the first semiconductor layers 106 of the active region 104P are replaced with the dielectric layers 142I, in accordance with some embodiments. In an embodiment, the dielectric material 142 is made of silicon oxide, and the dielectric layers 142I may also be referred to as Disposable Oxide Interposer (DOI) features. The etching selectivity (e.g., greater than 10000) between the dielectric layers 142I (e.g., SiO) and the second semiconductor layers 108 (e.g., Si) is much greater than the etching selectivity (e.g., about 170) between the first semiconductor layers 106 (e.g., SiGe) and the second semiconductor layers 108 (e.g., Si), in accordance with some embodiments. The dielectric layers 142I are configured to reduce the loss of the channel layers in the following channel-releasing process, in accordance with some embodiments. The notches 144 are located directly below the gate spacer layers 130, in accordance with some embodiments. The notches 144 are formed between adjacent second semiconductor layers 108 and between the lowermost second semiconductor layer 108 and the lower fin element 103N, in accordance with some embodiments.

Figure 5F:
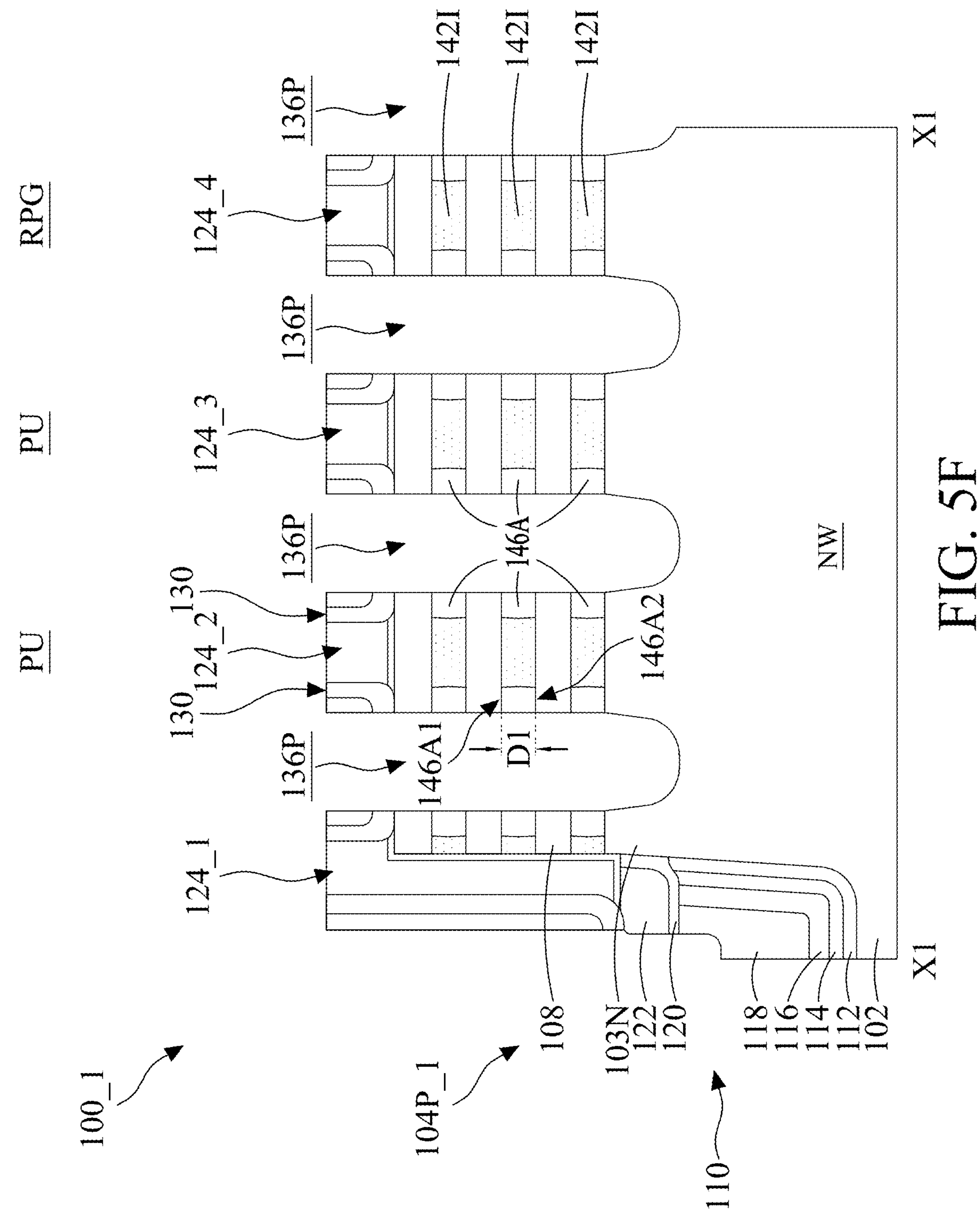
FIG. 5F is a cross-sectional view illustrating the formation of a semiconductor structure of SRAM cells at one of the intermediate stages corresponding to line X2-X2, of FIG. 4, in accordance with some embodiments of the disclosure.

FIG. 5F illustrates a semiconductor structure 100_1 after the formation of inner spacer layers 146A, in accordance with some embodiments. Inner spacer layers 146A are formed in the notches 144, as shown in FIG. 5F, in accordance with some embodiments. The inner spacer layers 146A are formed to abut the recessed side surfaces of the dielectric layers 142I, in accordance with some embodiments. In some embodiments, the inner spacer layers 146A are located directly below the gate spacer layers 130. The inner spacer layers may avoid the source/drain features and the gate stack from being in direct contact and are configured to reduce the parasitic capacitance between the gate stack and the source/drain features (i.e., Cgs and Cgd), in accordance with some embodiments.

In some embodiments, the inner spacer layers 146A are made of dielectric material, such as silicon oxide ($SiO_2$), silicon nitride (SiN), silicon carbide (SiC), silicon oxynitride (SiON), silicon carbon nitride (SiCN), silicon oxycarbonitride (SiOCN), and/or oxygen-doped silicon carbonitride (Si(O)CN). In some embodiments, the inner spacer layers 146A are formed by depositing a dielectric material over the semiconductor structure 100_1 to overfill the notches 144, and then etching back the dielectric material to remove the dielectric material outside the notches 144. Portions of the dielectric material left in the notches 144 serve as inner spacer layers 146A, in accordance with some embodiments. In some embodiments, the deposition process includes ALD, CVD (such as PECVD, LPCVD or HARP), another suitable technique, or a combination thereof. In some embodiments, the etching back process includes an anisotropic etching process such as dry plasma etching, an isotropic etching process such as dry chemical etching, remote plasma etching or wet chemical etching, or a combination thereof.

Due to the relatively high etching selectivity between the dielectric layers 142I and the second semiconductor layers 108, the second semiconductor layers 108 may be substantially unrecessed in the etching process for forming the notches 144. Thus, the top and bottom surfaces 146A1 and 146A2 of the inner spacer layers 146A interfaced with the second semiconductor layers 108 are substantially horizontal flat surfaces. After the inner spacer layers 146A are formed, the patterned mask layer 138 (FIGS. 5C-1 and 5C-3) is removed, e.g., using an etching process, ashing process and/or wet strip process.

Figures 1, 5G:
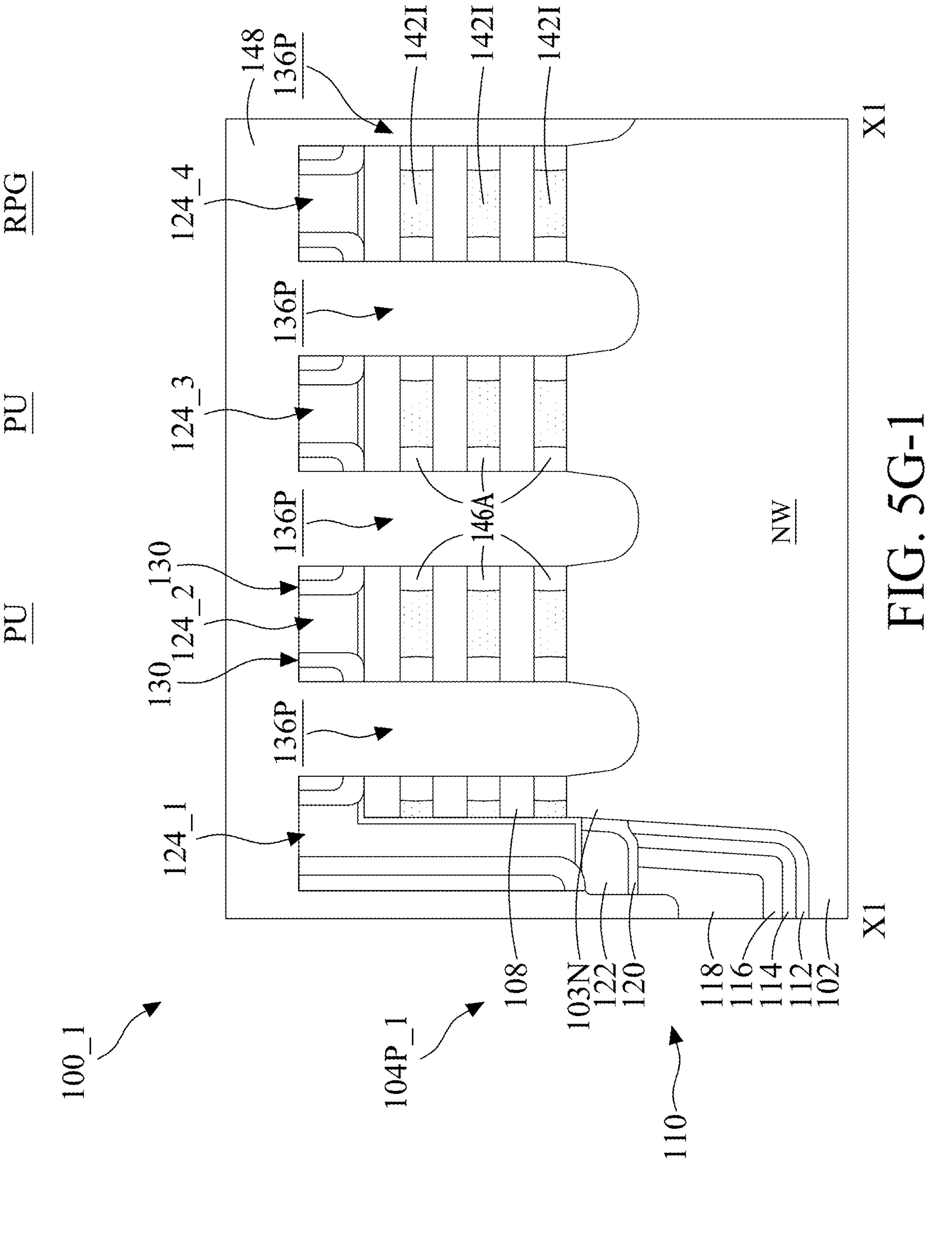
Figures 2, 5G:
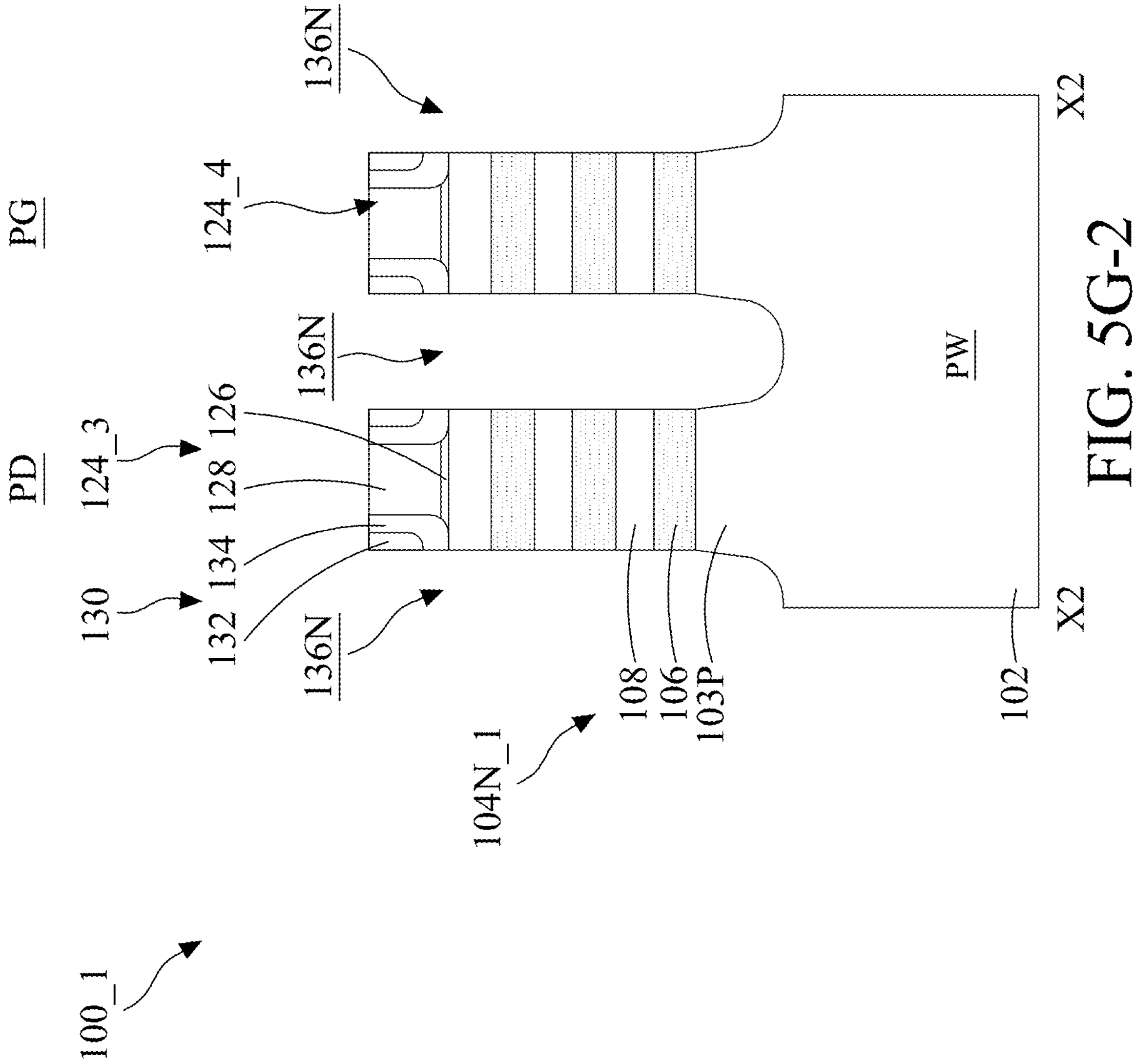
Figures 3, 5G:
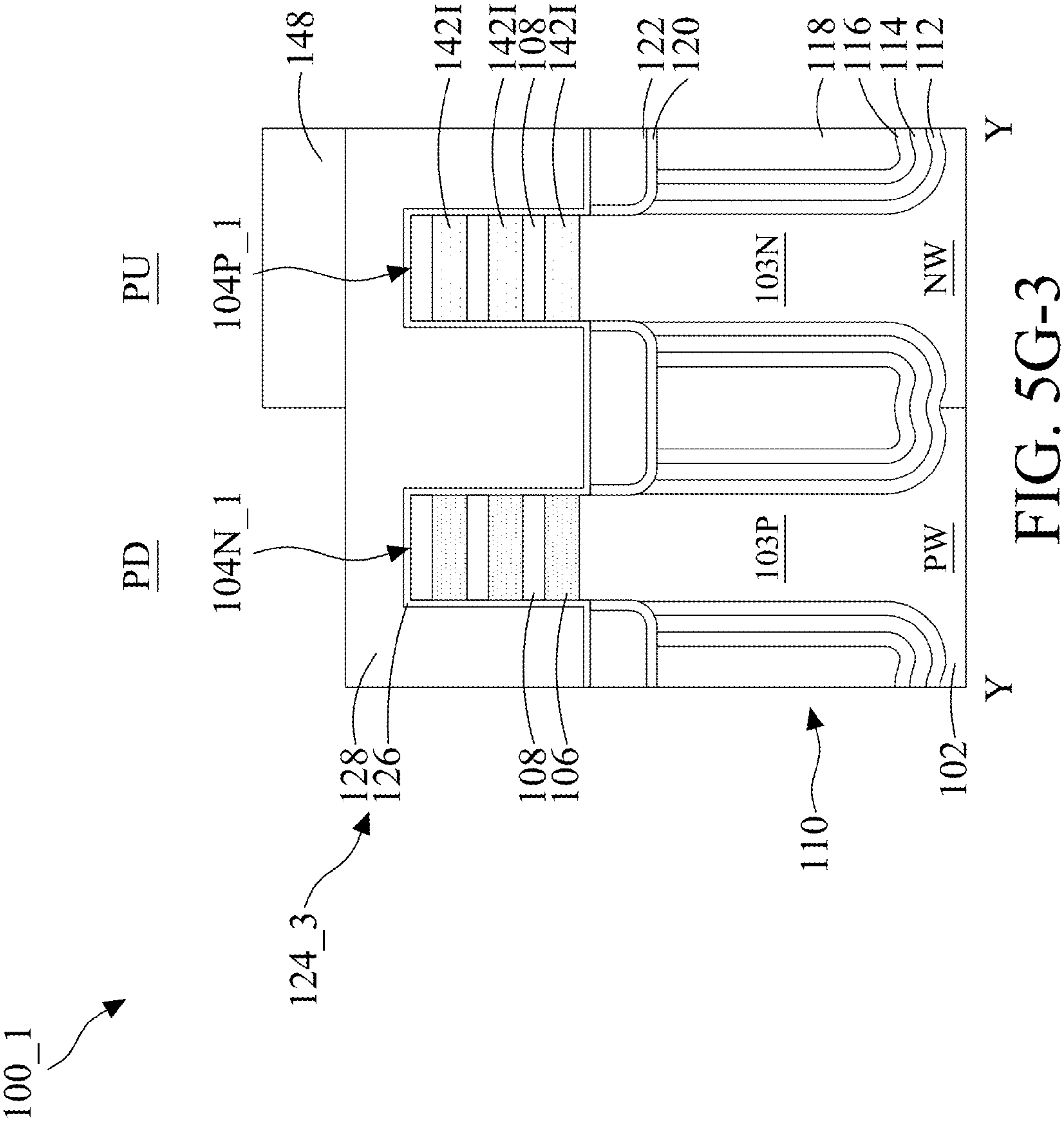

FIGS. 5G-1, 5G-2 and 5G-3 illustrate a semiconductor structure 100_1 after the formation of a patterned mask layer 148, in accordance with some embodiments. A patterned mask layer 148 is formed to cover the active regions 104P (or the n-type well NW) and exposes the active regions 104N (or the p-type well PW), as shown in FIG. 5G-1 to 5G-3, in accordance with some embodiments. The patterned mask layer 148 may be a patterned mask layer and/or a patterned photoresist layer. The method for forming the patterned mask layer 148 may be similar to the method described above.

Figure 5H:
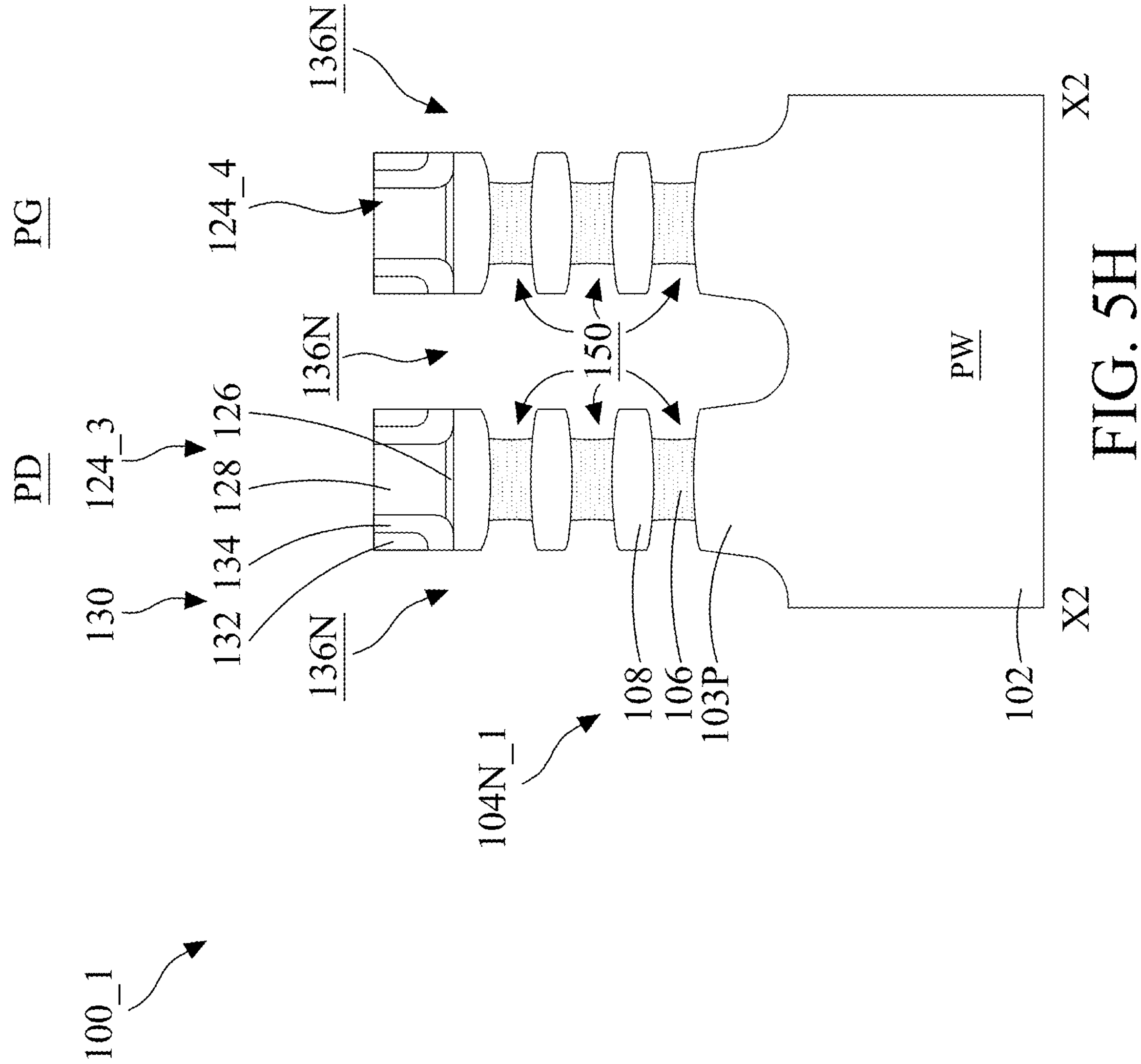
FIG. 5H is a cross-sectional view illustrating the formation of a semiconductor structure of SRAM cells at one of the intermediate stages corresponding to line X1-X1, of FIG. 4, in accordance with some embodiments of the disclosure.

FIG. 5H illustrates a semiconductor structure 100_1 after the formation of notches 150, in accordance with some embodiments. The etching process laterally recesses, from the source/drain recesses 136N, the first semiconductor layers 106, thereby forming notches 150, in accordance with some embodiments. In some embodiments, the etching process includes an anisotropic etching process such as dry plasma etching, an isotropic etching process such as dry chemical etching, remote plasma etching or wet chemical etching, or a combination thereof. The notches 150 are located directly below the gate spacer layers 130, in accordance with some embodiments. The notches 150 are formed between adjacent second semiconductor layers 108 and between the lowermost second semiconductor layer 108 and the lower fin element 103P, in accordance with some embodiments.

Figure 5I:
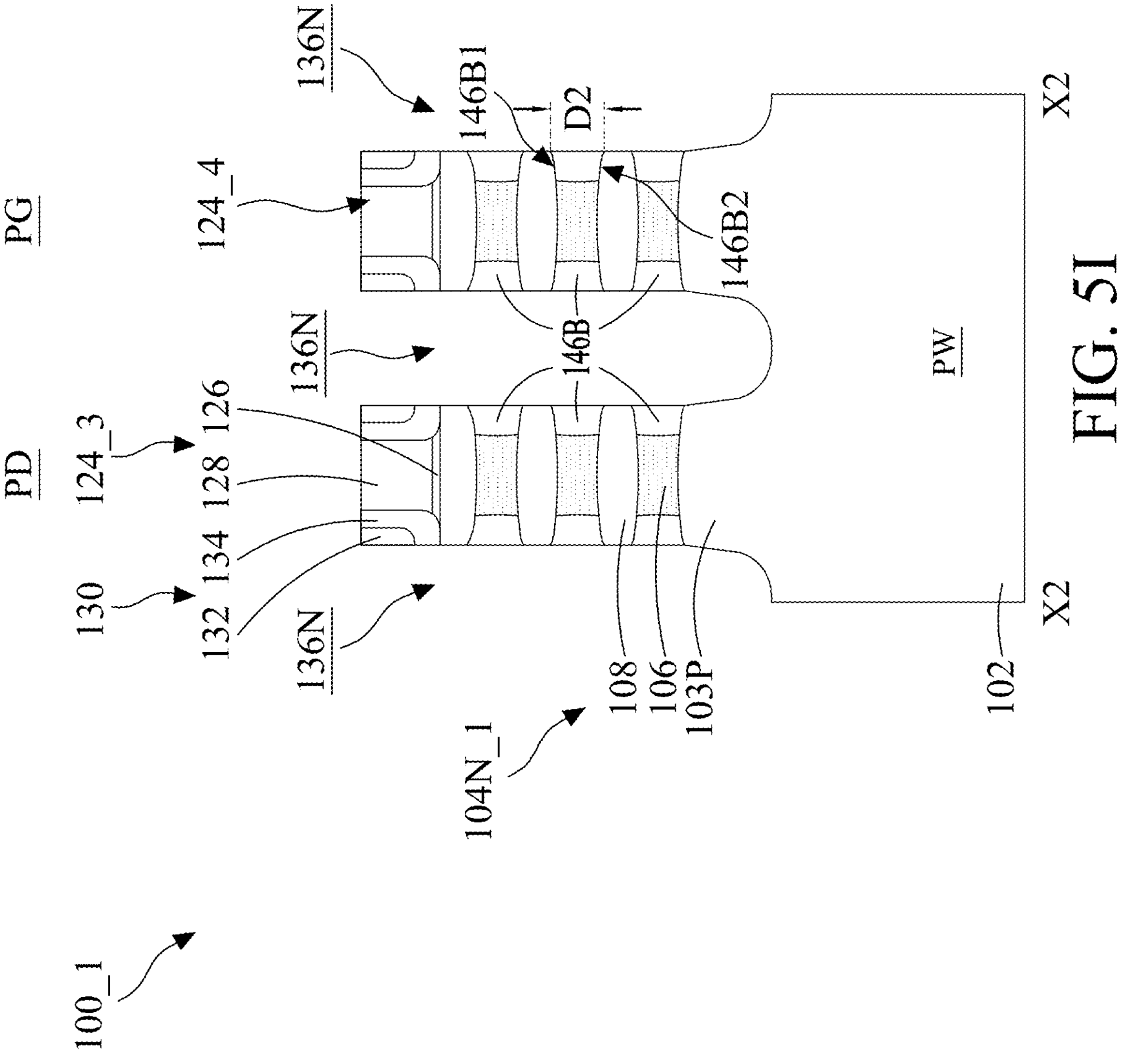
FIG. 5I is a cross-sectional view illustrating the formation of a semiconductor structure of SRAM cells at one of the intermediate stages corresponding to line X1-X1, of FIG. 4, in accordance with some embodiments of the disclosure.

FIG. 5I illustrates a semiconductor structure 100_1 after the formation of inner spacer layers 146B, in accordance with some embodiments. Inner spacer layers 146B are formed in the notches 150, as shown in FIG. 5I, in accordance with some embodiments. The inner spacer layers 146B are formed to abut the recessed side surfaces of the first semiconductor layers 106, in accordance with some embodiments. In some embodiments, the inner spacer layers 146B are located directly below the gate spacer layers 130. In some embodiments, the inner spacer layers 146B are made of dielectric material, such as silicon oxide ($SiO_2$), silicon nitride (SiN), silicon carbide (SiC), silicon oxynitride (SiON), silicon carbon nitride (SiCN), silicon oxycarbonitride (SiOCN), and/or oxygen-doped silicon carbonitride (Si(O)CN). The inner spacer layers 146B and 146A may be made of the same dielectric material.

In some embodiments, the inner spacer layers 146B are formed by depositing a dielectric material over the semiconductor structure 100_1 to overfill the notches 150, and then etching back the dielectric material to remove the dielectric material outside the notches 150. Portions of the dielectric material left in the notches 150 serve as inner spacer layers 146B, in accordance with some embodiments. After the inner spacer layers 146B are formed, the patterned mask layer 148 is removed, e.g., using an etching process, ashing process and/or wet strip process.

Due to the relatively low etching selectivity between the first semiconductor layers 106 and the second semiconductor layers 108, the second semiconductor layers 108 may be recessed in the etching process for forming the notches 150. The top and bottom surfaces 146B1 and 146B2 of the inner spacer layers 146B interfaced with the second semiconductor layers 108 taper toward the channel regions. In some embodiments, the top and bottom surfaces 146B1 and 146B2 are curved surfaces. In some embodiments, the top and bottom surfaces 146B1 and 146B2 are linear surfaces inclined to the horizontal surface. In some embodiments, in the Z direction, the dimension D1 (FIG. 5F) of the inner spacer layers 146A is less than the dimension D2 of the inner spacer layers 146B.

Because the etching selectivity (e.g., greater than 10000) between the dielectric layers 142I (e.g., SiO) and the second semiconductor layers 108 (e.g., Si) is much greater than the etching selectivity (e.g., about 170) between the first semiconductor layers 106 (e.g., SiGe) and the second semiconductor layers 108 (e.g., Si), the loss (i.e., the etching amount) of the second semiconductor layers 108 of the active region 104P in the formation of the inner spacer layers 146A is less than the loss (i.e., the etching amount) of the second semiconductor layers 108 of the active region 104N in the formation of the inner spacer layers 146B, in accordance with some embodiments.

Although FIGS. 5C-1 through 5I illustrate that the DOI process and the formation of the inner spacer layers 146A are performed before the formation of the inner spacer layers 146B, the embodiments of the method are not limited thereto. In some other embodiments, the DOI process and the formation of the inner spacer layers 146A may be performed after the formation of the inner spacer layers 146B.

Figures 1, 5J:
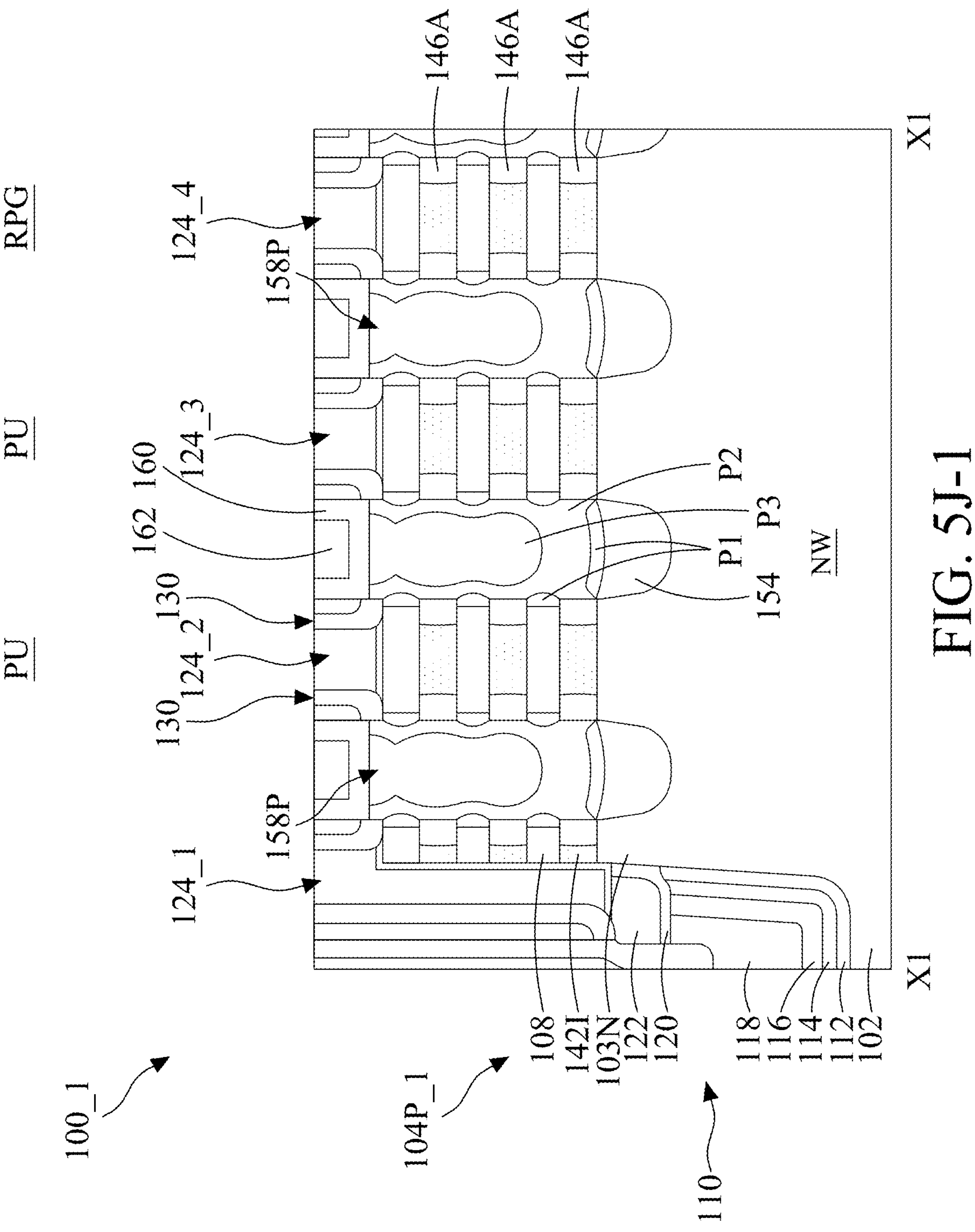
Figures 2, 5J:
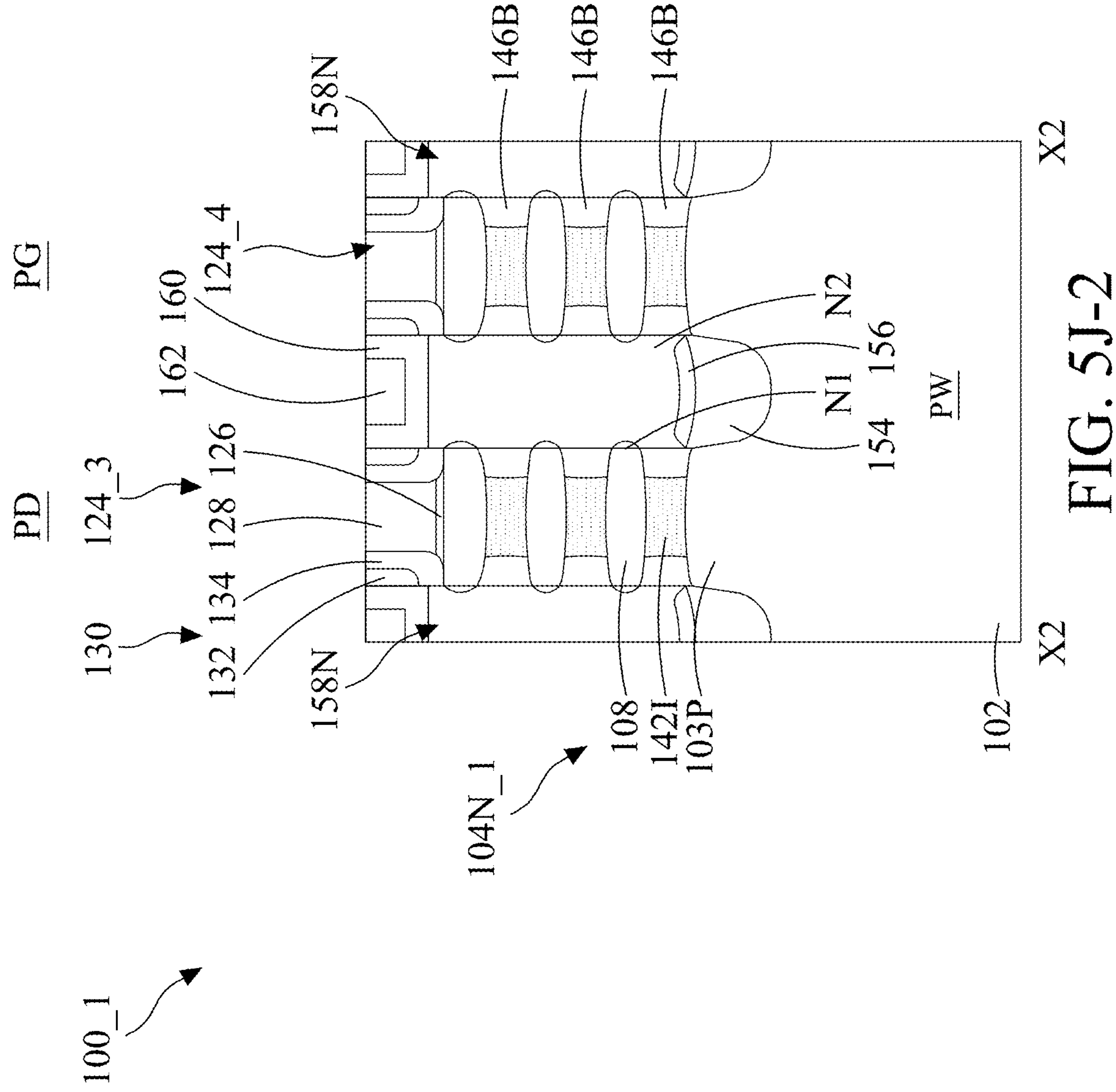

FIGS. 5J-1 and 5J-2 illustrate a semiconductor structure 100_1 after the formation of semiconductor isolation features 154, dielectric isolation features 156, source/drain features 158N and 158P, a contact etching stop layer 160 and a first interlayer dielectric layer 162, in accordance with some embodiments. Semiconductor isolation features 154 are formed in the source/drain recesses 136N and 136P on the lower fin elements 103P and 103N, as shown in FIGS. 5J-1 and 5J-2, in accordance with some embodiments. In some embodiments, the semiconductor isolation features 154 are made of an epitaxial semiconductor material such as non-doped silicon, formed by MBE, MOCVD, or VPE, another suitable technique, or a combination thereof.

Source/drain features 158P are formed over the semiconductor isolation features 154 in the source/drain recesses 136P, as shown in FIG. 5J-1, in accordance with some embodiments. The epitaxial growth process may be MBE, MOCVD, or VPE, another suitable technique, or a combination thereof. In some embodiments, the source/drain features 158P are in-situ doped during the epitaxial processes. In some embodiments, the source/drain features 158P are doped with the p-type dopant during the epitaxial growth process. For example, the p-type dopant may be boron (B) or $BF_2$.

For example, the p-type source/drain features 158P may be the epitaxially grown silicon germanium (SiGe), silicon germanium carbon (SiGeC), germanium (Ge), silicon (Si), or a combination thereof doped with boron (B). In some embodiments, the concentrations of the dopant (e.g., B) in the source/drain features 158P are in a range from about $1\times10^{19}$ $cm^3$ to about $6\times10^{20}$ $cm^{-3}$. In some embodiments, the p-type source/drain features 158P may be multilayered structures, e.g., including sequentially formed layers P1, P2 and P3. In some embodiments, the concentration of the dopant in the layer P3 is higher than the concentration of the dopant in the layer P2, e.g., by 1-2 orders. In an embodiment, the layer P1 is boron-doped silicon layer.

In addition, in some embodiments, before the p-type source/drain features 158P are formed, an epitaxial (EPI) proximity push process is selectively performed on the second semiconductor layers 108 of the active region 104P. In some embodiments, the sidewalls of the second semiconductor layers 108 of the active region 104P are indented from the sidewalls of the inner spacer layers 146A, as shown in FIG. 5J-1. In some embodiments, the epitaxial proximity push process includes an isotropic etching process.

Dielectric isolation features 156 are formed over the semiconductor isolation features 154 in the source/drain recesses 136N, as shown in FIG. 5J-2, in accordance with some embodiments. The dielectric isolation features 156 is configured to reduce the parasitic capacitance of the resulting n-channel transistors. In some other embodiments, the dielectric isolation features 156 may also be formed on the semiconductor isolation features 154 in the source/drain recesses 136P. In some embodiments, the dielectric isolation features 156 are made of a dielectric material, such as silicon oxide ($SiO_2$), silicon nitride (SiN), silicon carbide (SiC), silicon oxynitride (SiON), silicon carbon nitride (SiCN), silicon oxycarbonitride (SiOCN), and/or oxygen-doped silicon carbonitride (Si(O)CN), or high-k dielectric material (e.g., with dielectric constant greater than about 7.9) such as LaO, AlO, AlON, ZrO, HfO, ZnO, ZrN, ZrAlO, TiO, TaO, YO, TaCN, or a combination thereof. In some embodiments, the dielectric isolation features 156 are deposited using a technique such as ALD, CVD (such as HDP-CVD, LPCVD or PECVD), another suitable technique, or a combination thereof, followed by an etching-back process.

Source/drain features 158N are formed over the dielectric isolation features 156 in the source/drain recesses 136N, as shown in FIG. 5J-2, in accordance with some embodiments. The epitaxial growth process may be MBE, MOCVD, or VPE, another suitable technique, or a combination thereof. In some embodiments, the source/drain features 158N are in-situ doped during the epitaxial processes. In some embodiments, the source/drain features 158N are doped with the n-type dopant during the epitaxial growth process. For example, the n-type dopant may be phosphorous (P) or arsenic (As).

For example, the n-type source/drain features 158N may be the epitaxially grown silicon phosphorous (SiP), silicon carbon (SiC), silicon phosphorous carbon (SiPC), silicon phosphorous arsenic (SiPAs), silicon arsenic (SiAs), silicon (Si), or a combination thereof doped with phosphorous and/or arsenic. In some embodiments, the concentrations of the dopant (e.g., P) in the source/drain features 158N are in a range from about $2\times10^{19}$ $cm^{-3}$ to about $3\times10^{21}$ $cm^{-3}$. In some embodiments, the n-type source/drain features 158N may be multilayered structures, e.g., including sequentially formed layers N1 and N2. In some embodiments, the concentration of the dopant in the layer N2 is higher than the concentration of the dopant in the layer N1, e.g., by 1-2 orders.

In some embodiments, the n-type source/drain features 158N and the p-type source/drain features 158P are made of different epitaxial materials. For example, the n-type source/drain features 158N are made of SiP, and the p-type source/drain features 158P are made of SiGe. The source/drain features 158N and 158P are formed on opposite sides of the dummy gate structures 124, in accordance with some embodiments. In some embodiments, the source/drain features 158N have a different electrically conductive type than the source/drain features 158P.

In some embodiments, the source/drain features 158N and the source/drain features 158P may be formed separately. For example, a patterned mask layer (such as a photoresist layer and/or a hard mask layer) may be formed to cover the semiconductor structure 100_1 over the n-type well regions NW, and then the source/drain features 158N are grown. Afterward, the patterned mask layer may be removed. Similarly, a patterned mask layer (such as a photoresist layer and/or a hard mask layer) is formed to cover the semiconductor structure 100_1 over the p-type well regions PW, and then the source/drain features 158P are grown. Afterward, the patterned mask layer may be removed. Once the source/drain features 158N and 158P are formed, an annealing process may be performed to activate the dopants in the source/drain features 158N and 158P, in accordance with some embodiments.

A contact etching stop layer 160 is formed over the semiconductor structure 100_1 to cover the source/drain features 158N and 158P, as shown in FIGS. 5J-1 and 5J-2, in accordance with some embodiments. In some embodiments, the contact etching stop layer 160 is made of dielectric material, such as silicon nitride (SiN), silicon oxide (SiO2), silicon oxynitride (SiON), silicon carbide (SiC), oxygen-doped silicon carbide (SiC:O), oxygen-doped silicon carbonitride (Si(O)CN), or a combination thereof. In some embodiments, a dielectric material for the contact etching stop layer 160 is globally and conformally deposited over the semiconductor structure 100_1 using CVD (such as LPCVD, PECVD, HDP-CVD, or HARP), ALD, another suitable method, or a combination thereof.

Afterward, a first interlayer dielectric layer 162 is formed over the contact etching stop layer 160 to fill spaces between the dummy gate structures 124, as shown in FIGS. 5J-1 and 5J-2, in accordance with some embodiments. In some embodiments, the first interlayer dielectric layer 162 is made of dielectric material, such as undoped silicate glass (USG), doped silicon oxide such as borophosphosilicate glass (BPSG), fluoride-doped silicate glass (FSG), phosphosilicate glass (PSG), borosilicate glass (BSG), and/or another suitable dielectric material.

In some embodiments, the first interlayer dielectric layer 162 and the contact etching stop layer 160 are made of different materials and have a great difference in etching selectivity. In some embodiments, the dielectric material for the first interlayer dielectric layer 162 is deposited using such as CVD (such as HDP-CVD, PECVD, HARP or FCVD), another suitable technique, and/or a combination thereof. The dielectric materials for the contact etching stop layer 160 and the first interlayer dielectric layer 162 above the dummy gate electrode layer 128 are removed using such as CMP until the top surface of the dummy gate electrode layer 128 is exposed, in accordance with some embodiments.

Figures 1, 5K:
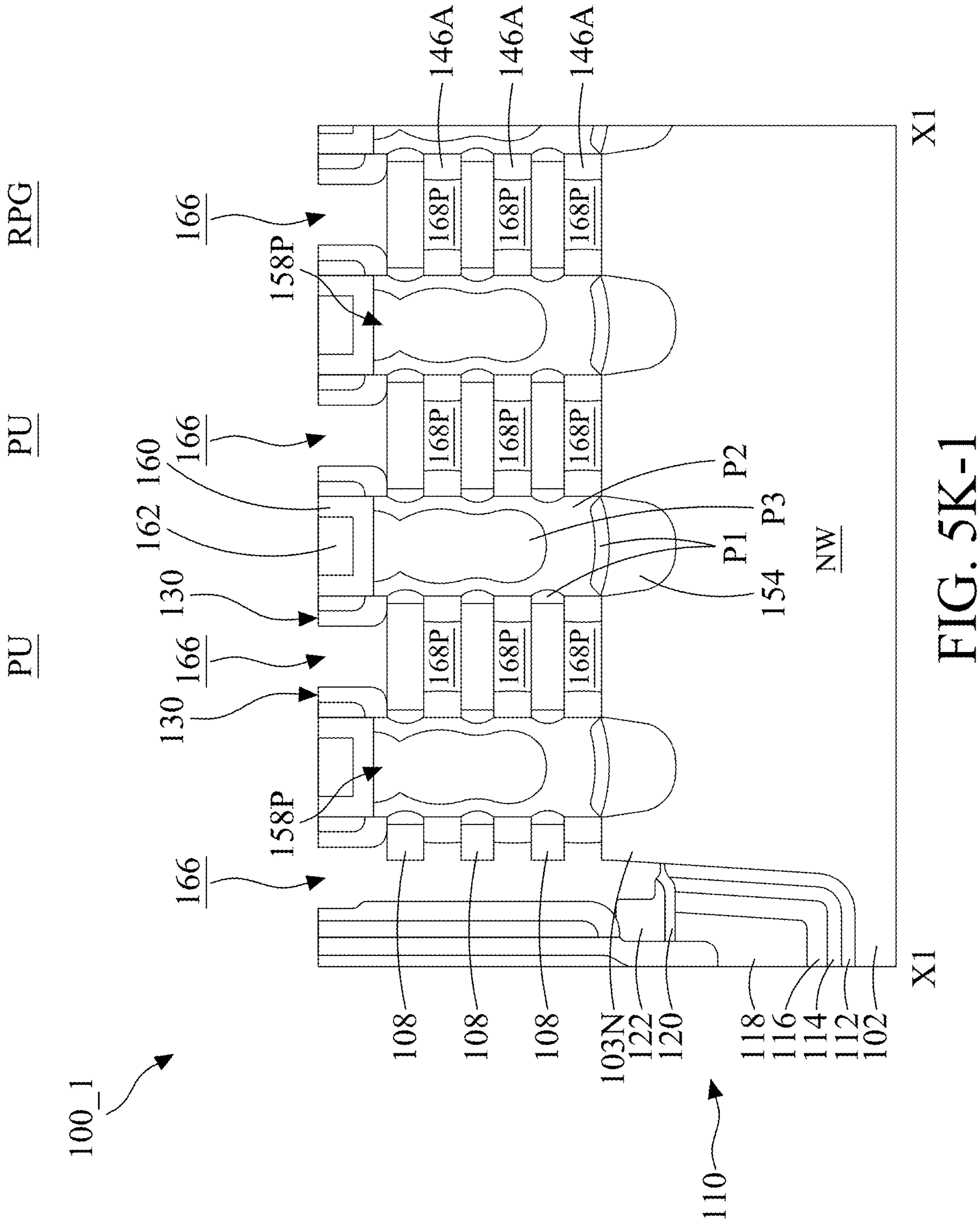
Figures 2, 5K:
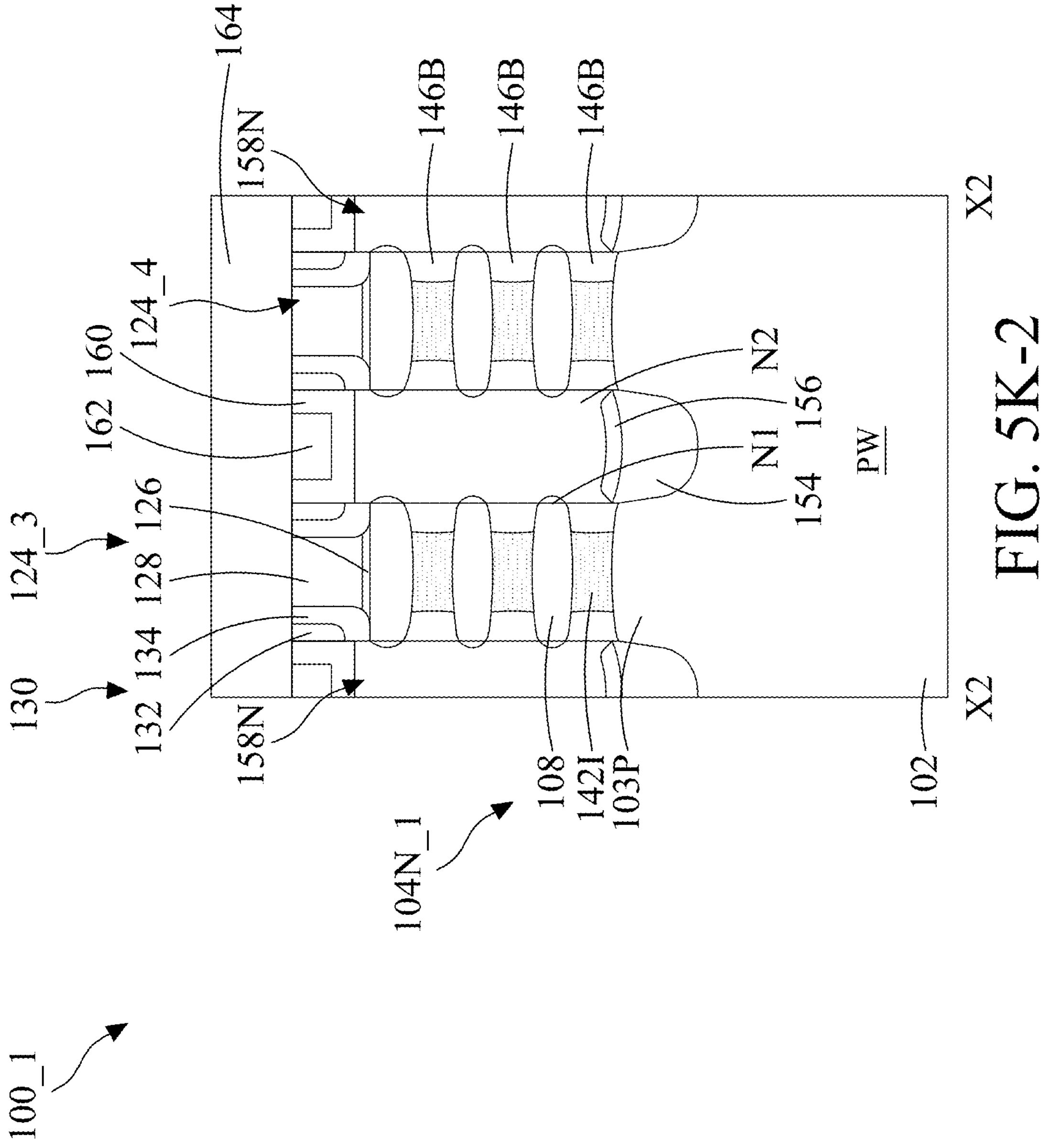
Figures 3, 5K:
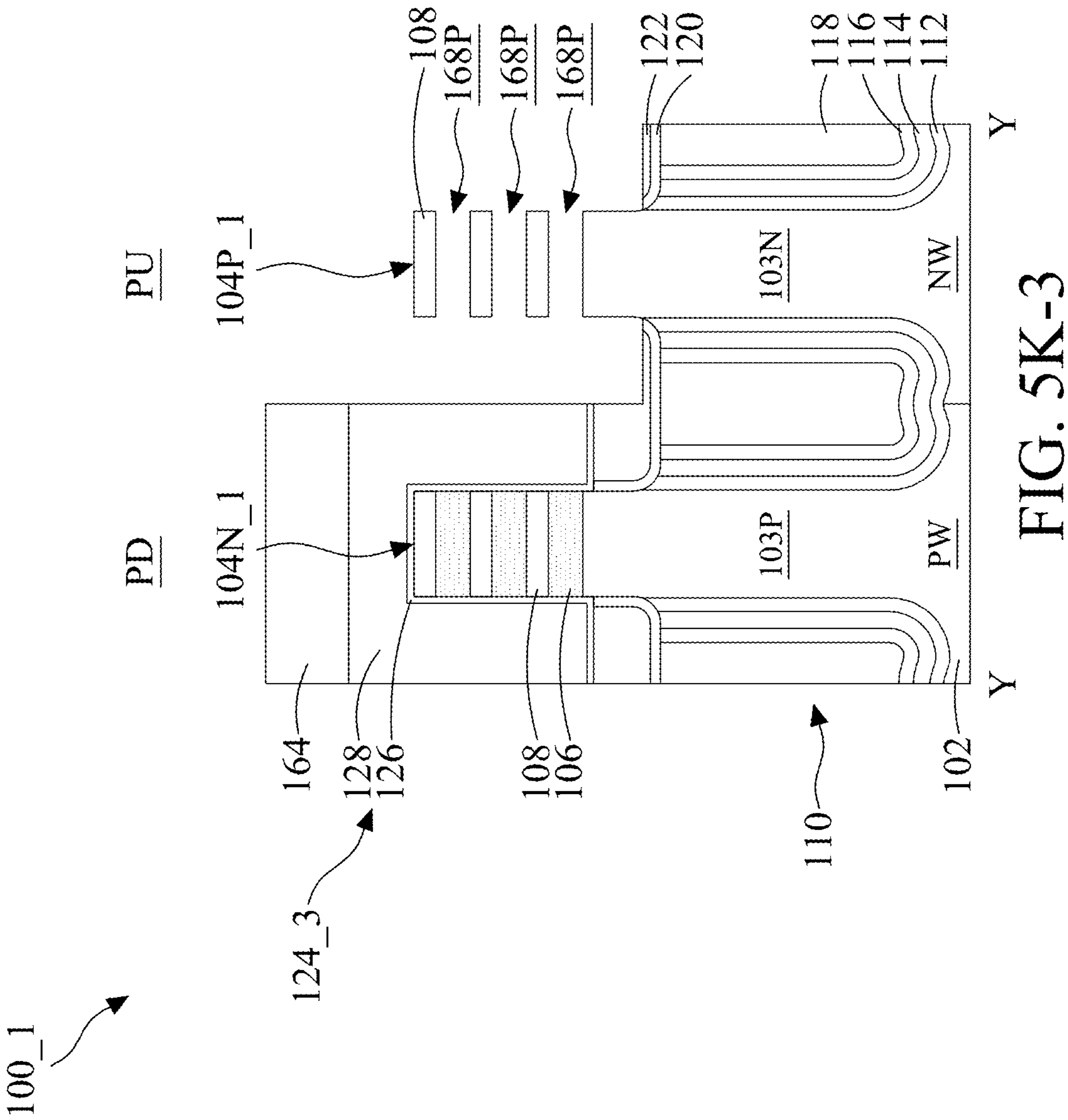

FIGS. 5K-1, 5K-2 and 5K-3 illustrate a semiconductor structure 100_1 after the formation of a patterned mask layer 164 and a first channel-releasing process, in accordance with some embodiments. A patterned mask layer 164 is formed to cover the active regions 104N (or the p-type well PW) and exposes the active regions 104P (or the n-type well NW), as shown in FIGS. 5K-1 to 5K-3, in accordance with some embodiments. The patterned mask layer 164 may be a patterned mask layer and/or a patterned photoresist layer. The method for forming the patterned mask layer 164 may be similar to the method described above.

The portion of the dummy gate structures 124 uncovered by the patterned mask layer 164 is removed using one or more etching processes to form gate trenches 166, as shown in FIG. 5K-1, in accordance with some embodiments. The gate trenches 166 expose the channel regions of the active region 104P, in accordance with some embodiments. In some embodiments, the gate trenches 166 also expose the sidewalls of the gate spacer layers 130 facing the channel region, in accordance with some embodiments. The etching processes for removing the dummy gate structures 124 may be an anisotropic etching process such as dry plasma etching, an isotropic etching process such as dry chemical etching, remote plasma etching or wet chemical etching, and/or a combination thereof.

The dielectric layers 142I of the active regions 104P are removed using an etching process to form gaps 168P, in accordance with some embodiments. The inner spacer layers may be used as an etching stop layer in the etching process, which may protect the source/drain features from being damaged. In some embodiments, the gaps 168P also expose the sidewalls of the inner spacer layers 146A facing the channel region. The etching processes for removing the dielectric layers 142I may be an isotropic etching process such as dry chemical etching, remote plasma etching or wet chemical etching, and/or a combination thereof. In some embodiments, the etching process includes a dilute hydrogen fluoride (HF) solution. Afterward, the patterned mask layer 164 is removed, e.g., using an etching process, ashing process and/or wet strip process.

In some embodiments, in the etching process for removing the dummy gate structure 124 and the dielectric layers 142I, the second bulk layer 122 and the isolation structure 110 is also recessed. The fourth lining layer 120 and the second bulk layer 122 may reduce the loss of the isolation structure 110 in the etching process. In some other embodiments, the isolation structure 110 may be substantially unrecessed.

Figures 1, 5L:
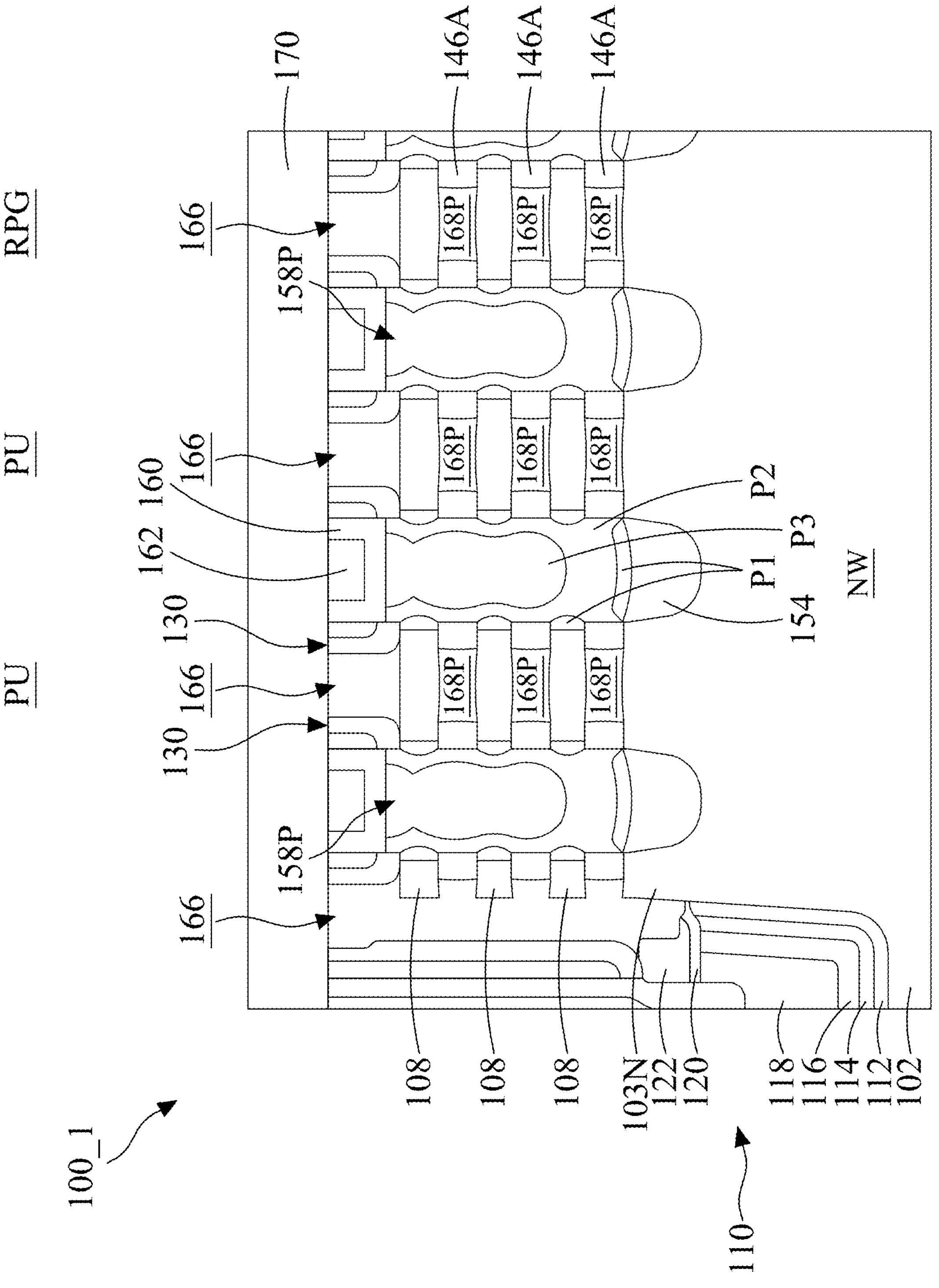
Figures 2, 5L:
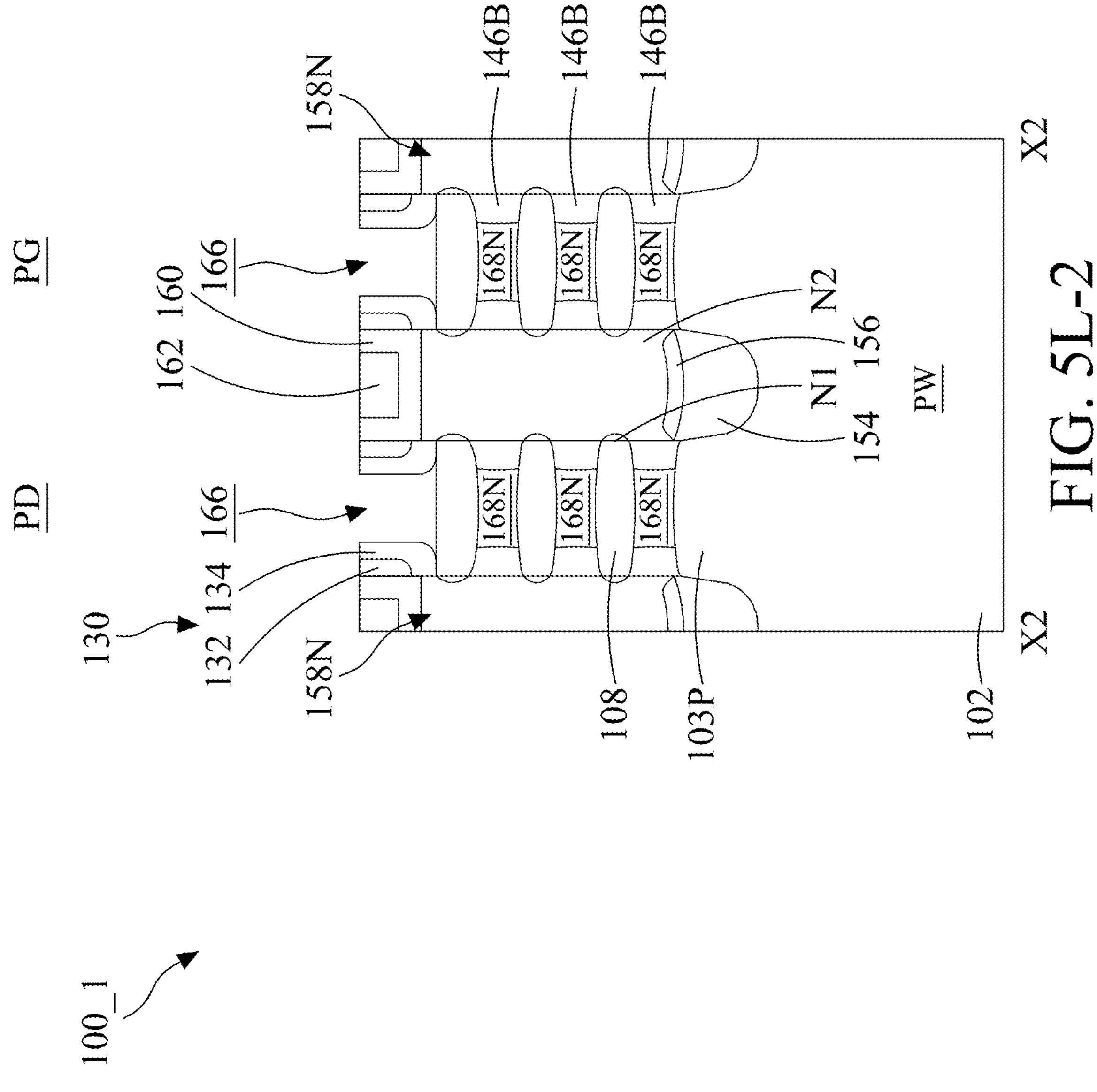
Figures 3, 5L:
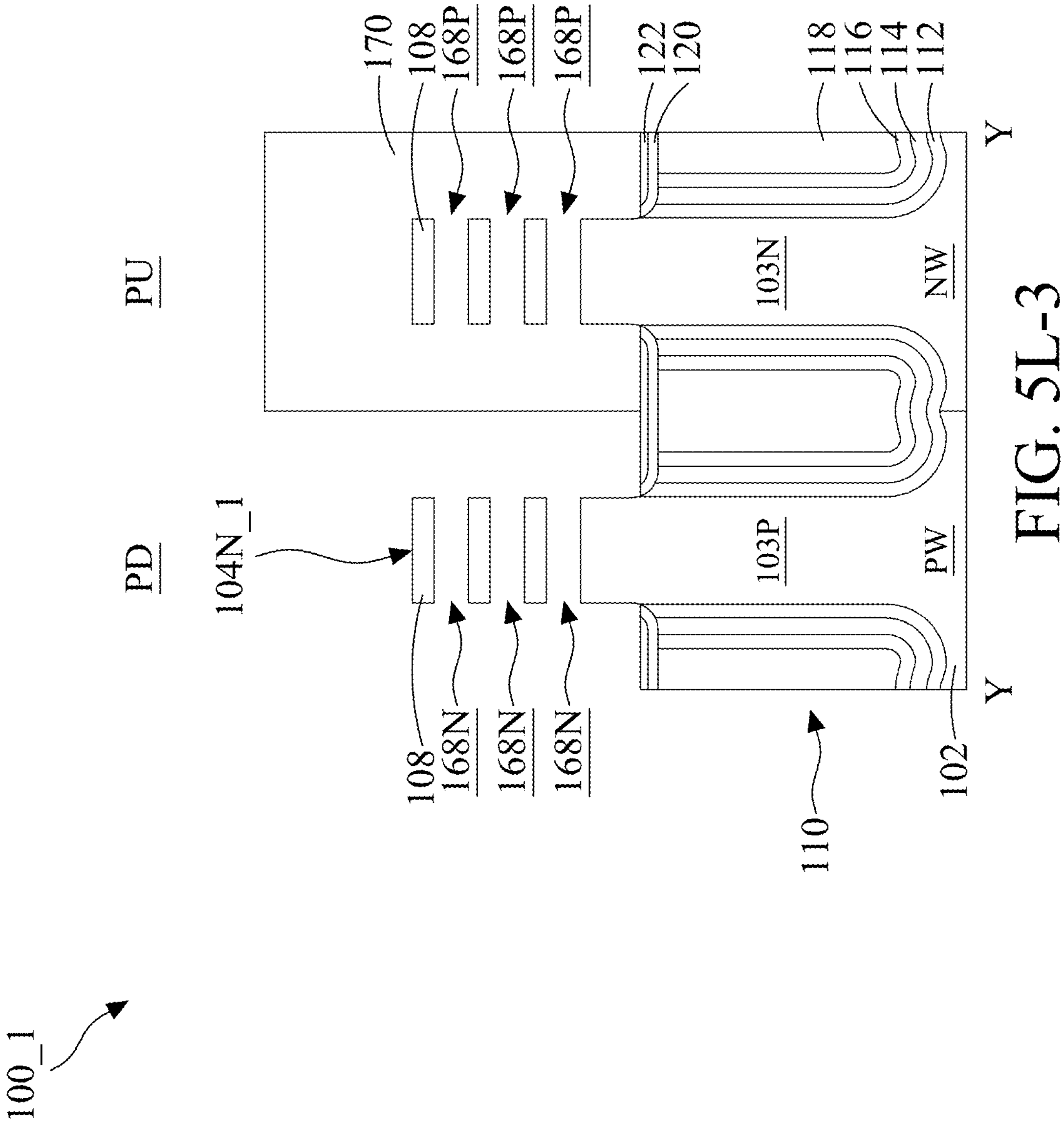

FIGS. 5L-1, 5L-2 and 5L-3 illustrate a semiconductor structure 100_1 after the formation of a patterned mask layer 170 and a second channel-releasing process, in accordance with some embodiments. A patterned mask layer 170 is formed to cover the n-type well NW and exposes the active regions 104N (or the p-type well PW), as shown in FIGS. 5L-1 to 5L-3, in accordance with some embodiments. The patterned mask layer 170 may be a patterned mask layer and/or a patterned photoresist layer. The method for forming the patterned mask layer 170 may be similar to the method described above.

The portion of the dummy gate structures 124 uncovered by the patterned mask layer 170 is removed using one or more etching processes to form gate trenches 166, in accordance with some embodiments. The gate trenches 166 expose the channel regions of the active region 104N, in accordance with some embodiments. The etching processes for removing the dummy gate structures 124 may be an anisotropic etching process such as dry plasma etching, an isotropic etching process such as dry chemical etching, remote plasma etching or wet chemical etching, and/or a combination thereof.

The first semiconductor layers 106 of the active regions 104N are removed using an etching process to form gaps 168N, in accordance with some embodiments. In some embodiments, the gaps 168N also expose the sidewalls of the inner spacer layers 146B facing the channel region. The etching processes for removing the first semiconductor layers 106 may be an isotropic etching process such as dry chemical etching, remote plasma etching or wet chemical etching, and/or a combination thereof. In some embodiments, the etching process includes APM (e.g., ammonia hydroxide-hydrogen peroxide-water mixture) etching process. In some embodiments, the wet etching process uses etchants such as ammonium hydroxide ($NH_4OH$), TMAH, ethylenediamine pyrocatechol (EDP), and/or potassium hydroxide (KOH) solutions. Afterward, the patterned mask layer 170 is removed, e.g., using an etching process, ashing process and/or wet strip process.

After the first and second channel-releasing processes, the main surfaces of the second semiconductor layers 108 are exposed, in accordance with some embodiments. The exposed second semiconductor layers 108 of the active regions 104N and 104P form sets of nanostructures 108 that function as channel layers of the resulting semiconductor devices (e.g., nanostructure transistors such as GAA FETs), in accordance with some embodiments.

Because the etching selectivity between the dielectric layers 142I (e.g., SiO) and the second semiconductor layers 108 (e.g., Si) is much greater than the etching selectivity between the first semiconductor layers 106 (e.g., SiGe) and the second semiconductor layers 108 (e.g., Si), the loss (i.e., the etching amount) of the second semiconductor layers 108 of the active region 104P in the first channel-releasing process is less than the loss (i.e., the etching amount) of the second semiconductor layers 108 of the active region 104N in the second channel-releasing, in accordance with some embodiments.

Although FIGS. 5K-1 through 5L-3 illustrate that the first channel-releasing process is performed before the second channel-releasing process, the embodiments of the method are not limited thereto. In some other embodiments, the first channel-releasing process may be performed after the second channel-releasing process. In addition, in some other embodiments, all of the dummy gate structures 124 may be entirely removed in an etching process before the first and second channel-releasing processes.

Figures 1, 5M:
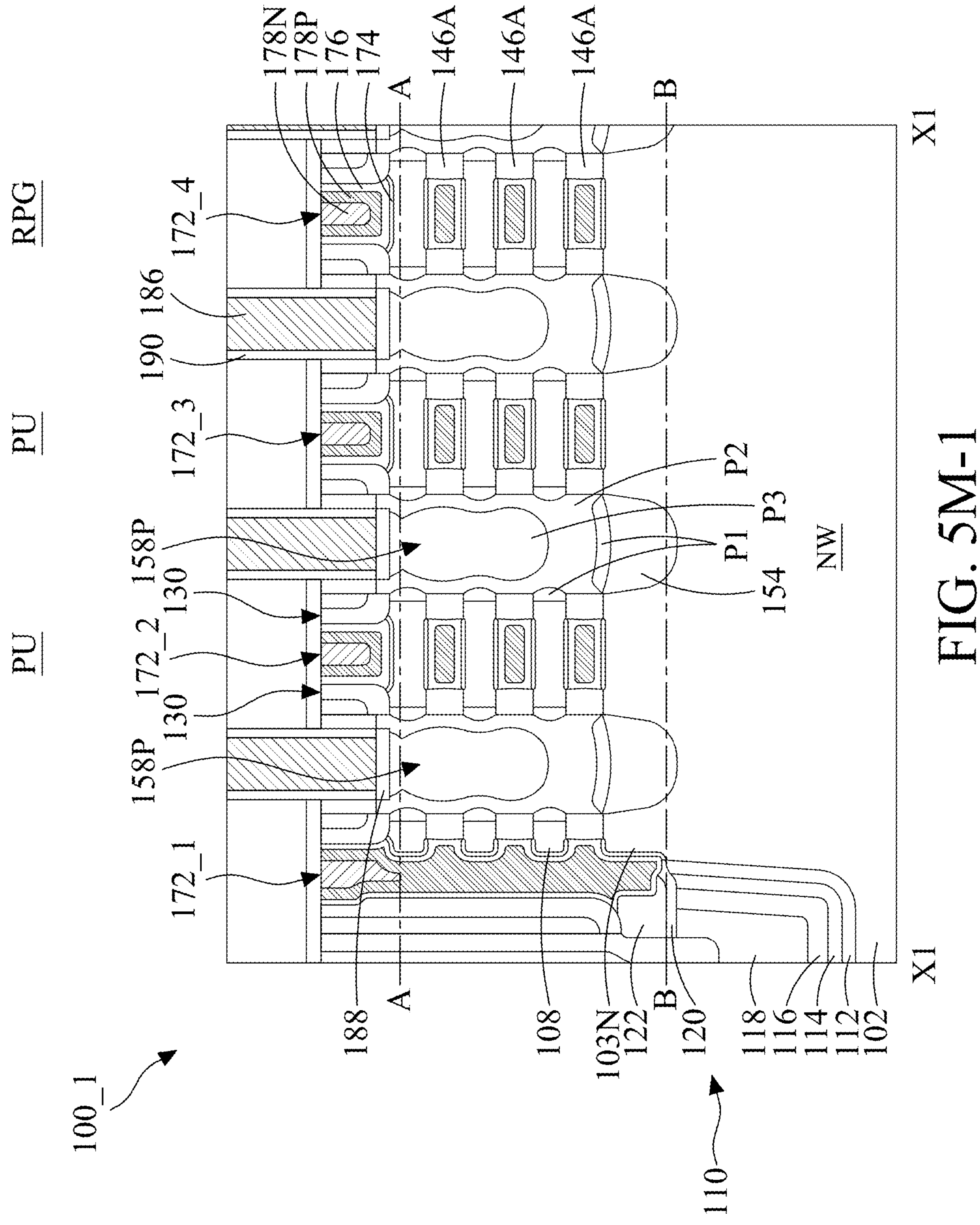
Figures 2, 5M:
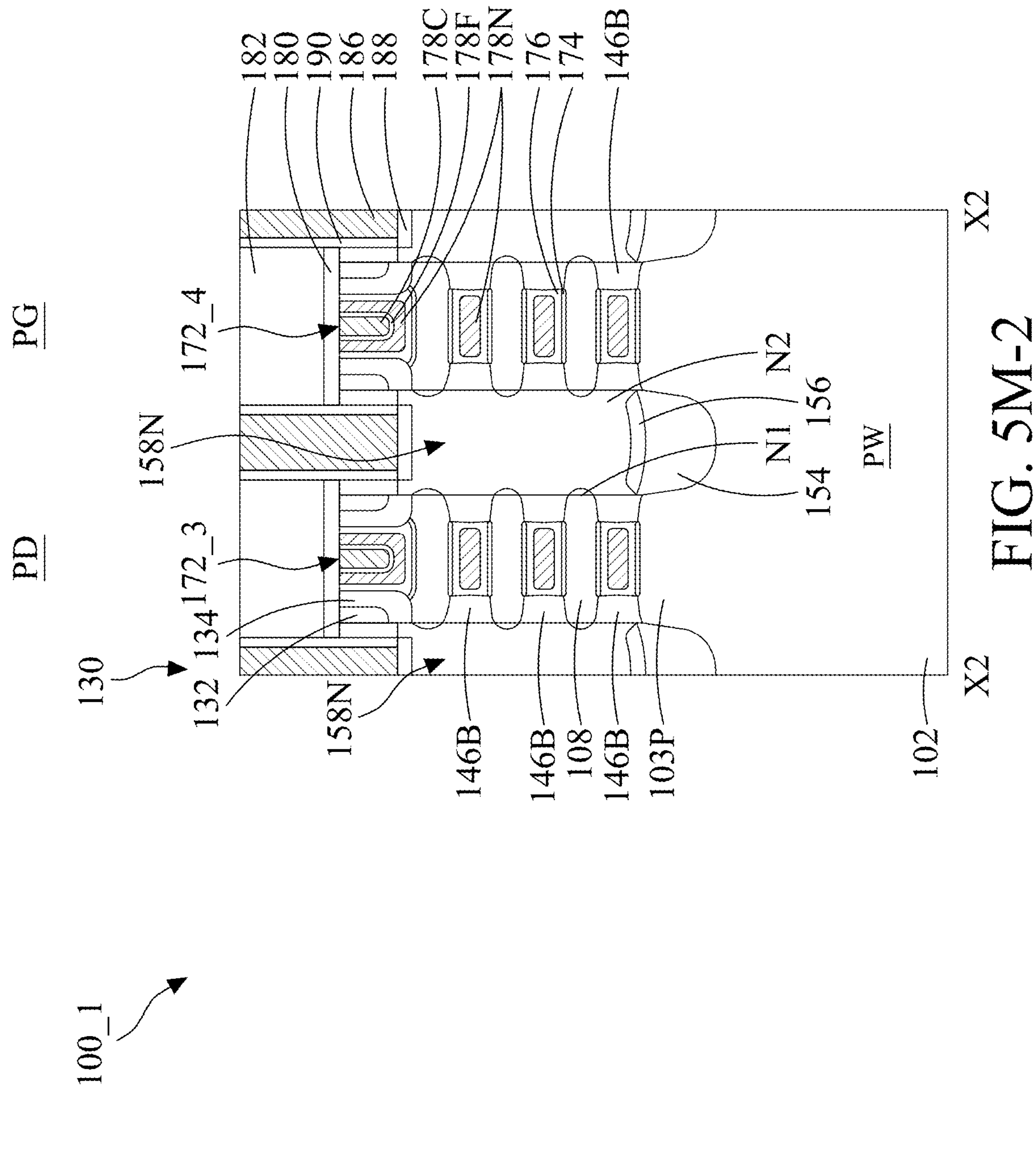
Figures 3, 5M:
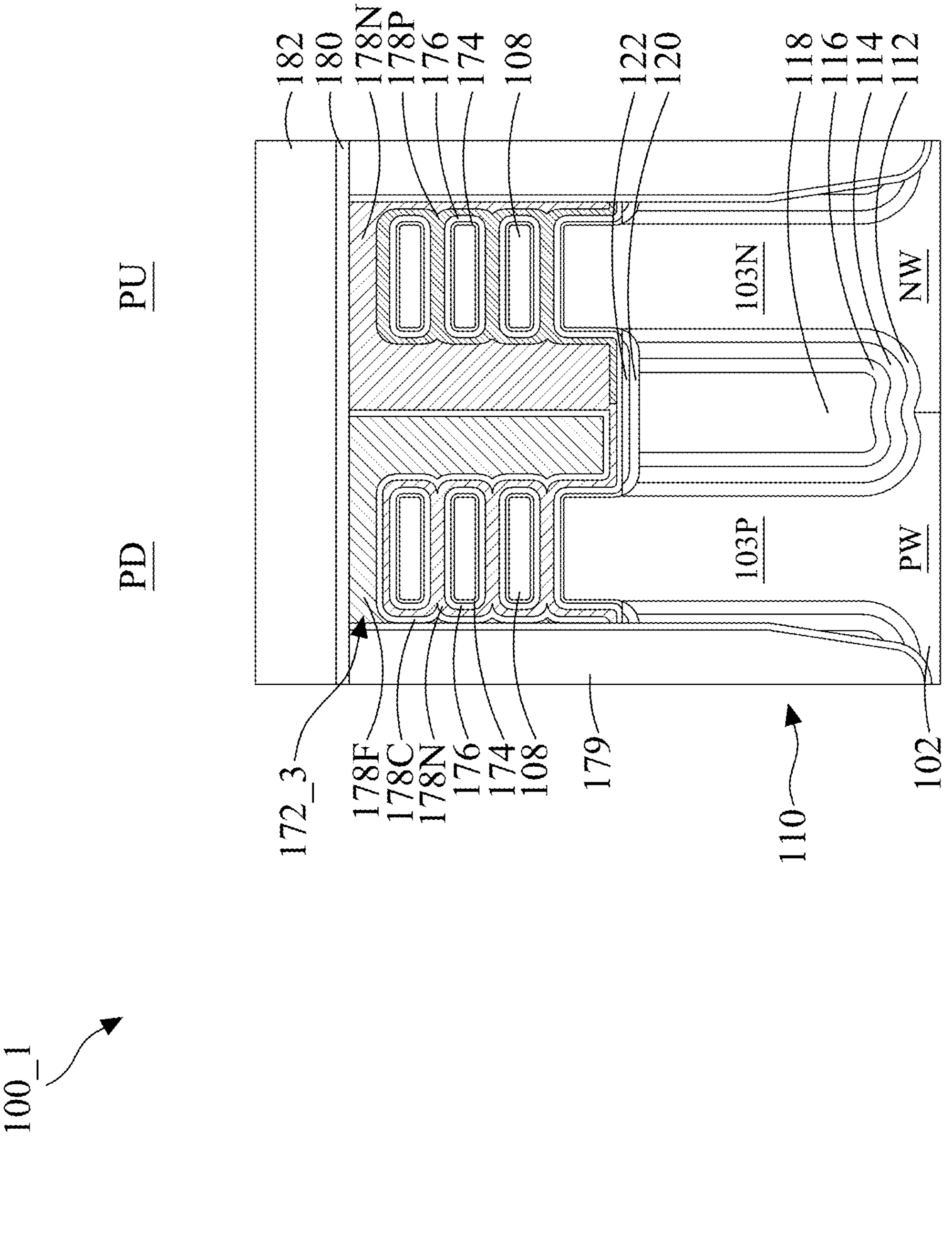
Figures 4, 5M:
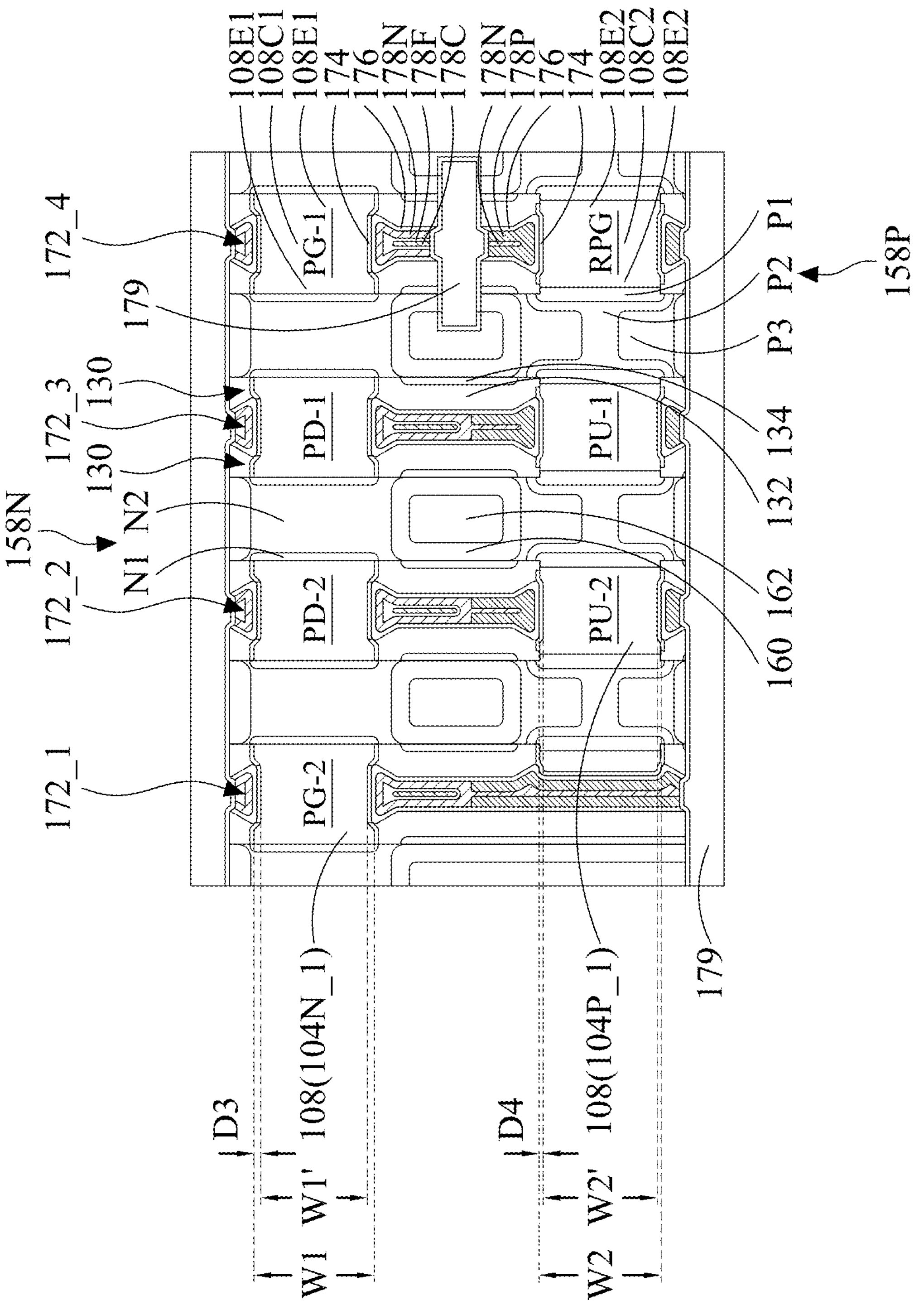
Figures 5, 5M:
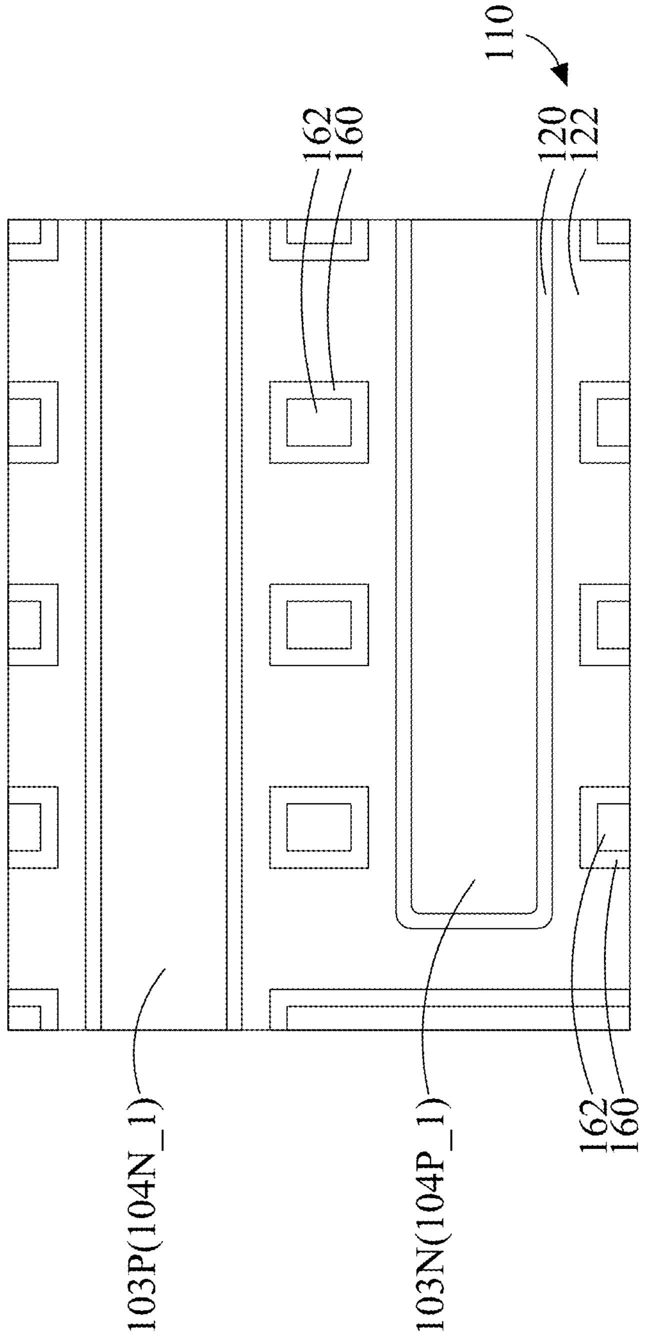

FIGS. 5M-1, 5M-2 and 5M-3 illustrate a semiconductor structure 100_1 after the formation of gate stacks 172, gate-cut features 179, an etching stop layer 180, a second interlayer dielectric layer 182, and contact plugs 186, in accordance with some embodiments. FIG. 5M-4 is a plan view corresponding to plan A-A of FIG. 5M-1. Plan A-A cuts through the nanostructures 108. FIG. 5M-5 is a plan view corresponding to plan B-B of FIG. 5M-1. Plan B-B cuts through the lower fin elements 103N and 103P.

Final gate stacks 172 (including 172_1 to 172_4) are formed to fill the gate trenches 166 and the gaps 168N and 168P, thereby wrapping around the nanostructures 108, as shown in FIGS. 5M-1 to 5M-4, in accordance with some embodiments. In some embodiments, the final gate stacks 172 extend in the Y direction. That is, the final gate stacks 172 have longitudinal axes parallel to the Y direction, in accordance with some embodiments. The final gate stacks 172 engage the channel region so that current can flow between the source/drain regions during operation. In some embodiments, each of the final gate stacks 172 includes an interfacial layer 174, a gate dielectric layer 176 and a metal gate electrode layer (including layers 178N, 178P, 178C and 178F), as shown in FIGS. 5M-1 to 5M-4, in accordance with some embodiments.

In some embodiments, the interfacial layer 174 is made of a chemically formed silicon oxide. In some embodiments, the interfacial layer 174 is formed using one or more cleaning processes such as including ozone (03), ammonia hydroxide-hydrogen peroxide-water mixture, and/or hydrochloric acid-hydrogen peroxide-water mixture. Semiconductor material from the nanostructures 108 and the lower fin elements 103N and 103P is oxidized to form the interfacial layer 174, in accordance with some embodiments.

The gate dielectric layer 176 is formed conformally along the interfacial layer 174, the upper surface of the isolation structure 110, the sidewalls of the gate spacer layers 130, and the sidewalls of the inner spacer layers 146A and 146B, in accordance with some embodiments. The gate dielectric layer 176 is made of a high-k dielectric layer. In some embodiments, the high-k dielectric layer is dielectric material with high dielectric constant (k value), for example, greater than 7.9, such as greater than 13. In some embodiments, the high-k dielectric layer includes hafnium oxide ($HfO_2$), $TiO_2$, HfZrO, $Ta_2O_3$, $HfSiO_4$, $ZrO_2$, $ZrSiO_2$, LaO, $Al_2O_3$, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, (Ba,Sr) $TiO_3$ (BST), $Si_3N_4$, oxynitrides (SiON), a combination thereof, or another suitable material. The high-k dielectric layer may be deposited using ALD, PVD, CVD, and/or another suitable technique.

The metal gate electrode layer is formed to overfill remainders of the gate trenches 166 and the gaps 168N and 168P, in accordance with some embodiments. In some embodiments, the metal gate electrode layer is made of more than one conductive material(s), for example, a p-type work function layer 178P, an n-type work function layer 178N, a metal cap layer 178C, and a metal fill layer 178F, as shown in FIGS. 5M-1 to 5M-4. In some embodiments, the p-type work function layer 178P is formed on the gate dielectric layer 176 in the n-type well NW. In some embodiments, the n-type work function layer 178N is formed on the gate dielectric layer 176 in the p-type well PW and on the p-type work function layer 178P in the n-type well NW. In some embodiments, the work function metal layers 178P and 178N have selected work functions to enhance the device performance (e.g., threshold voltage) for n-channel FETs or p-channel FETs. For example, the p-type work function metal layer 178P is made of TiN, WN, WCN, TaN, Ru, Co, W, or another suitable p-type work function metal, and the n-type work function layer 178N is made of Ti, Ag, Al, TiAl, TiAlN, TiAlC, TaAl, TaC, TaCN, TaSiN, TaAlC, Mn, Zr, or another suitable n-type work function metal.

The metal cap layer 178C is formed on the n-type work function layer 178N, and the metal fill layer 178F is formed on the metal cap layer 178C, in accordance with some embodiments. The metal cap layer 178C may protect the n-type work function layer 178N from being oxidized, and may be made of silicon, titanium, or metal nitride such as TiN or TSN (titanium nitride doped with silicon). The metal fill layer 178F may be made of W, Co, or Ru. These gate electrode materials may be deposited using ALD, PVD, CVD, e-beam evaporation, or another suitable technique.

A planarization process such as CMP may be performed on the semiconductor structure 100_1 to remove the materials of the gate dielectric layer 176 and the metal gate electrode layer formed above the first interlayer dielectric layer 162, in accordance with some embodiments. The final gate stacks 172 that are wrapped around the nanostructures 108 combine with the neighboring source/drain features 158N or 158P to form nanostructure transistors.

The transistors formed on the nanostructures 108 (of the active regions 104N) in the p-type well regions PW are the n-channel nanostructure transistors, e.g., pull-down transistors PD-1 and PD-2 and pass-gate transistors PG-1 and PG-2, in accordance with some embodiments. The transistors formed on the nanostructures 108 (of the active regions 104P) in the n-type well regions NW are the p-channel nanostructure transistors, e.g., pull-up transistors PU-1 and PU-2 and read-port pass-gate transistors RPG, in accordance with some embodiments.

Gate-cut features 179 are formed in and/or through the final gate stacks 172, the gate spacer layers 130, the first interlayer dielectric layer 162 and the contact etching stop layer 160, as shown in FIGS. 5M-3 and 5M-4, in accordance with some embodiments. The gate stacks 172 are cut through by the gate-cut features 179 into several segments which are physically and electrically isolated from each other, in accordance with some embodiments. In some embodiment, two gate-cut features 179 are aligned with (or overlap) the boundaries of the SRAM cell region extending in the X direction. In some embodiment, one gate-cut feature 179 is located within the SRAM cell region, and cuts through the final gate stacks 172_4 between the pass-gate transistors PG-1 and the read-port pass-gate transistor RPG. The gate-cut features 179 may also be referred to as cut metal gate (CMG) pattern. The gate-cut features 179 are made of a dielectric material such as silicon nitride (SiN), silicon oxynitride (SiON), silicon carbon nitride (SiCN), silicon oxycarbonitride (SiOCN), oxygen-doped silicon carbonitride (Si(O)CN), silicon oxide ($SiO_2$), or high-k dielectric material such as LaO, AlO, AlON, ZrO, HfO, ZnO, ZrN, ZrAlO, TiO, TaO, YO, TaCN, or a combination thereof. The formation of the gate-cut features 179 includes patterning the semiconductor structures 100_1 to form gate-cut openings using photolithography and etching processes, depositing a dielectric material to overfill the gate-cut openings, and planarizing the dielectric material using CMP or etching back process.

An etching stop layer 180 and a second interlayer dielectric layer 182 are sequentially formed over the semiconductor structure 100_1, as shown in FIGS. 5M-1 to 5M-3, in accordance with some embodiments. In some embodiments, the etching stop layer 180 is made of dielectric material, such as silicon nitride (SiN), silicon oxide (SiO2), silicon oxynitride (SiON), silicon carbide (SiC), oxygen-doped silicon carbide (SiC:O), oxygen-doped silicon carbonitride (Si(O)CN), or a combination thereof. In some embodiments, the second interlayer dielectric layer 182 is made of dielectric material, such as USG, BPSG, FSG, PSG, BSG, and/or another suitable dielectric material. In some embodiments, the etching stop layer 180 and the second interlayer dielectric layer 182 are deposited using CVD (such as HDP-CVD, PECVD, HARP or FCVD), another suitable technique, or a combination thereof.

The contact plugs 186 are formed through the second interlayer dielectric layer 182, the etching stop layer 180, the first interlayer dielectric layer 162 and the contact etching stop layer 160, as shown in FIGS. 5M-1, 5M-2 and 5M-4, in accordance with some embodiments. The contact plugs 186 land on the source/drain features 158N/158P, in accordance with some embodiments. In some embodiments, the formation of the contact plugs 186 includes patterning the semiconductor structure 100_1 to form contact openings using photolithography and etching processes until the source/drain features 158N/158P are exposed. The etch process may include dry etching such as RIE, NBE, ICP etch, CCP etch, another suitable method, or a combination thereof.

Silicide layers 188 are formed on the exposed surfaces of the source/drain features 158N and 158P, in accordance with some embodiments. In some embodiments, the silicide layers 188 are made of WSi, NiSi, TiSi and/or CoSi. In some embodiments, the formation of the silicide layers 188 includes depositing a metal material followed by one or more annealing processes. The semiconductive material (e.g., Si) from the source/drain features 158N and 158P reacts with the metal material to form the silicide layers 188, in accordance with some embodiments. Unreacted metal material is then removed, e.g., using wet etching.

Contact liners 190 are formed along the sidewalls of the contact openings using a deposition process and an etching back process, in accordance with some embodiments. In some embodiments, the contact liners 190 are made of an insulating material such as a dielectric material (e.g., SiC, LaO, AlO, AlON, ZrO, HfO, SiN, ZnO, ZrN, ZrAlO, TiO, TaO, YO, TaCN, ZrSi, SiOCN, SiOC, SiCN, SiN, HfSi, or SiO); or undoped silicon (Si). Afterward, one or more conductive materials for the contact plugs 186 are deposited to overfill the contact openings, in accordance with some embodiments. In some embodiments, one or more conductive materials are deposited using CVD, PVD, e-beam evaporation, ALD, ECP, ELD, another suitable method, or a combination thereof to overfill the contact openings. The one or more conductive materials over the second interlayer dielectric layer 182 are planarized using, for example, CMP.

The contact plugs 186 may have a multilayer structure. For example, a barrier/adhesive layer (not shown) may optionally be deposited along the sidewalls and the bottom surfaces of the contact openings. The barrier/adhesive layer may be made of tantalum (Ta), tantalum nitride (TaN), titanium (Ti), titanium nitride (TiN), cobalt tungsten (CoW), another suitable material, or a combination thereof. A metal bulk layer is then deposited on the barrier/adhesive layer (if formed) to fill the remainder of the contact openings. In some embodiments, the metal bulk layer is made of one or more conductive materials with low resistance and good gap-fill ability, for example, cobalt (Co), nickel (Ni), tungsten (W), titanium (Ti), tantalum (Ta), copper (Cu), rhodium (Rh), iridium (Ir), platinum (Pt), aluminum (Al), ruthenium (Ru), molybdenum (Mo), another suitable metal material, or a combination thereof.

Each of the nanostructures 108 of the pass-gate transistors PG-1 and PG-2 and the pull-down transistors PD-1 and PD-2 includes a center portion 108C1 surrounded by the gate stack 172 and edge portions 108E1 surrounded by the gate spacer layers 130, as shown in FIG. 5M-4, in accordance with some embodiments. In some embodiments, the center portion 108C1 has a width W1', and the edge portion 108E1 has the width W1. In some embodiments, the width W1 is greater than the width W1', e.g., by a dimension D3 of about 2-5 nm, because of the loss of the nanostructures 108 in the second channel-releasing process and during forming the interfacial layer 174. In some embodiments, the ratio (W1/W1') of the width W1 to the width W1' is in a range from about 1.05 to 1.5. In some embodiments, each of the nanostructures 108 of pass-gate transistors PG-1 and PG-2 and the pull-down transistors PD-1 and PD-2 has a biconcave profile, as shown in FIG. 5M-4.

Each of the nanostructures 108 of the pull-up transistors PU-1 and PU-2 and the read-port pass-gate transistor RPG includes a center portion 108C2 surrounded by the gate stack 172 and edge portions 108E2 surrounded by the gate spacer layers 130, as shown in FIG. 5M-4, in accordance with some embodiments. In some embodiments, the center portion 108C2 has a width W2', and the edge portion 108E2 has the width W2. In some embodiments, the width W2 is greater than the width W2', e.g., by a dimension D4 of about 0-2.5 nm, because of the loss of the nanostructures 108 in the first channel-releasing process and during forming the interfacial layer 174. In some embodiments, the dimension D3 is greater than the dimension D4 because the etching selectivity between the dielectric layers 142I and the second semiconductor layers 108 is greater than the etching selectivity between the first semiconductor layers 106 and the second semiconductor layers 108. In some other embodiments, the width W2 is equal to the width W2'. In some embodiments, the ratio (W2/W2') of the width W2 to the width W2' is in a range from about 1 to 1.05, and less than the ratio (W1/W1'). In some embodiments, the width W1' is less than the W2'.

In accordance with the embodiments of the present disclosure, the DOI process is applied to the formation of the p-channel nanostructure transistors (i.e., pull-up transistors and read-port pass-gate transistors) before the formation of source/drain features. Without increasing the cell height of the SRAM cell, the p-channel nanostructure transistors may have a greater effective channel width (i.e., W2') while preventing the increase in the risk of source/drain merging, and thus the saturation current ("Idsat") of the pull-up transistors and read-port pass-gate transistors may increase, e.g., by 20-50%. Therefore, the performance (e.g., operation speed) of the resulting SRAM device may be enhanced by 15-20% improvement in read current, and/or 50-80 mV improvement in the operation voltage (e.g., Vmax).

Figure 5O:
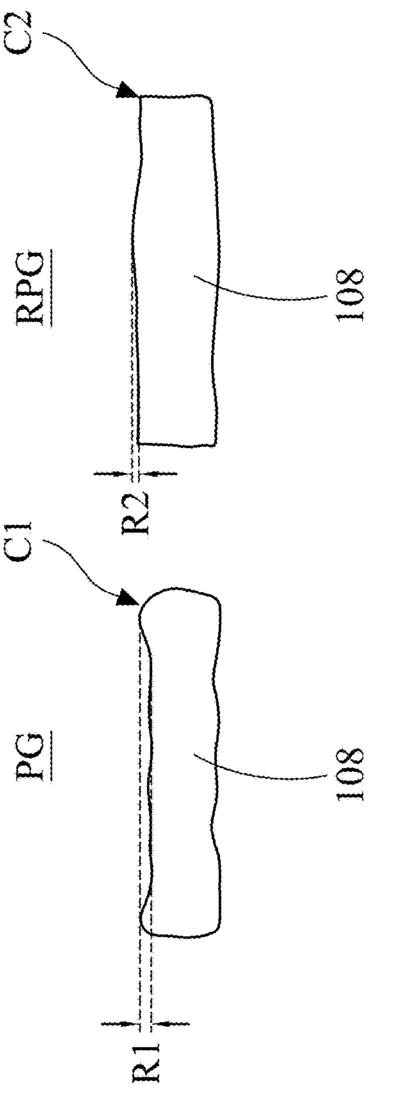
FIG. 5O is a cross-sectional view illustrating the nanostructures of the pass-gate transistor and the read-port pass-gate transistor, in accordance with some embodiments of the disclosure.
Figure 5N:
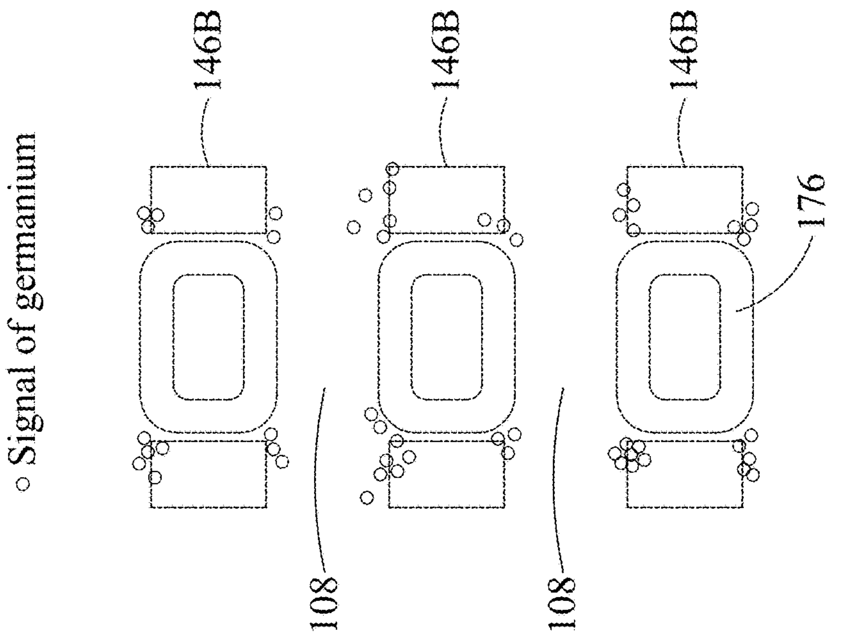
FIG. 5N is a schematic view illustrating an experimental result to exhibit the distribution of the germanium of the pull-down transistor, in accordance with some embodiments of the disclosure.

FIG. 5N is a schematic view illustrating an experimental result to exhibit the distribution of the germanium of the pull-down transistor PD, in accordance with some embodiments of the disclosure. The experimental result is analyzed and the signal is detected by energy-dispersive X-ray spectroscopy (EDX) mapping. An intermixing of the first semiconductor layers 106 (e.g., SiGe) and the second semiconductor layers 108 (e.g., Si) may occur at the interfaces therebetween when the semiconductor structure is subjected to several thermal processes (e.g., the anneal process of the source/drain features, and/or deposition processes). As a result, the Ge residuals may be piled up on the surface of the inner spacer layers 146B of the pull-down transistor PD, as shown in FIG. 5N, in accordance with some embodiments of the disclosure.

Because of the DOI process that is applied to the p-channel nanostructure transistors (i.e., pull-up transistors and read-port pass-gate transistor), the first semiconductor layers 106 are removed before the formation of source/drain features, Ge residuals are less piled up on the surface of the inner spacer layers 146A of the pull-up transistors PU and the read-port pass-gate transistor RPG. Therefore, in some embodiments, the germanium concentration of the inner spacer layers 146A of the pull-up transistor PU and the read-port pass-gate transistor RPG is lower than the germanium concentration of the inner spacer layers 146B of the pull-down transistor PD and the pass-gate transistor PG.

FIG. 5O is a cross-sectional view illustrating the nanostructures 108 of the pass-gate transistor PG and the read-port pass-gate transistor RPG, in accordance with some embodiments of the disclosure. Because the etching selectivity between the dielectric layers 142I and the second semiconductor layers 108 is much greater than the etching selectivity between the first semiconductor layers 106 and the second semiconductor layers 108, the main surfaces of the nanostructures 108 of the pass-gate transistor PG may have a greater roughness than the roughness of the main surfaces of the nanostructures 108 of the read-port pass-gate transistor RPG, in accordance with some embodiments. For example, the distance R1 between the top and bottom points of the top surface of the nanostructure 108 of the pass-gate transistor PG is greater than the distance R2 between the top and bottom points of the top surface of the nanostructure 108 of the read-port pass-gate transistor RPG. In addition, in some embodiments, the nanostructure 108 of the pass-gate transistor PG has a round corner C1 between adjacent main surfaces, while the nanostructure 108 of the read-port pass-gate transistor RPG has a sharp corner C2 between adjacent main surfaces. Although not shown, the nanostructures 108 of the pull-up transistor PU may have main surfaces with low roughness and sharp corners, while the nanostructures 108 of the pull-down transistor PD may have main surfaces with greater roughness and round corners.

The semiconductor structure 100_1 may undergo further frontside BEOL processes to form various interconnection conductive features (not shown) over the semiconductor structure 100_1, such as metal layers and vias between neighboring two metal layers.

FIGS. 6A-1 through 6F-2 are cross-sectional views illustrating the formation of a semiconductor structure 100_2 of SRAM cells of FIG. 4 at various intermediate stages, in accordance with some embodiments. The embodiments of FIGS. 6A-1 through 6F-2 are similar to the embodiments of FIGS. 5A-1 through 5M-3 except that the formation of the read-port pass-gate transistor RPG does not include the DOI process. FIGS. 6A-1, 6B, 6C-1, 6D-1, 6E-1 and 6F-1 correspond to cross-section X1-X1, FIGS. 6A-2, 6C-2, 6D-2, 6E-2 and 6F-2 correspond to cross-section X2-X2, in accordance with some embodiments.

Figures 1, 6A:
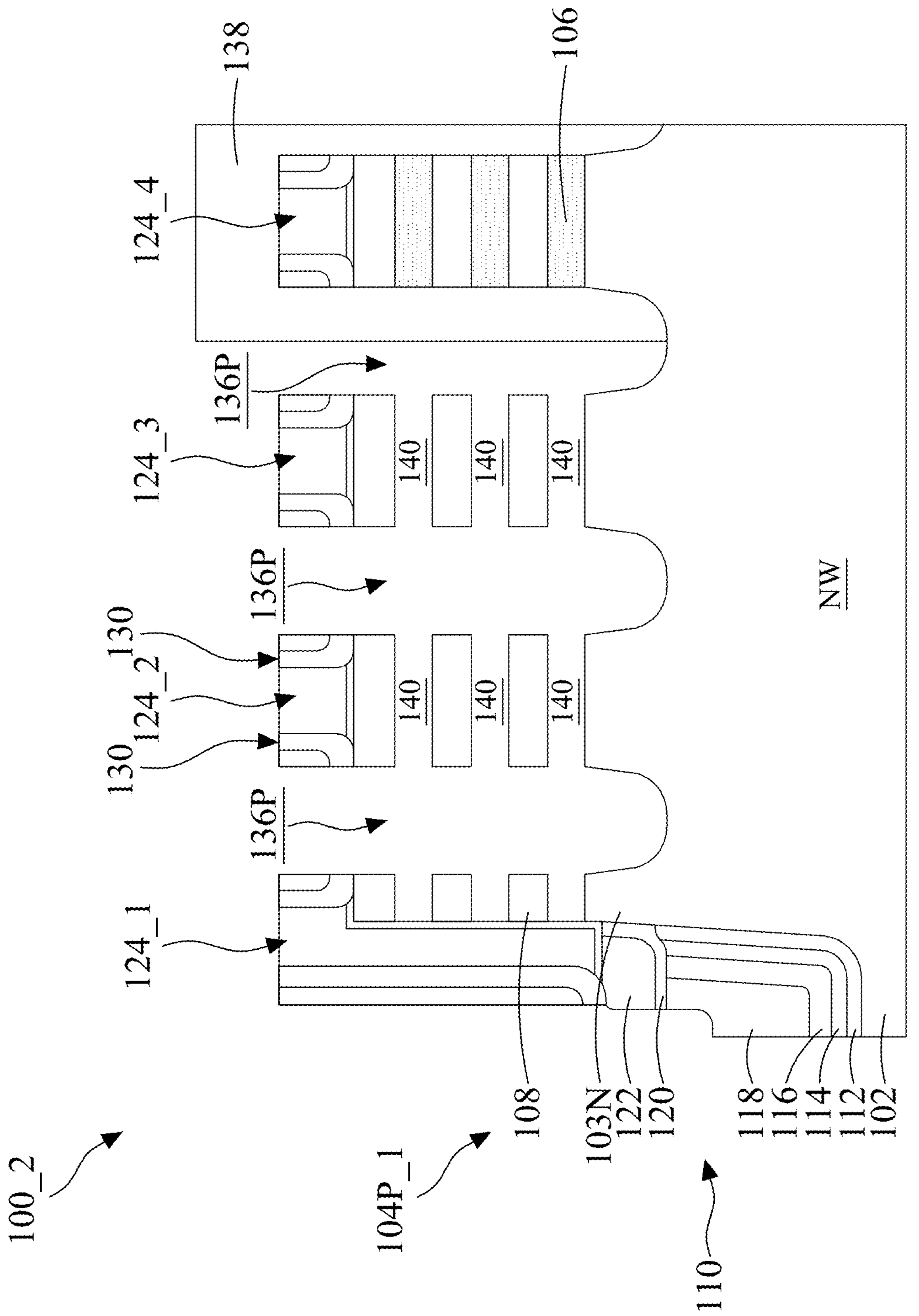
Figures 2, 6A:
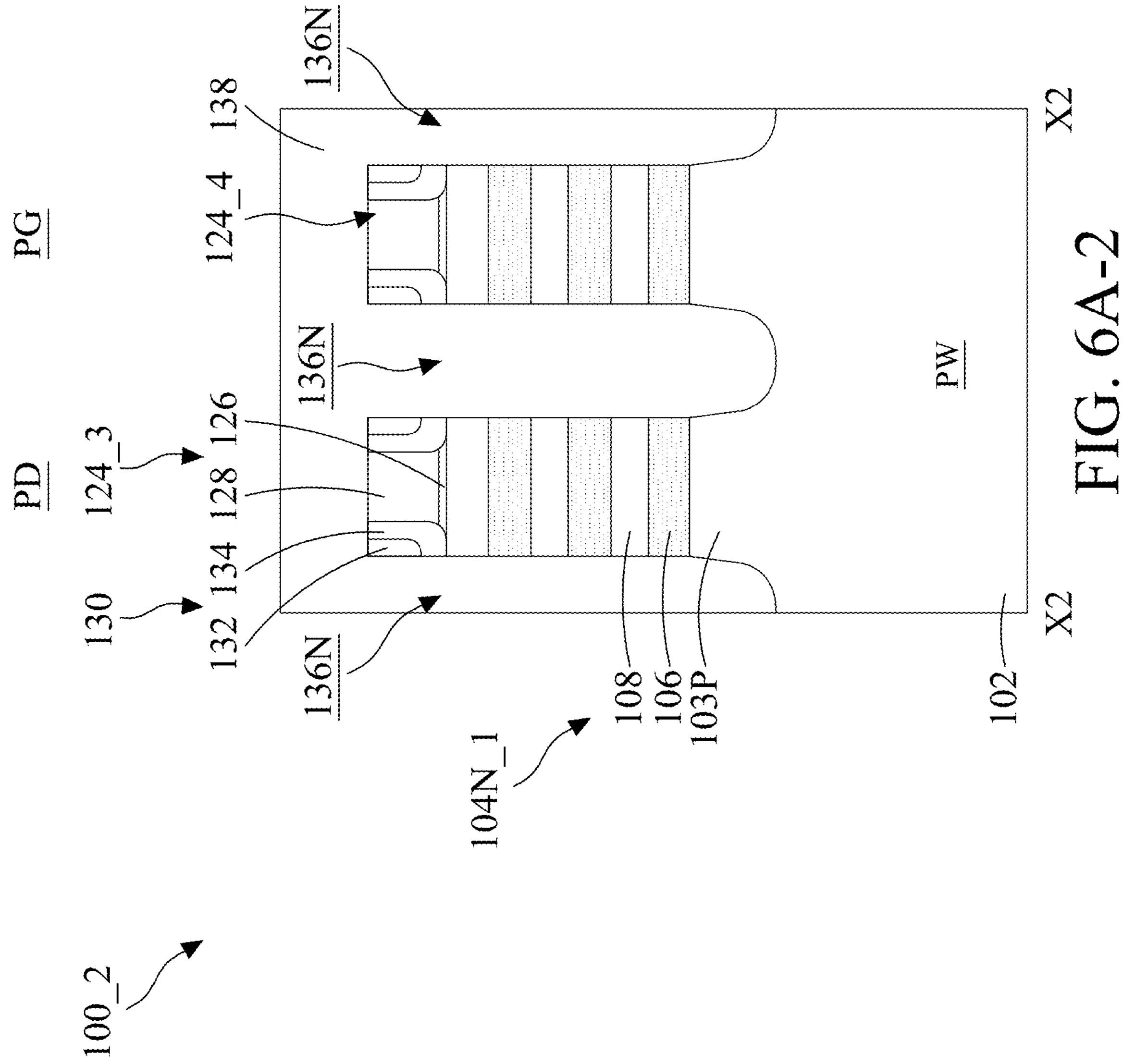

FIGS. 6A-1 and 6A-2 illustrate a semiconductor structure 100_2 after the removal of the first semiconductor layers 106, in accordance with some embodiments. Continuing from FIGS. 5B-1 to 5B-3, a patterned mask layer 138 is formed to cover the active region 104N (or the p-type well PW) and a first portion of the active region 104P (or the n-type well NW) where the read-port pass-gate transistor RPG is to be formed, as shown in FIGS. 6A-1 and 6A-2, in accordance with some embodiments. A second portion of the active region 104P (or the n-type well NW) where the pull-up transistor PU is to be formed is exposed from the patterned mask layer 138, in accordance with some embodiments. An etching process is performed using the patterned mask layer 138 to remove the first semiconductor layers 106 of the second portion of the active regions 104P, thereby forming gaps 140, in accordance with some embodiments.

Figure 6B:
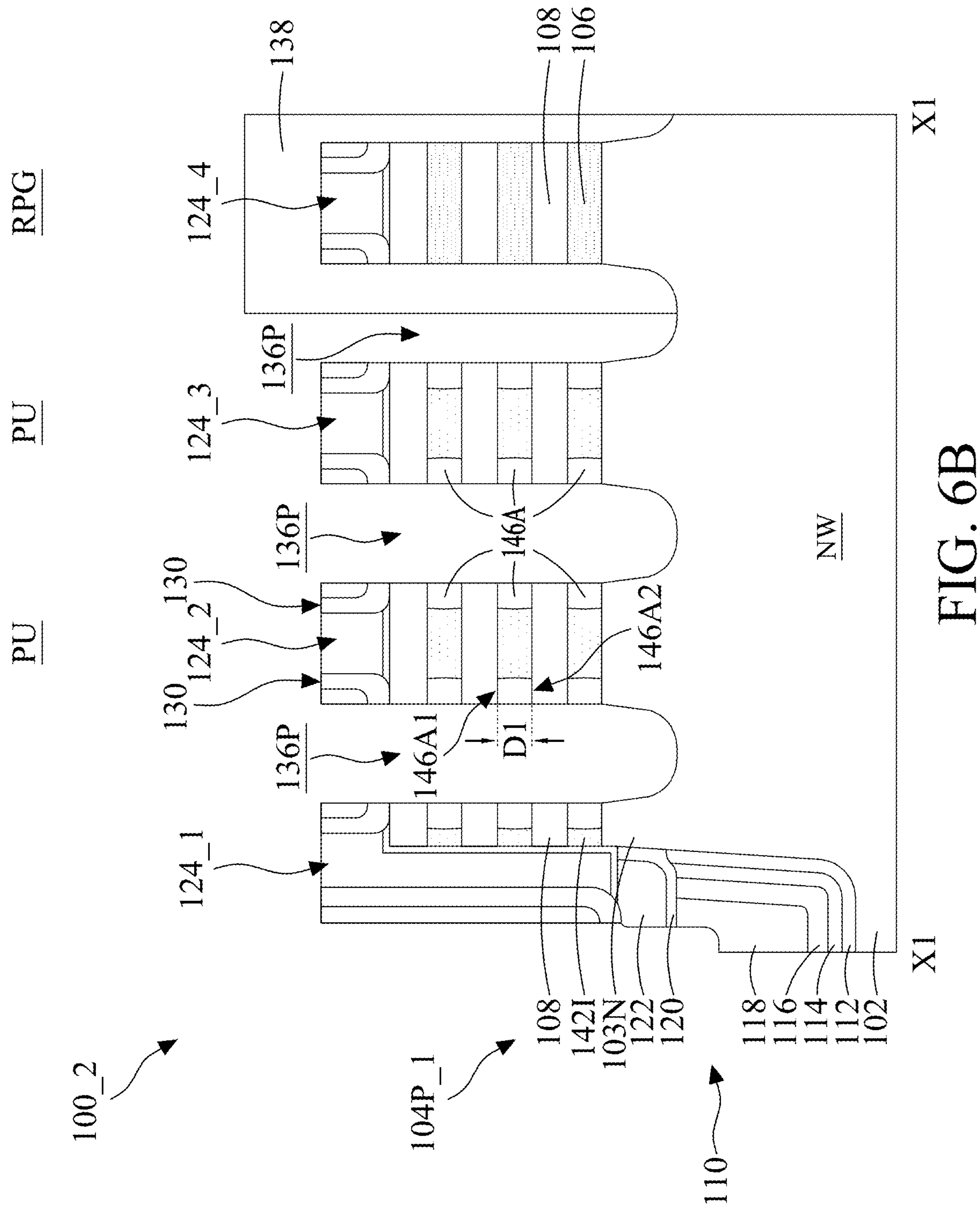
FIG. 6B are cross-sectional views illustrating the formation of a semiconductor structure of SRAM cells at one of the intermediate stages corresponding to line X2-X2 of FIG. 4, in accordance with some embodiments of the disclosure.

FIG. 6B illustrates a semiconductor structure 100_2 after the replacement of the first semiconductor layers 106 with dielectric layers 142I and the formation of inner spacer layers 146A, in accordance with some embodiments. The steps described above in FIGS. 5D to 5F are performed, thereby forming the dielectric layers 142I in the gaps 140, and forming the inner spacer layers 146A, as shown in FIG. 6B, in accordance with some embodiments. The patterned mask layer 138 is then removed, in accordance with some embodiments.

Figures 1, 6C:
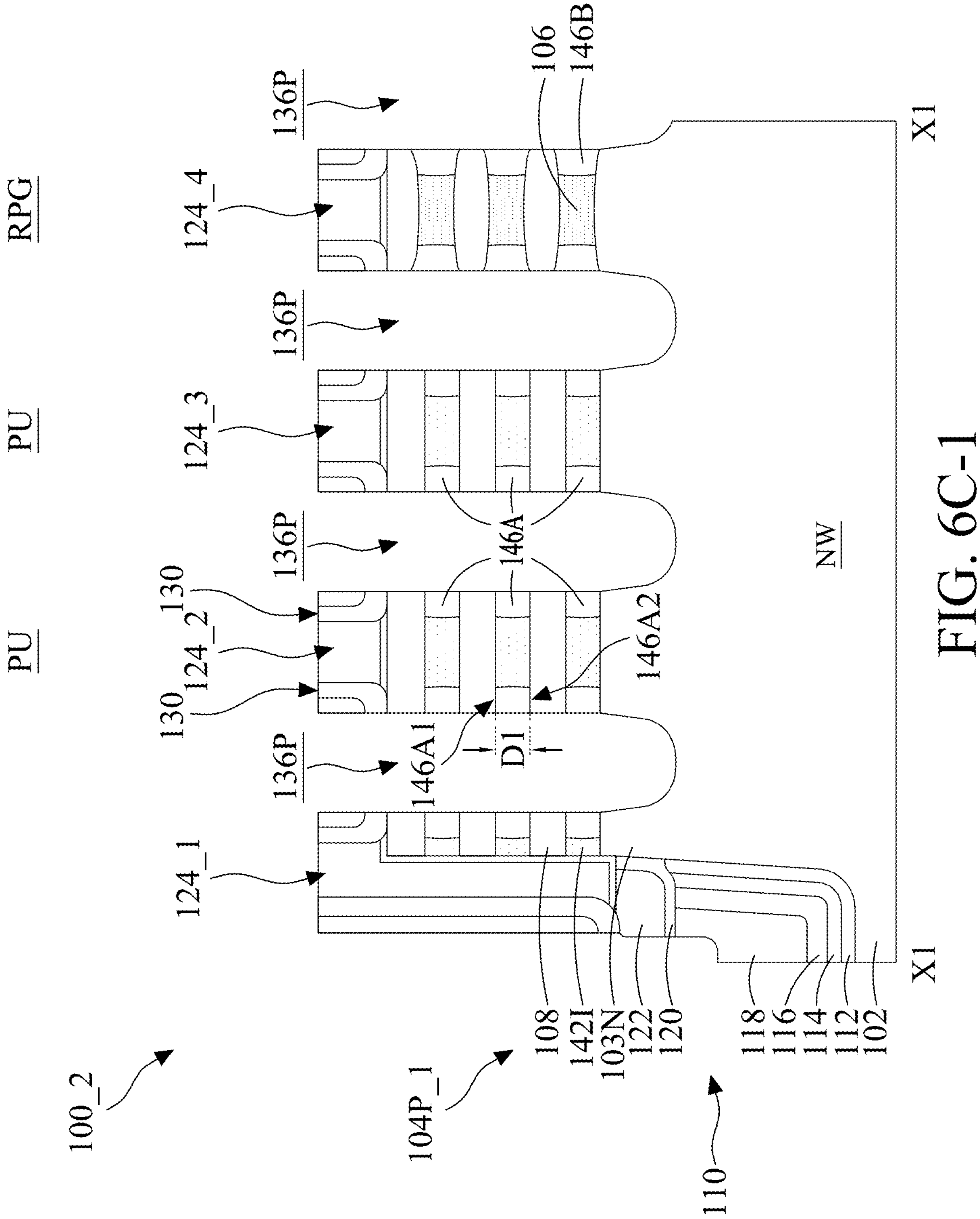
Figures 2, 6C:
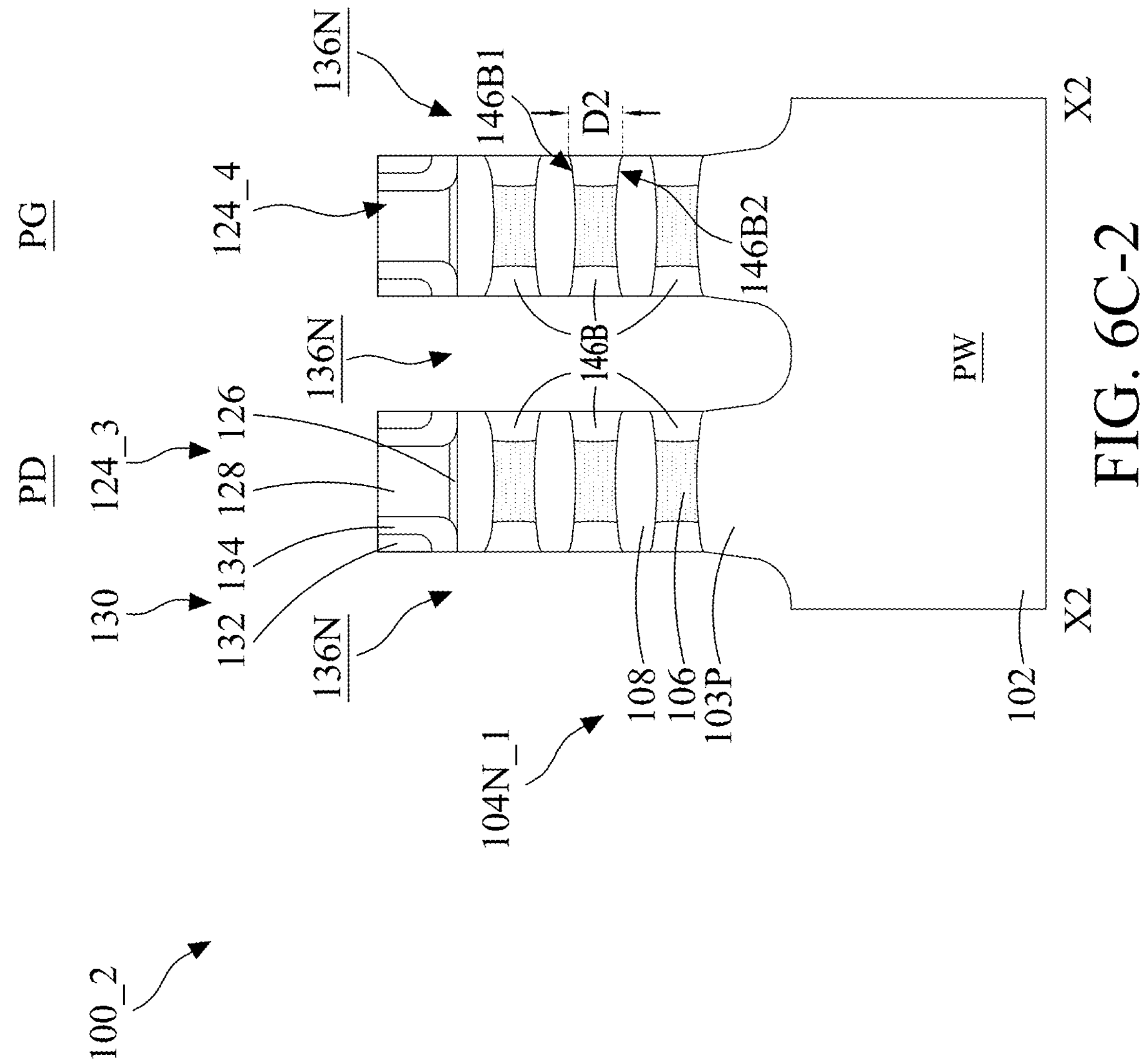

FIGS. 6C-1 and 6C-2 illustrate a semiconductor structure 100_2 after the formation of inner spacer layers 146B, in accordance with some embodiments. A patterned mask layer (not shown) is formed to cover the second portion of the active region 104P (or the n-type well NW) where the pull-up transistor PU is to be formed, in accordance with some embodiments. The active region 104N (or the p-type well PW) and the first portion of the active region 104P (or the n-type well NW) where the read-port pass-gate transistor RPG is to be form are exposed from the patterned mask layer, in accordance with some embodiments. The steps described above in FIGS. 5H to 5I are performed, thereby forming the inner spacer layers 146B, as shown in FIGS. 6C-1 and 6C-2, in accordance with some embodiments. The patterned mask layer is then removed, in accordance with some embodiments.

Figures 1, 6D:
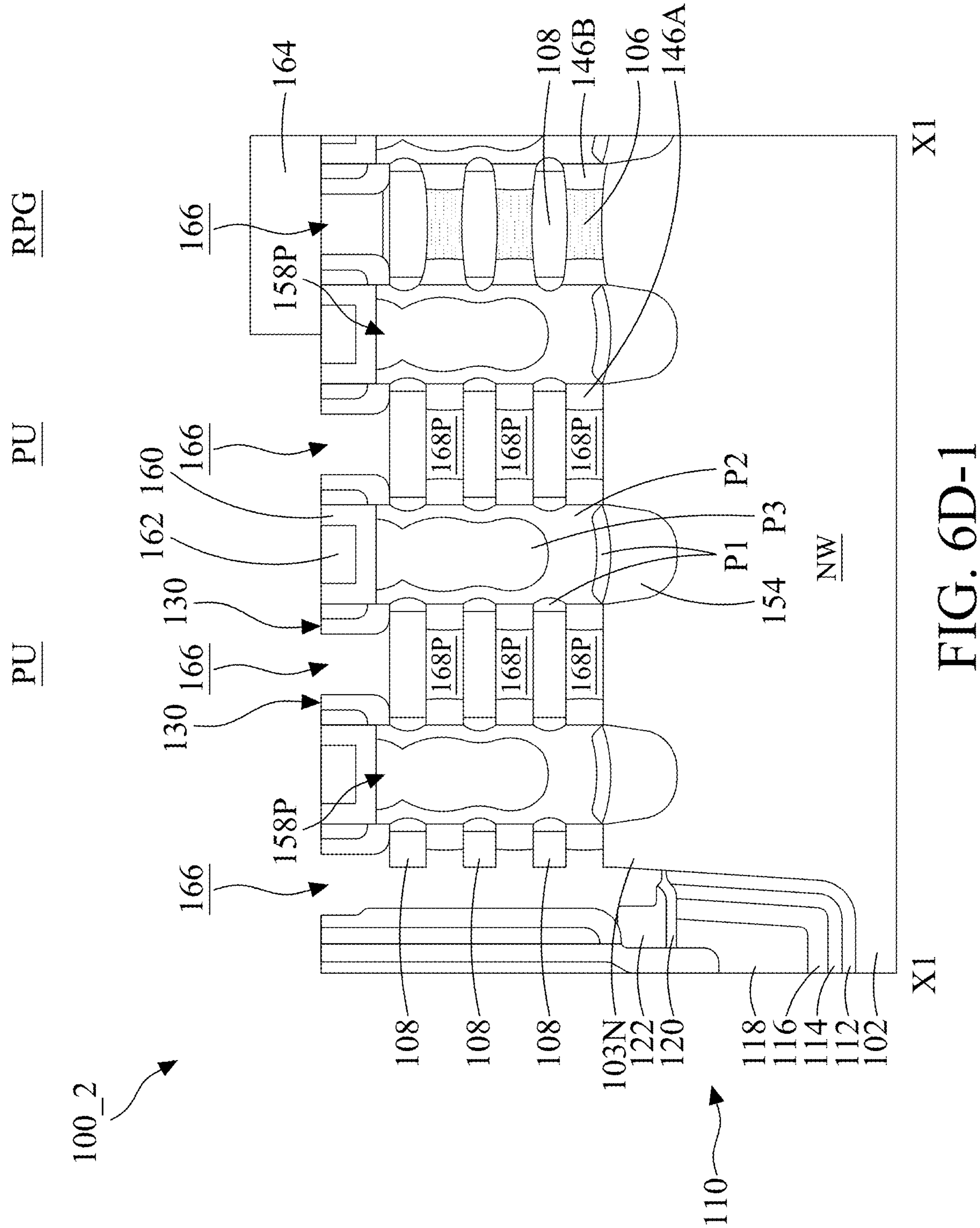
Figures 2, 6D:
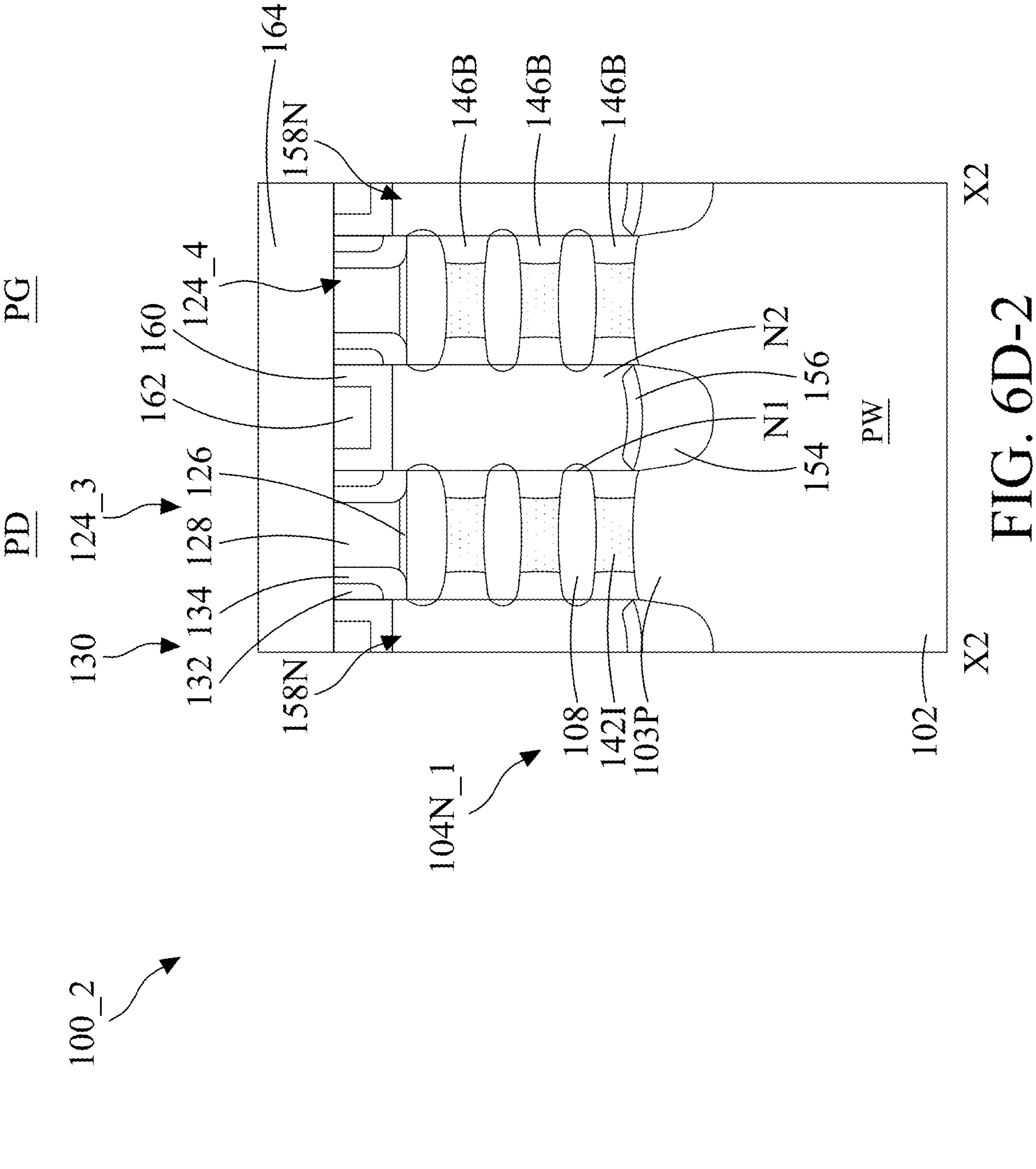

FIGS. 6D-1 and 6D-2 illustrate a semiconductor structure 100_2 after a first channel-releasing process, in accordance with some embodiments. The steps described above in FIGS. 5J-1 and 5J-2 are performed, thereby forming the source/drain features 158N and 158P, the contact etching stop layer 160 and the first interlayer dielectric layer 162, as shown in FIGS. 6D-1 and 6D-2, in accordance with some embodiments.

A patterned mask layer 164 is formed to cover the active regions 104N (or the p-type well PW) and the first portion of the active region 104P (or the n-type well NW) where the read-port pass-gate transistor RPG is to be formed, as shown in FIGS. 6D-1 and 6D-2, in accordance with some embodiments. The second portion of the active region 104P (or the n-type well NW) where the pull-up transistor PU is to be formed is exposed from the patterned mask layer 164, in accordance with some embodiments.

The portion of the dummy gate structures 124 uncovered by the patterned mask layer 164 is removed using one or more etching processes to form gate trenches 166, in accordance with some embodiments. The dielectric layers 142I of the second portion of the active regions 104P are removed using an etching process to form gaps 168P, in accordance with some embodiments. Afterward, the patterned mask layer 164 is removed, in accordance with some embodiments.

Figures 1, 6E:
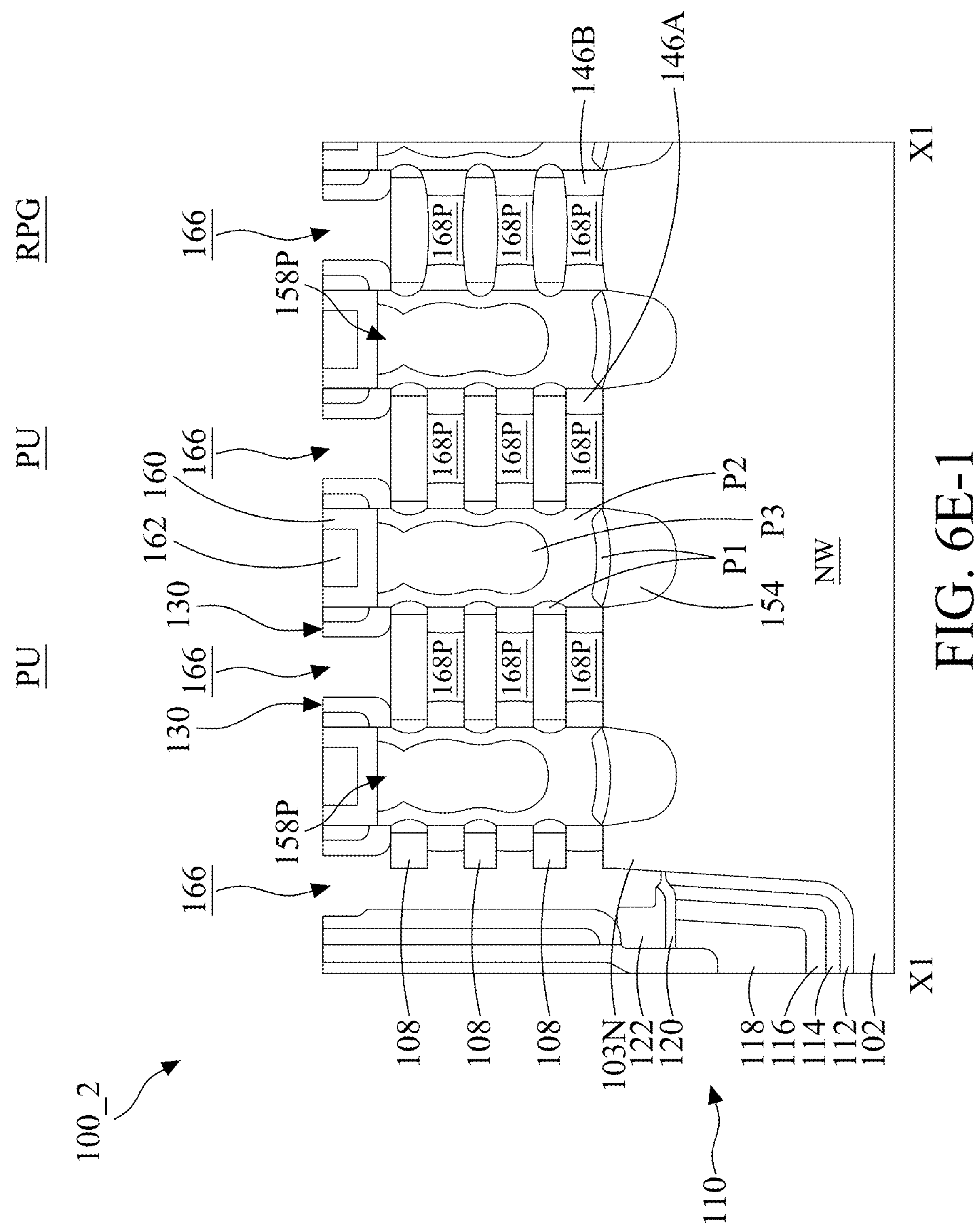
Figures 2, 6E:
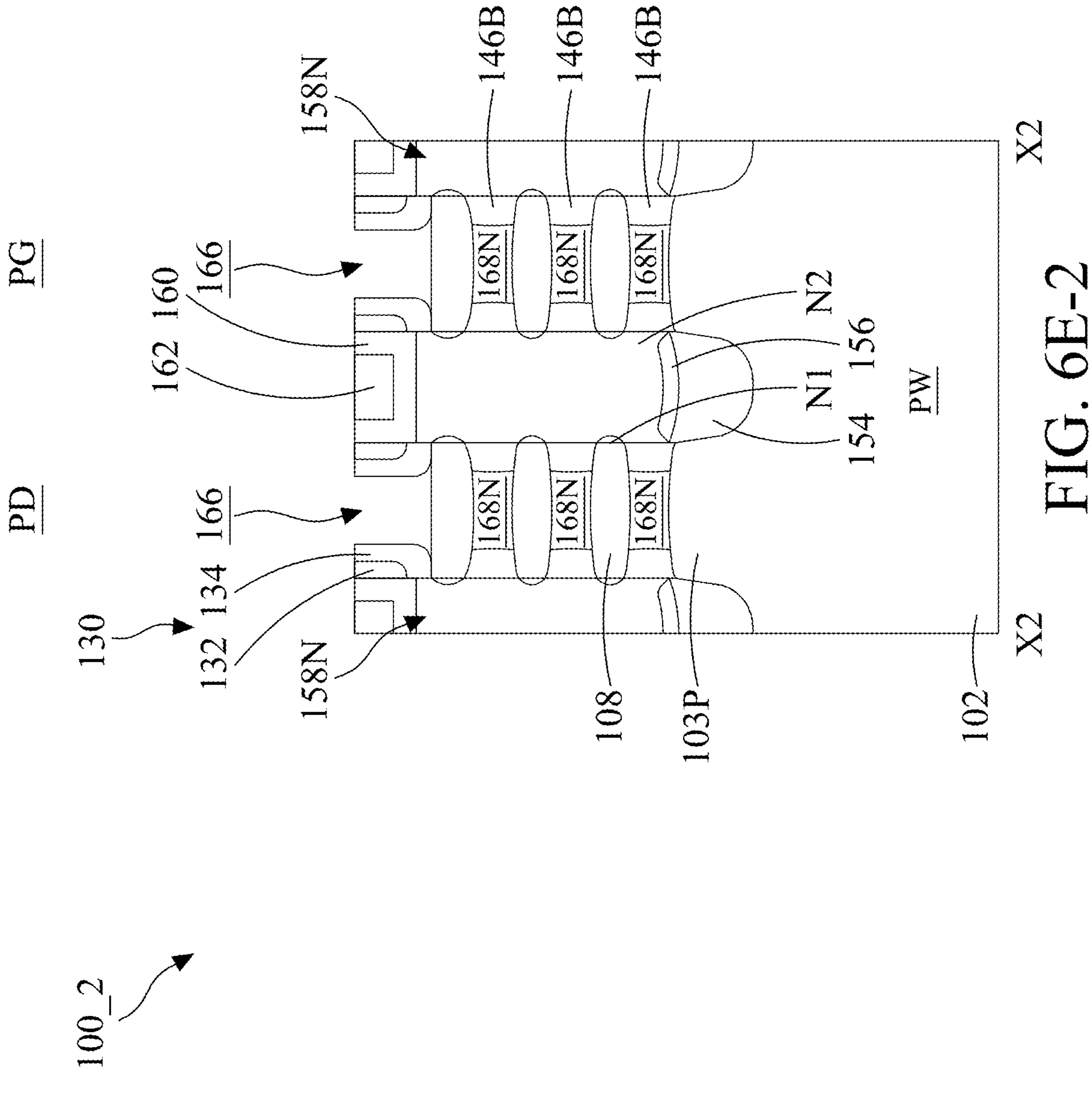

FIGS. 6E-1 and 6E-2 illustrate a semiconductor structure 100_2 after a second channel-releasing process, in accordance with some embodiments. A patterned mask layer (not shown) is formed to cover the second portion of the active region 104P, in accordance with some embodiments. The active regions 104N (or the p-type well PW) and the first portion of the active region 104P (or the n-type well NW) are exposed from the patterned mask layer, in accordance with some embodiments.

The portion of the dummy gate structures 124 uncovered by the patterned mask layer is removed using one or more etching processes to form gate trenches 166, in accordance with some embodiments. The first semiconductor layers 106 of the active regions 104N and the first semiconductor layers 106 of the first portion of the active regions 104P are removed using an etching process to form gaps 168N and 168P, in accordance with some embodiments. Afterward, the patterned mask layer is removed, in accordance with some embodiments.

Figures 1, 6F:
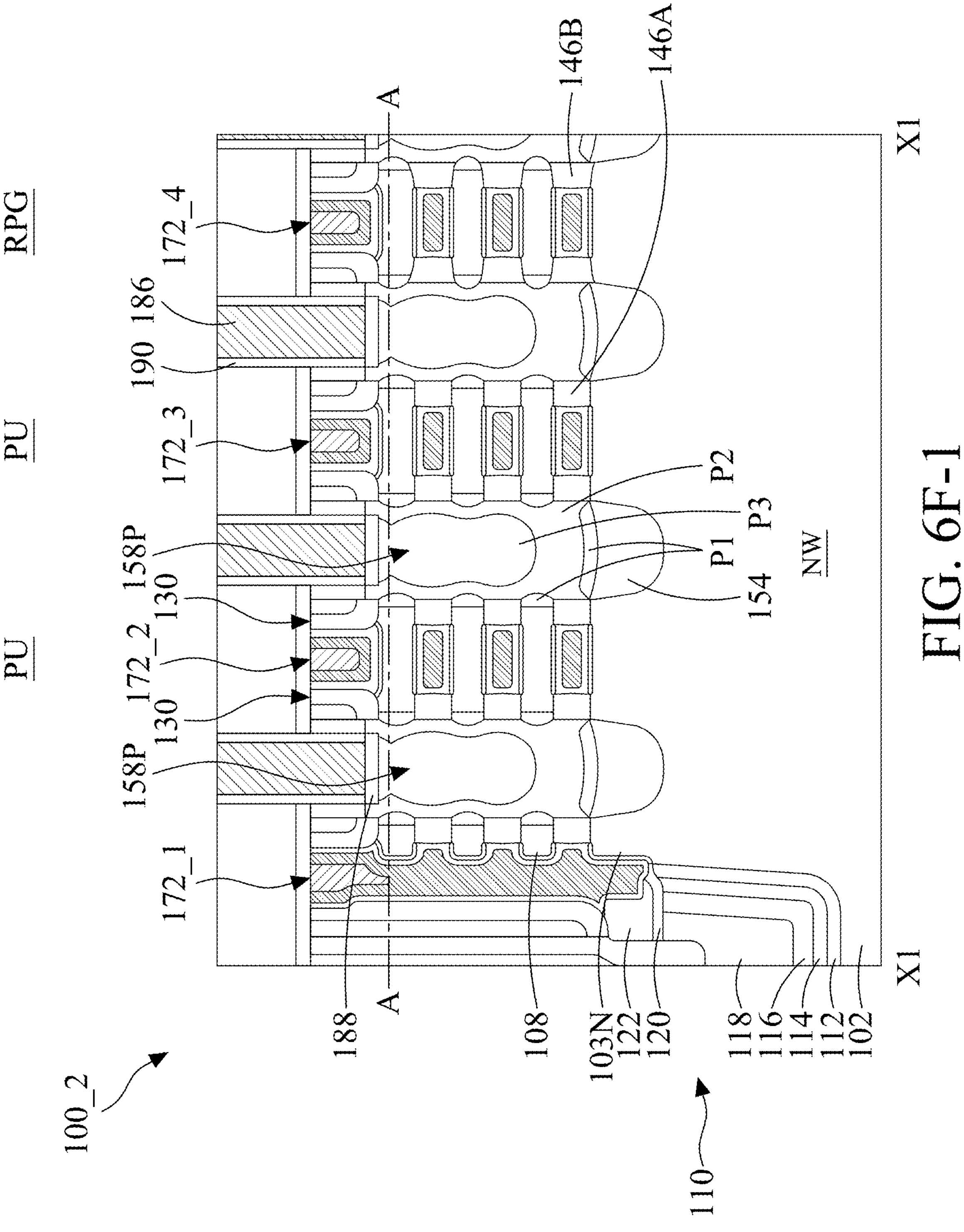
Figures 2, 6F:
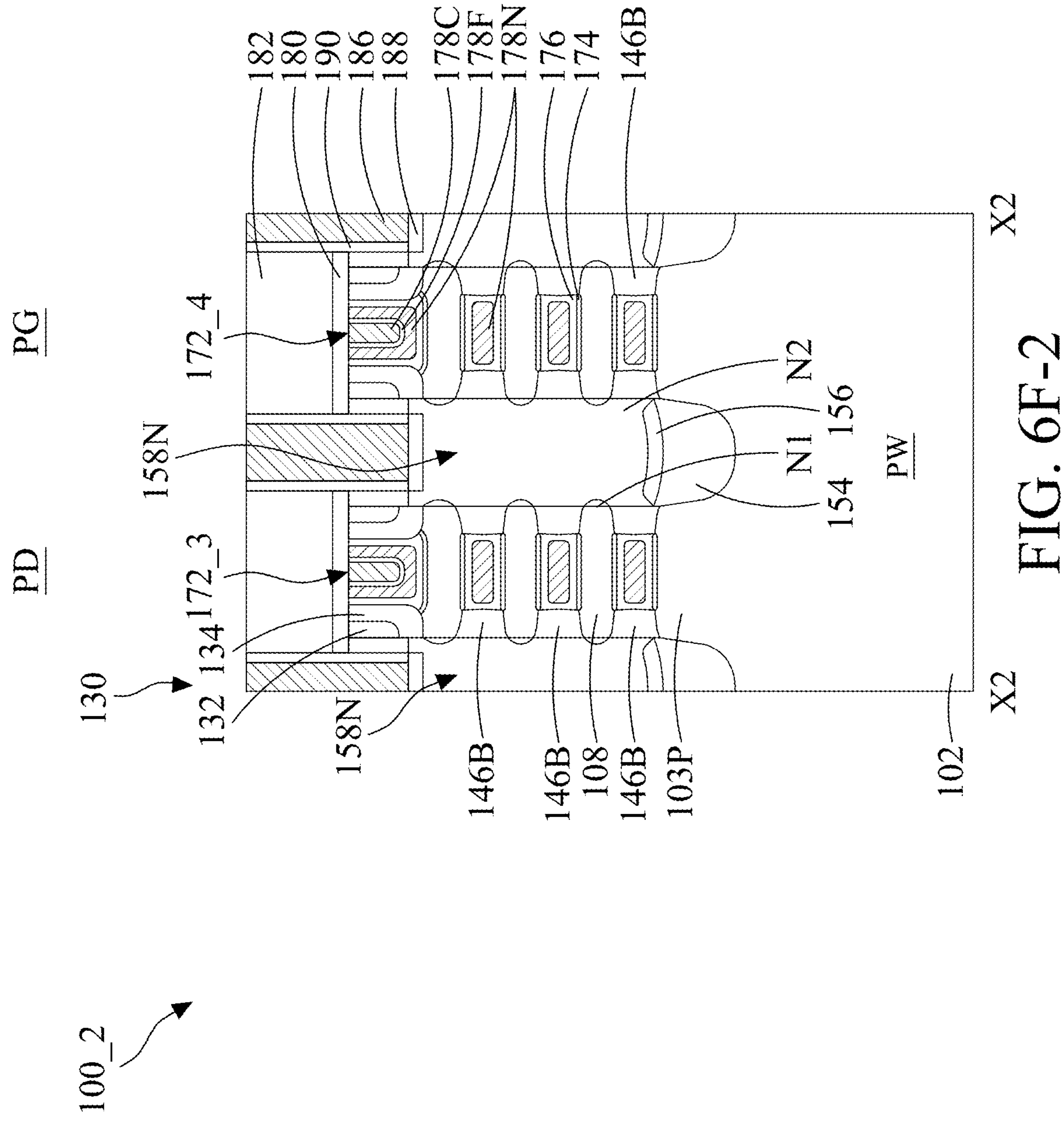
Figures 3, 6F:
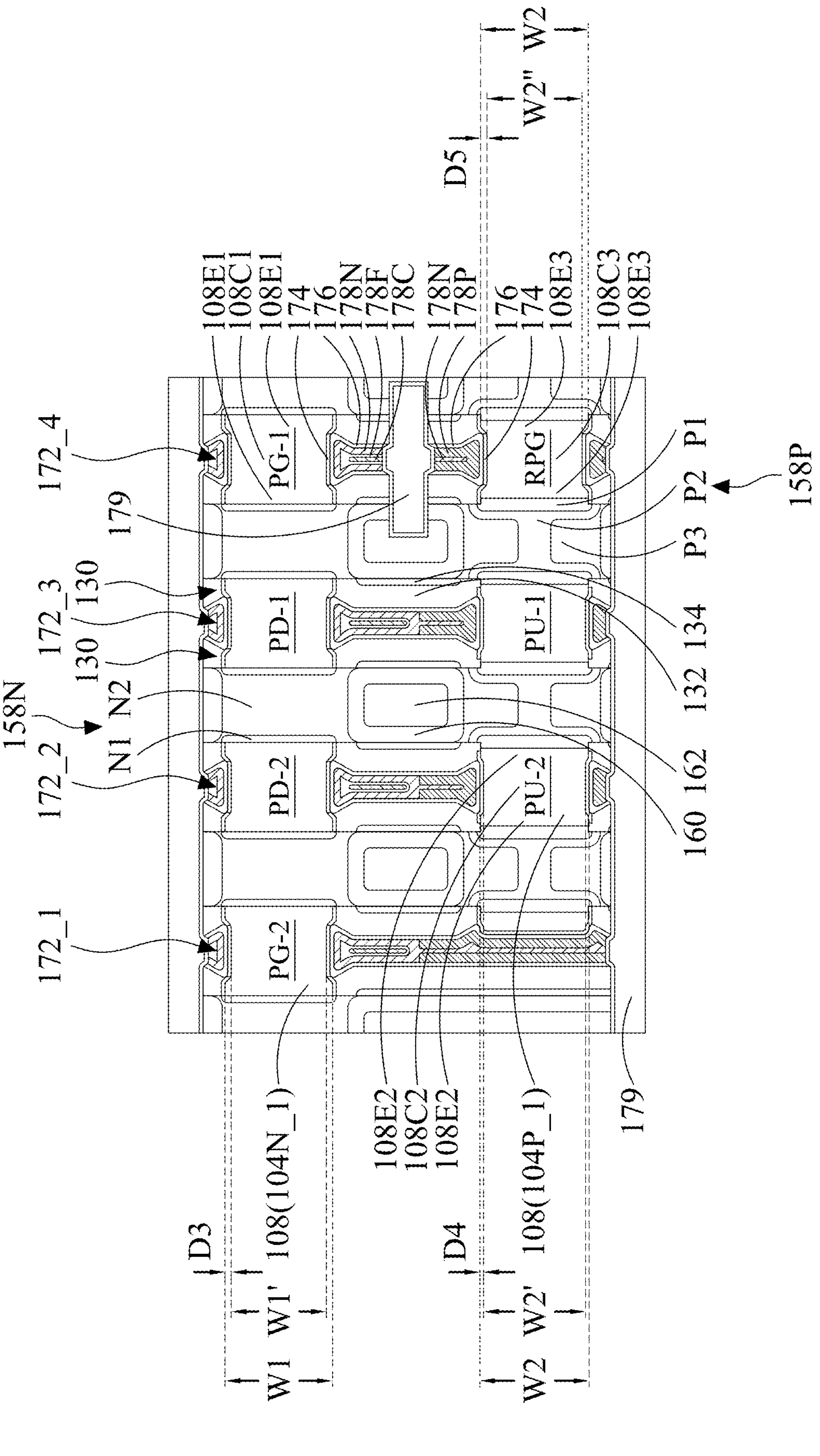

FIGS. 6F-1 and 6F-2 illustrate a semiconductor structure 100_2 after the formation of gate stacks 172, an etching stop layer 180, a second interlayer dielectric layer 182, and contact plugs 186, in accordance with some embodiments. FIG. 6F-3 is a plan view corresponding to plan A-A of FIG. 6F-1. The steps described above in FIGS. 5M-1 to 5M-3 are performed, thereby forming the final gate stacks 172 (including 172_1 to 172_4), the gate-cut features 179, the etching stop layer 180, the second interlayer dielectric layer 182 and the contact plugs 186, as shown in FIGS. 6F-1 and 6F-2, in accordance with some embodiments.

Each of the nanostructures 108 of the read-port pass-gate transistor RPG includes a center portion 108C3 surrounded by the gate stack 172 and edge portions 108E3 surrounded by the gate spacer layers 130, as shown in FIG. 6F-3, in accordance with some embodiments. In some embodiments, the center portion 108C3 has a width W2", and the edge portion 108E3 has the width W2. In some embodiments, the width W2 is greater than the width W2", e.g., by a dimension D5 of about 2-5 nm, because of the loss of the nanostructures 108 in the second channel-releasing process and during forming the interfacial layer 174. In some embodiments, the dimension D5 is greater than the dimension D4. In some embodiments, the width W2' is greater than the width W2". In some embodiments, the ratio (W2/W2") of the width W2 to the width W2" is in a range from about 1.05 to 1.5, and greater than the ratio (W2/W2'). In some embodiments, each of the nanostructures 108 of the read-port pass-gate transistor RPG has a biconcave profile.

In accordance with the embodiments of the present disclosure, the DOI process is applied to the formation of the pull-up transistors before the formation of source/drain features. Without increasing the cell height of the SRAM cell, the pull-up transistors may have a greater effective channel width (i.e., W2') while preventing the increase in the risk of source/drain merging. Therefore, the performance (e.g., operation speed) of the resulting SRAM device may be enhanced by 20-50% improvement in read current. In addition, the formation of the read-port pass-gate transistors RPG does not include the DOI process. The effective channel width (i.e., W2') of the pull-up transistors is greater than the effective channel width (i.e., W2") of the read-port pass-gate transistors RPG, which may enhance the cell performance of the resulting SRAM cells, e.g., 50~150 mV reduction in the Vddr (Voltage Dynamic Data Retention).

FIGS. 7A-1 through 7D-2 are cross-sectional views illustrating the formation of a semiconductor structure 100_3 of SRAM cells of FIG. 4 at various intermediate stages, in accordance with some embodiments. The embodiments of FIGS. 7A-1 through 7D-2 are similar to the embodiments of FIGS. 5A-1 through 5M-3 except that the DOI process is also applied to the formation of the pull-down transistors PD and pass-gate transistors PG. FIGS. 7A-1, 7B-1, 7C-1 and 7D-1 correspond to cross-section X1-X1, and FIGS. 7A-2, 7B-2, 7C-2 and 7D-2 correspond to cross-section X2-X2, in accordance with some embodiments.

Figures 1, 7A:
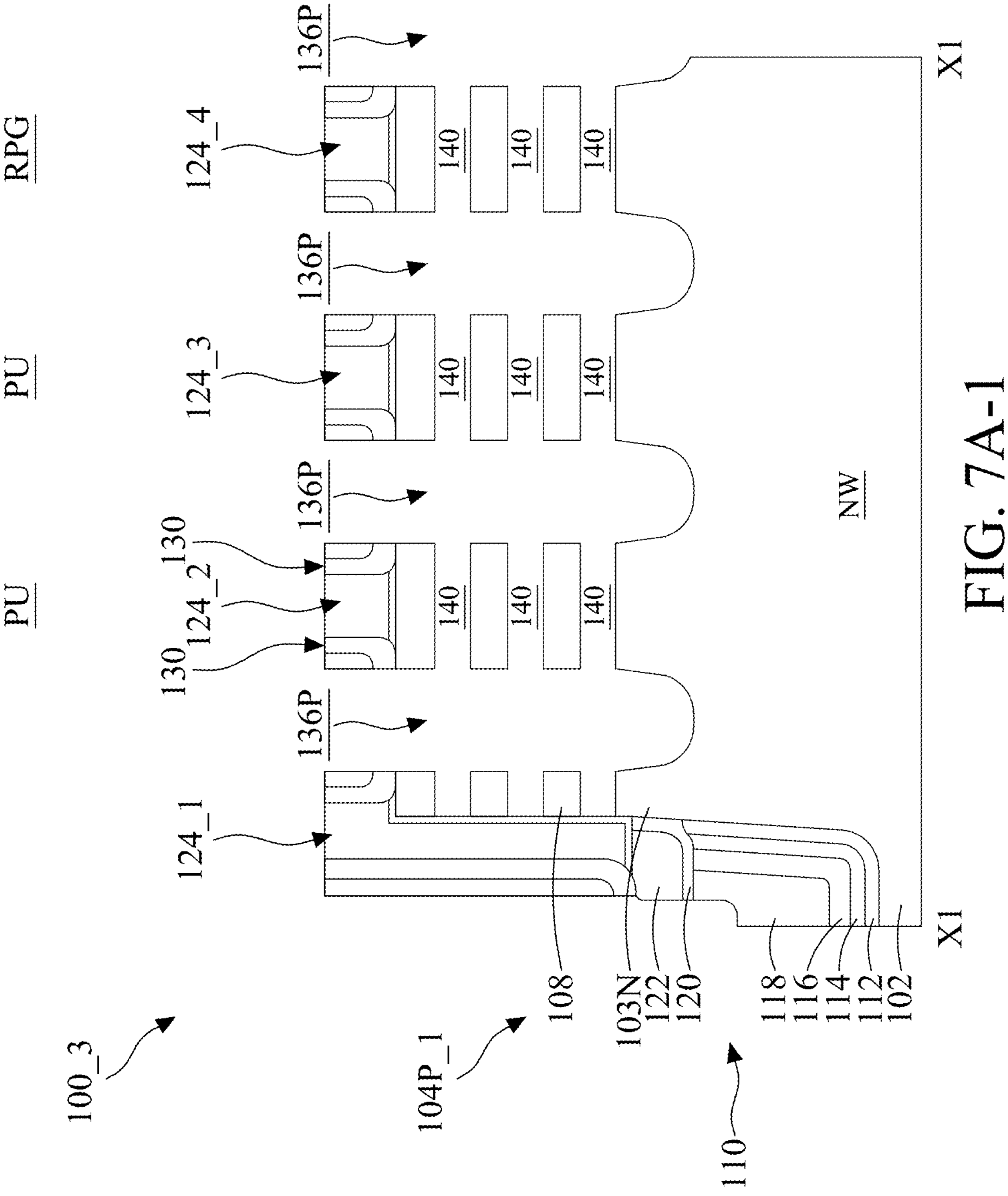
Figures 2, 7A:
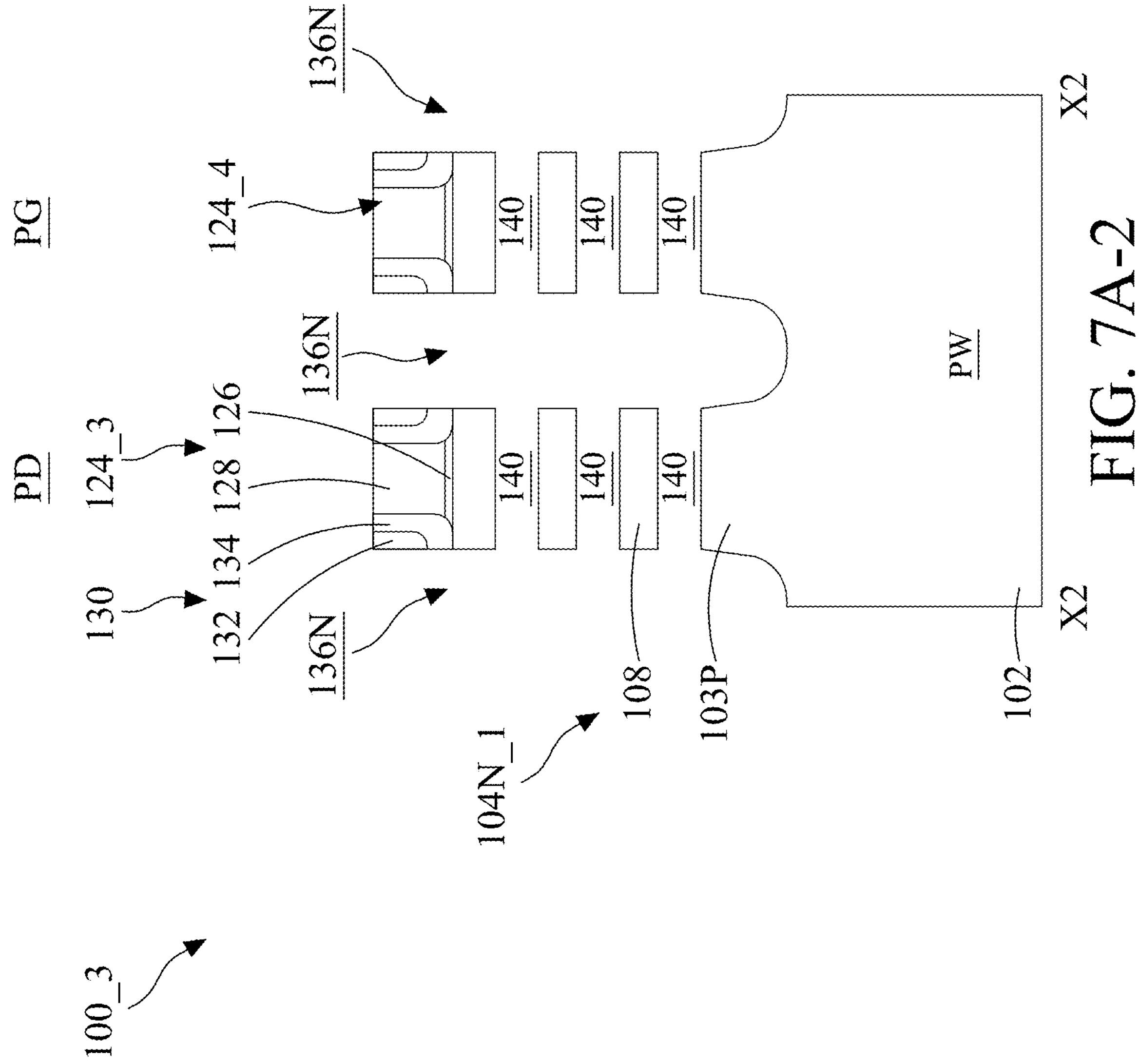

FIGS. 7A-1 and 7A-2 illustrate a semiconductor structure 100_3 after the removal of the first semiconductor layers 106, in accordance with some embodiments. Continuing from FIGS. 5B-1 to 5B-3, an etching process is performed to remove the first semiconductor layers 106 of the active regions 104N and 104P, thereby forming gaps 140, as shown in FIGS. 7A-1 and 7A-2, in accordance with some embodiments.

Figures 1, 7B:
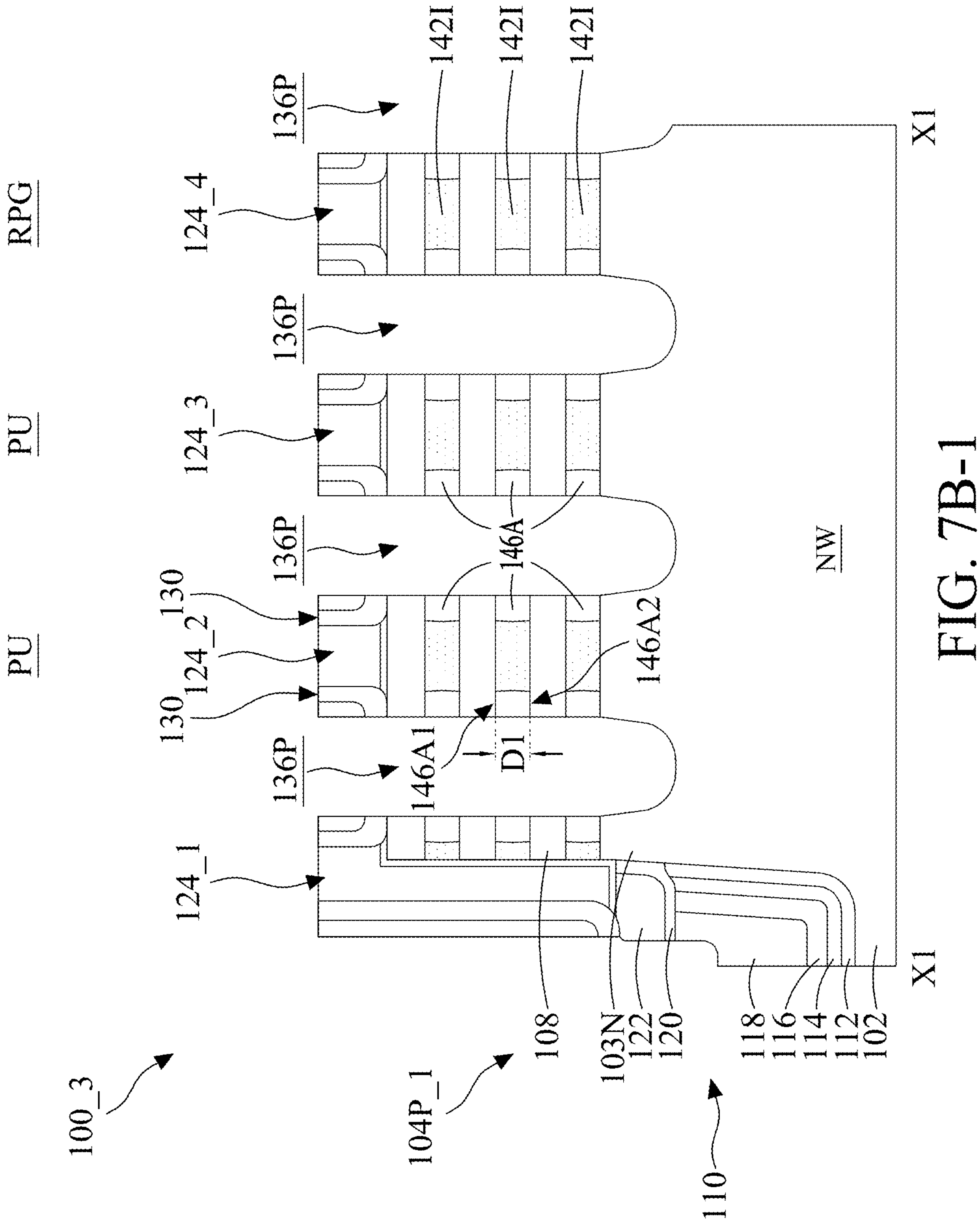
Figures 2, 7B:
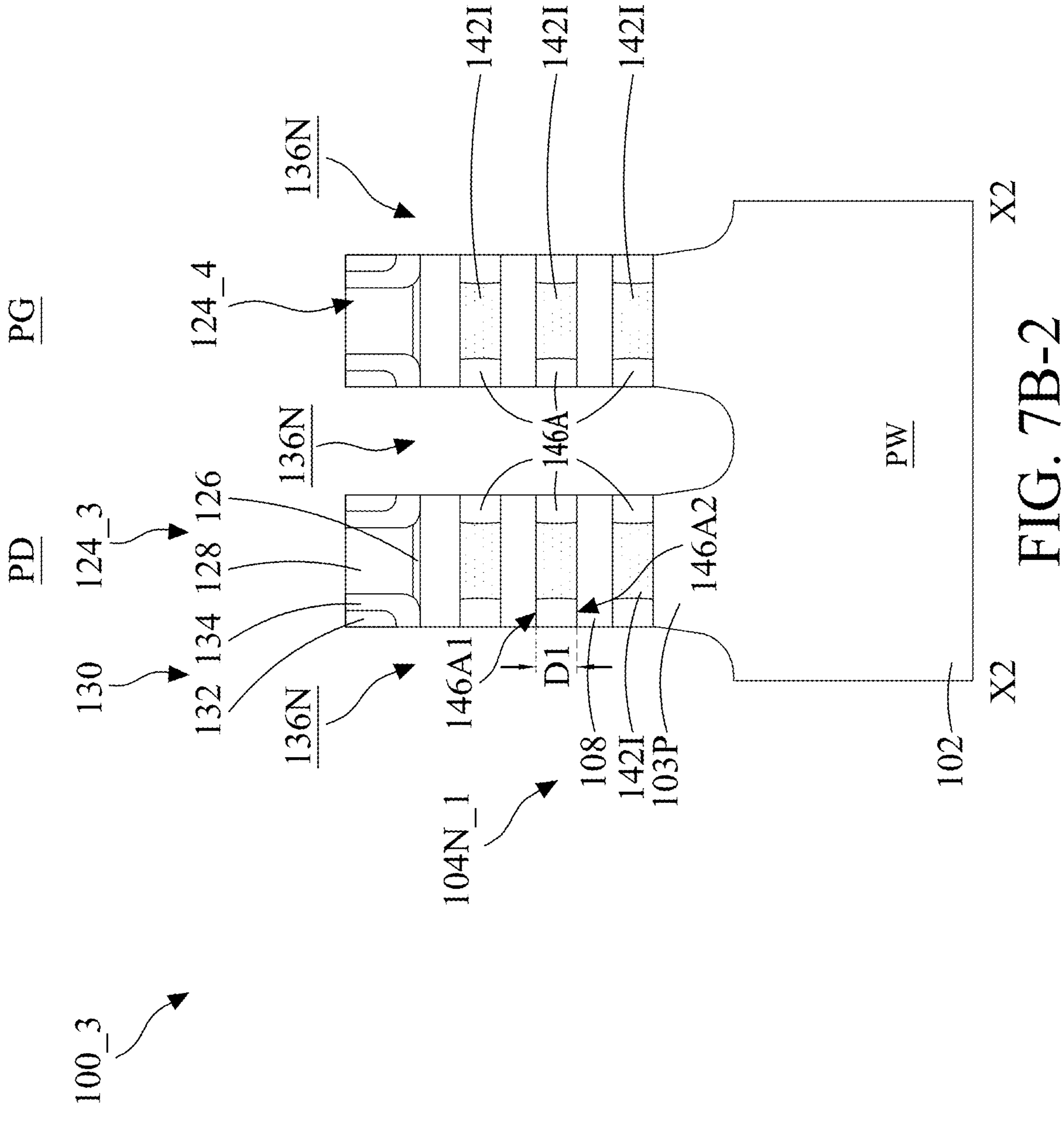

FIGS. 7B-1 and 7B-2 illustrate a semiconductor structure 100_3 after the replacement of the first semiconductor layers 106 with dielectric layers 142I and the formation of inner spacer layers 146A, in accordance with some embodiments. The steps described above in FIGS. 5D to 5F are performed, thereby forming the dielectric layers 142I in the gaps 140, and forming the inner spacer layers 146A, as shown in FIGS. 7B-1 and 7B-2, in accordance with some embodiments.

Figures 1, 7C:
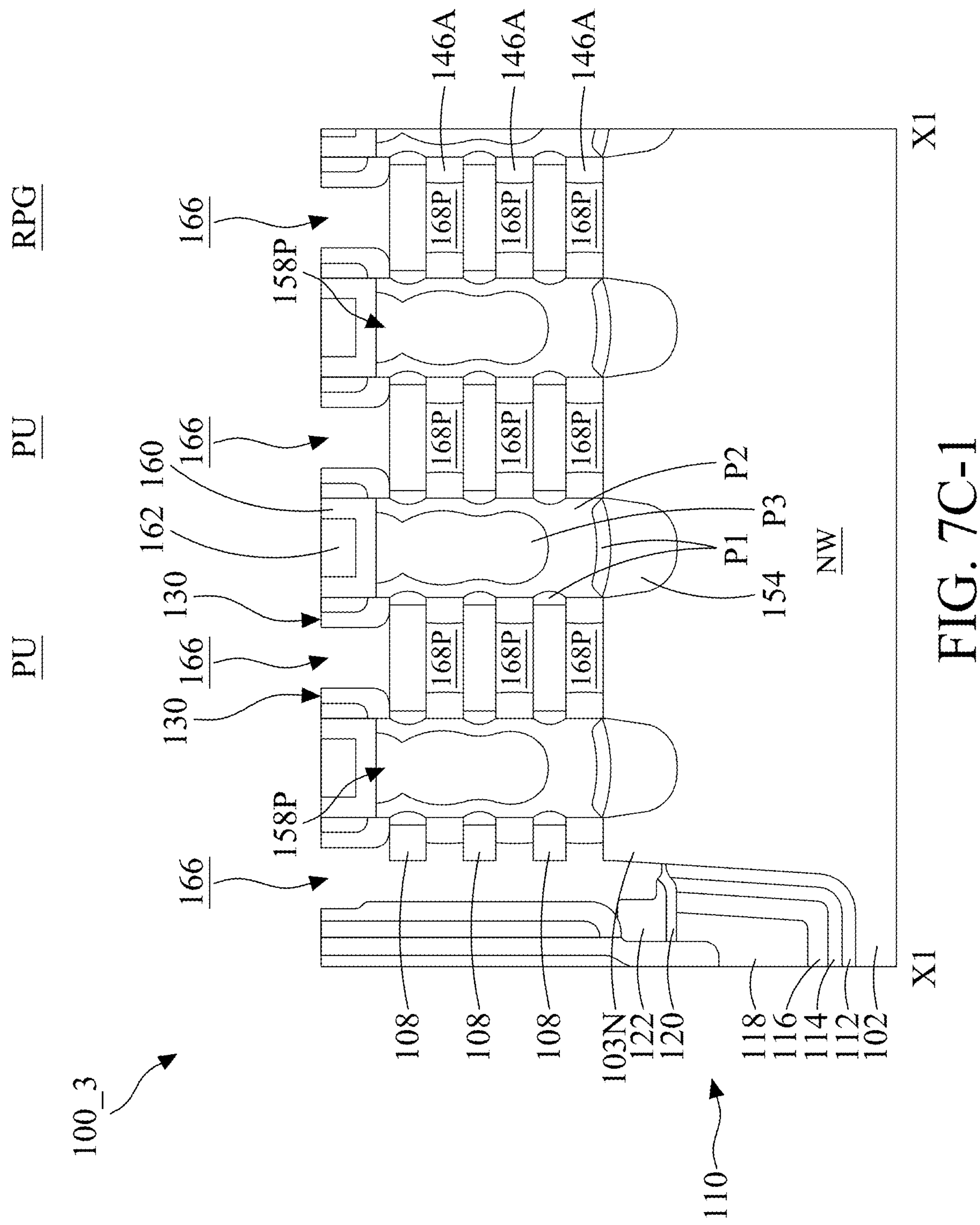
Figures 2, 7C:
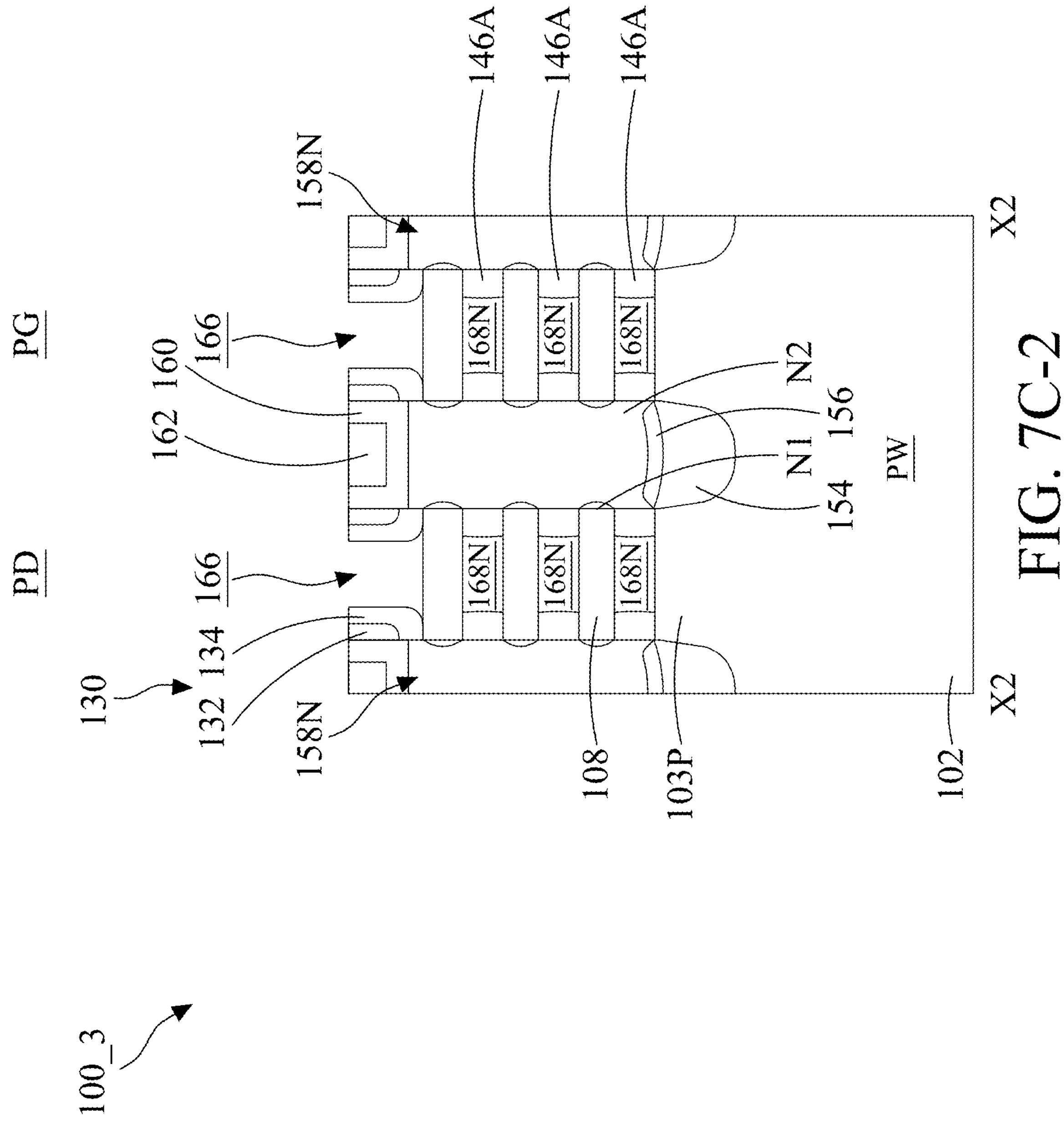

FIGS. 7C-1 and 7C-2 illustrate a semiconductor structure 100_3 after a first channel-releasing process, in accordance with some embodiments. The steps described above in FIGS. 5J-1 and 5J-2 are performed, thereby forming the source/drain features 158N and 158P, the contact etching stop layer 160 and the first interlayer dielectric layer 162, as shown in FIGS. 7C-1 and 7C-2, in accordance with some embodiments. The dummy gate structures 124 is removed using one or more etching processes to form gate trenches 166, in accordance with some embodiments. The dielectric layers 142I of the active regions 104N and 104P are removed using an etching process to form gaps 168N and 168P, in accordance with some embodiments.

Figures 1, 7D:
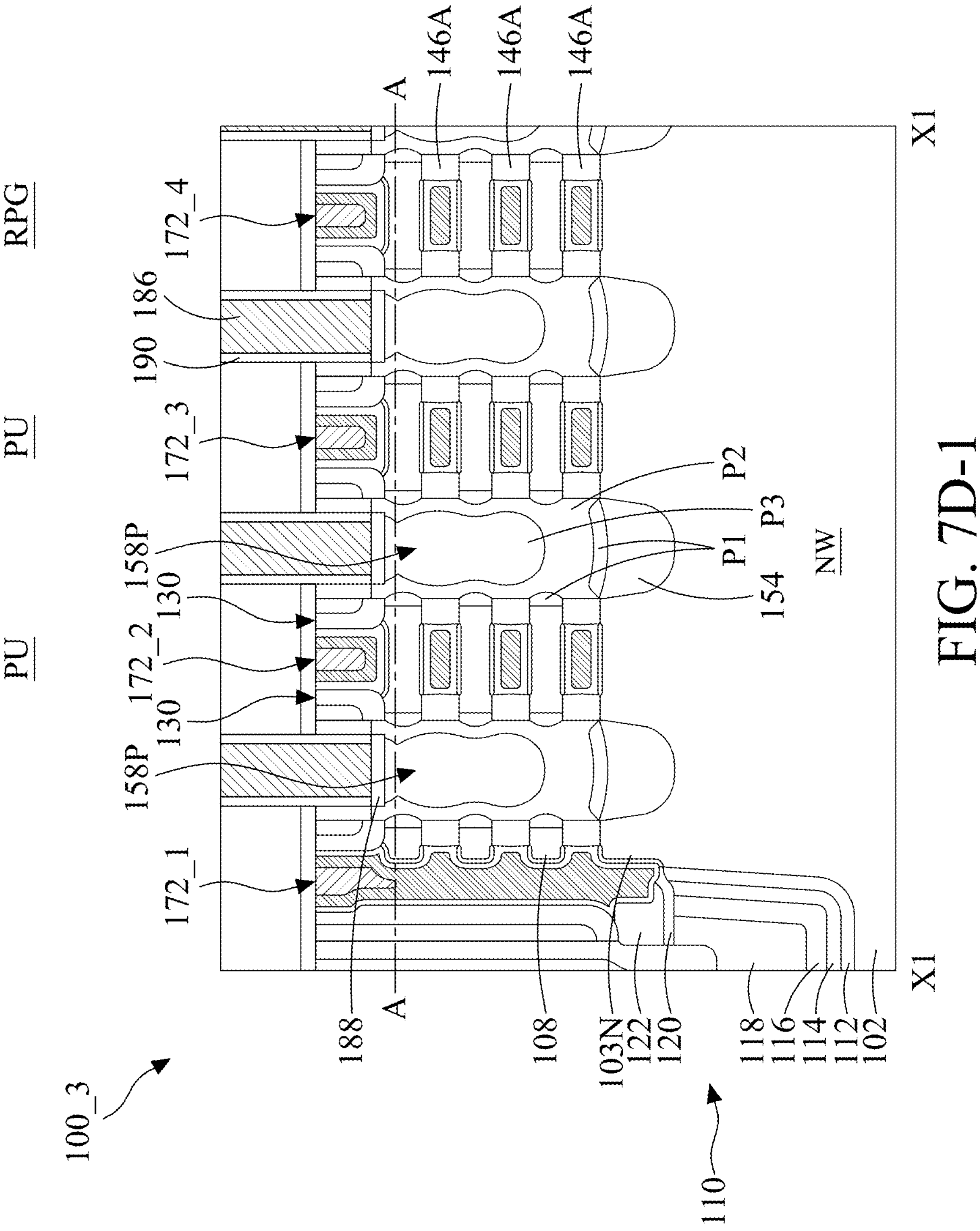
Figures 2, 7D:
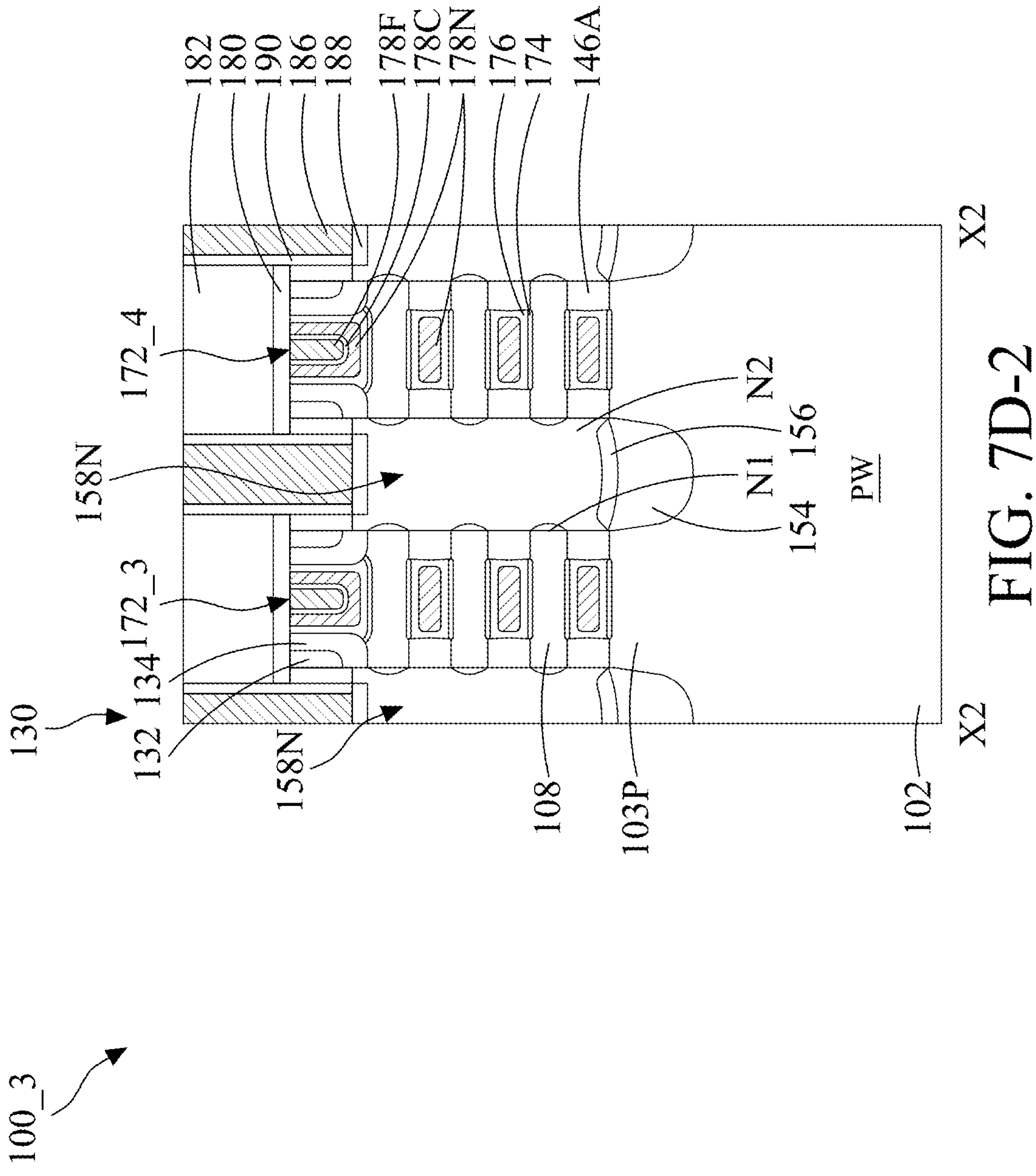
Figures 3, 7D:
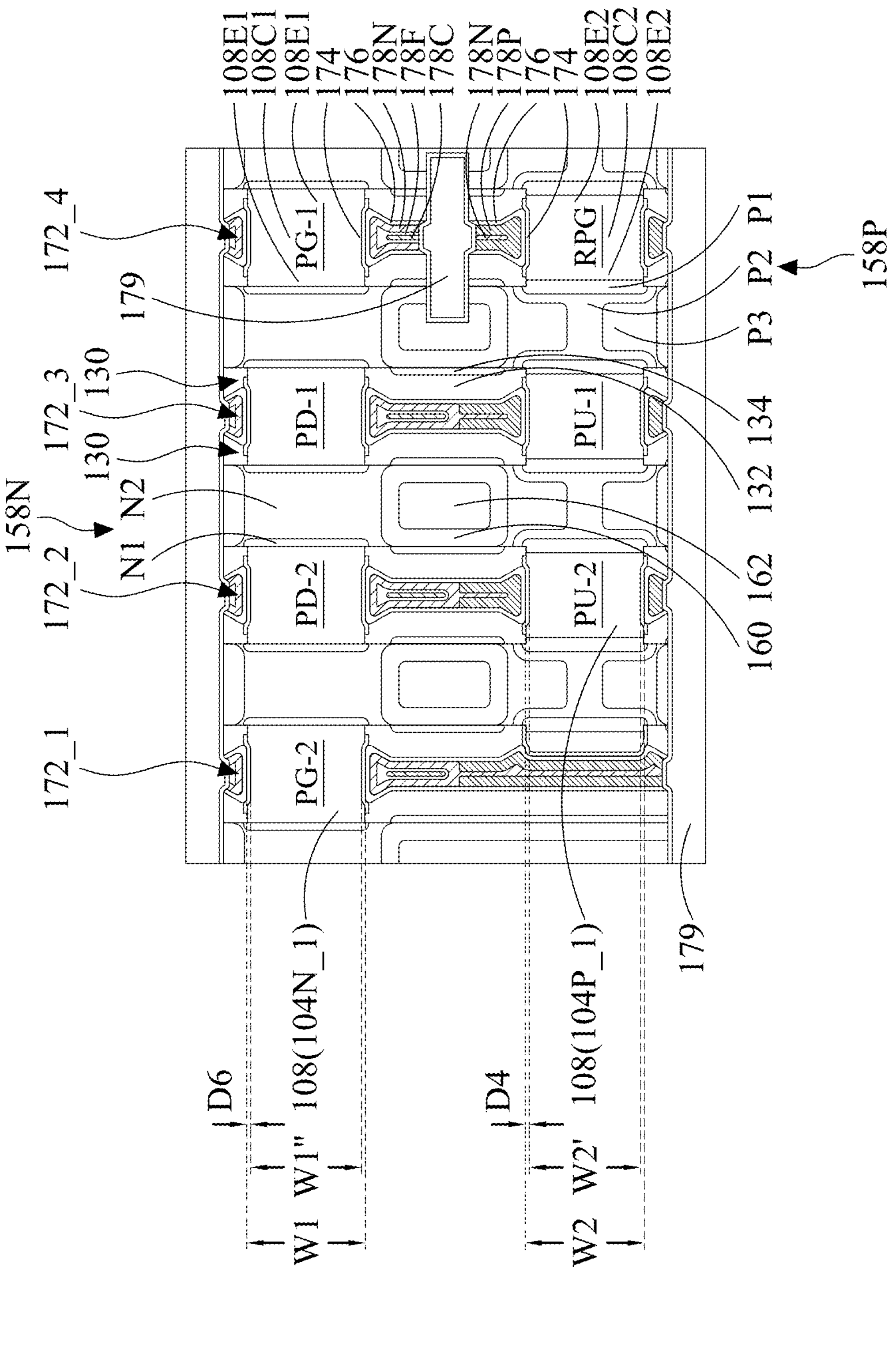

FIGS. 7D-1 and 7D-2 illustrate a semiconductor structure 100_3 after the formation of gate stacks 172, an etching stop layer 180, a second interlayer dielectric layer 182, and contact plugs 186, in accordance with some embodiments. FIG. 7D-3 is a plan view corresponding to plan A-A of FIG. 7D-1. After the first channel-releasing process, the steps described above in FIGS. 5M-1 to 5M-3 are performed, thereby forming the final gate stacks 172 (including 172_1 to 172_4), the gate-cut features 179, the etching stop layer 180, the second interlayer dielectric layer 182 and the contact plugs 186, as shown in FIGS. 7D-1 and 7D-2, in accordance with some embodiments.

Each of the nanostructures 108 of the pass-gate transistors PG-1 and PG-2 and the pull-down transistors PD-1 and PD-2 includes a center portion 108C1 surrounded by the gate stack 172 and edge portions 108E1 surrounded by the gate spacer layers 130, as shown in FIG. 7D-3, in accordance with some embodiments. In some embodiments, the center portion 108C1 has a width W1", and the edge portion 108E1 has the width W1. In some embodiments, the width W1 is greater than the width W1", e.g., by a dimension D6 of about 0-2.5 nm, because of the loss of the nanostructures 108 in the first channel-releasing process and during forming the interfacial layer 174. In some other embodiments, the width W1 is equal to the width W1". In some embodiments, the ratio (W1/W1") of the width W1 to the width W1" is in a range from about 1 to 1.05. In some embodiments, the ratio (W1/W1") may be substantially equal to the ratio (W2/W2'). In some embodiments, the width W1" is substantially equal to the width W2'.

In accordance with the embodiments of the present disclosure, the DOI process is applied to the formation of the n-channel nanostructure transistors (i.e., pass-gate transistors and pull-down transistors) and the p-channel nanostructure transistors (i.e., pull-up transistors and read-port pass-gate transistors) before the formation of source/drain features. Without increasing the cell height of the SRAM cell, both the n-channel and p-channel nanostructure transistors may have a greater effective channel width (i.e., W1" and W2') while preventing the increase in the risk of source/drain merging, and thus the saturation current of the pass-gate transistors and the pull-down transistors may increase, e.g., by 3-5%, the saturation current of the pull-up transistors may increase, e.g., by 15-25%. Therefore, the performance (e.g., operation speed) of the resulting SRAM device may be enhanced. In addition, the cost of manufacturing the resulting SRAM device may be reduced because the patterning process for the selective DOI process is omitted.

Figure 8:
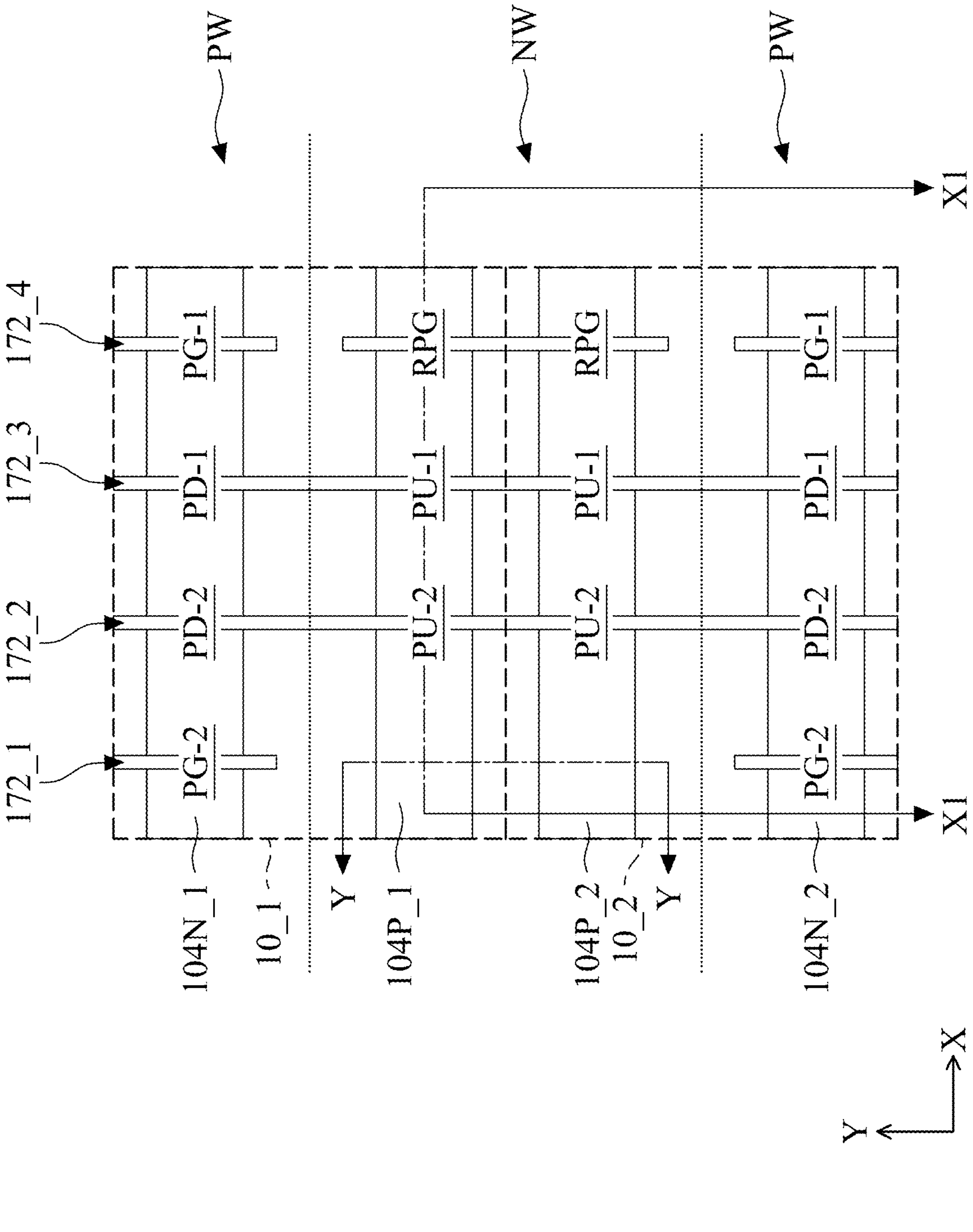
FIG. 8 illustrates a layout showing two SRAM cells in FIG. 2, in accordance with some embodiments of the disclosure.

FIG. 8 illustrates a layout showing two SRAM cells in FIG. 2, in accordance with some embodiments of the disclosure. FIGS. 9A-1 through 9B-2 are cross-sectional views illustrating the formation of a semiconductor structure 100_4 of SRAM cells of FIG. 8 at various intermediate stages, in accordance with some embodiments. The embodiments of FIGS. 8 and 9A-1 through 9B-2 are similar to the embodiments of FIGS. 4 and 5A-1 through 5M-3, except that the active regions 104P_1 and 104P_2 are continuous oxide definition (CNOD). In addition, a portion of the gate stack 172_1 corresponding to the active regions 104P_1 and 104P_2 is replaced with a cutting feature.

Figures 1, 9A:
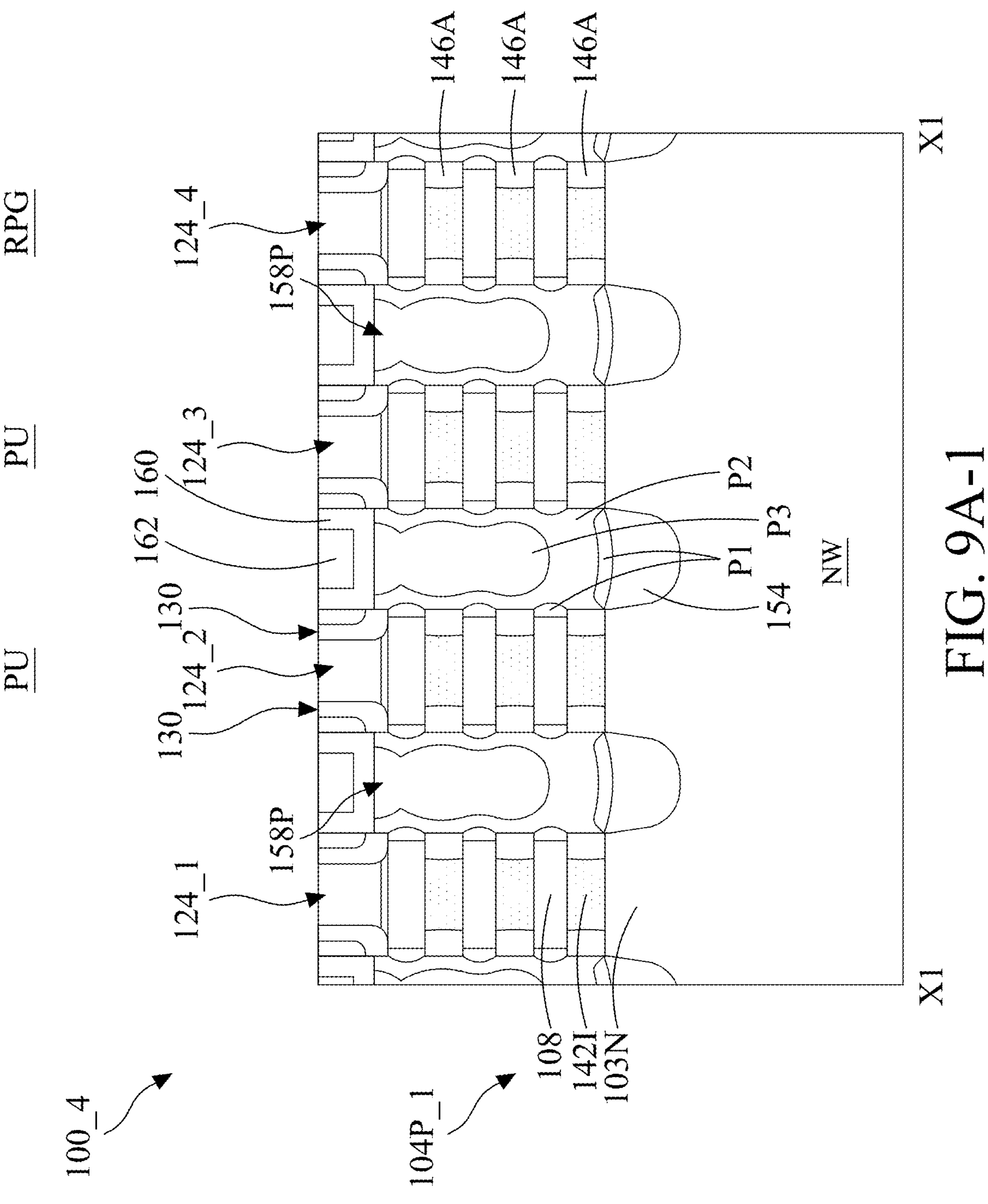
Figures 2, 9A:
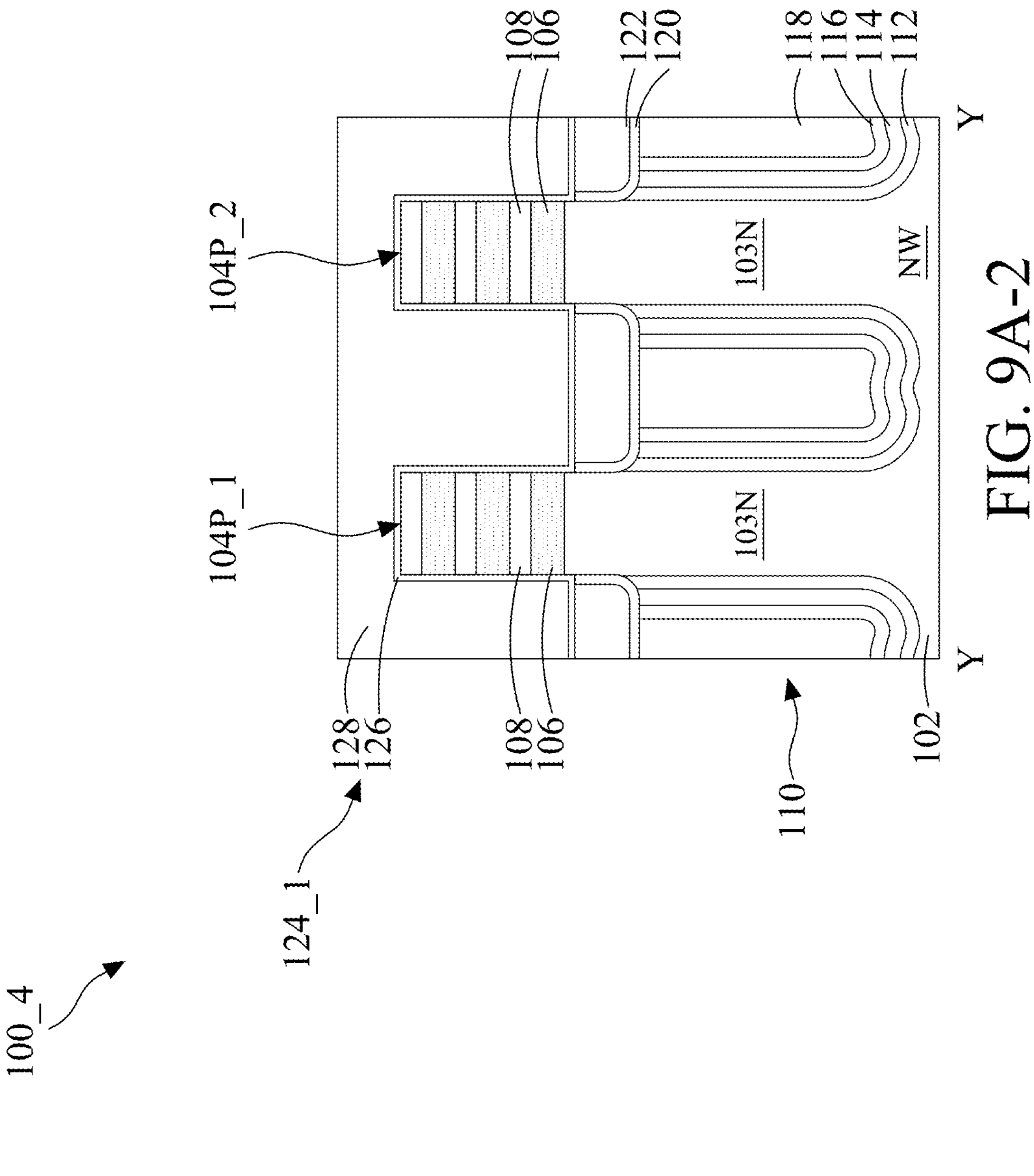
Figures 1, 9B:
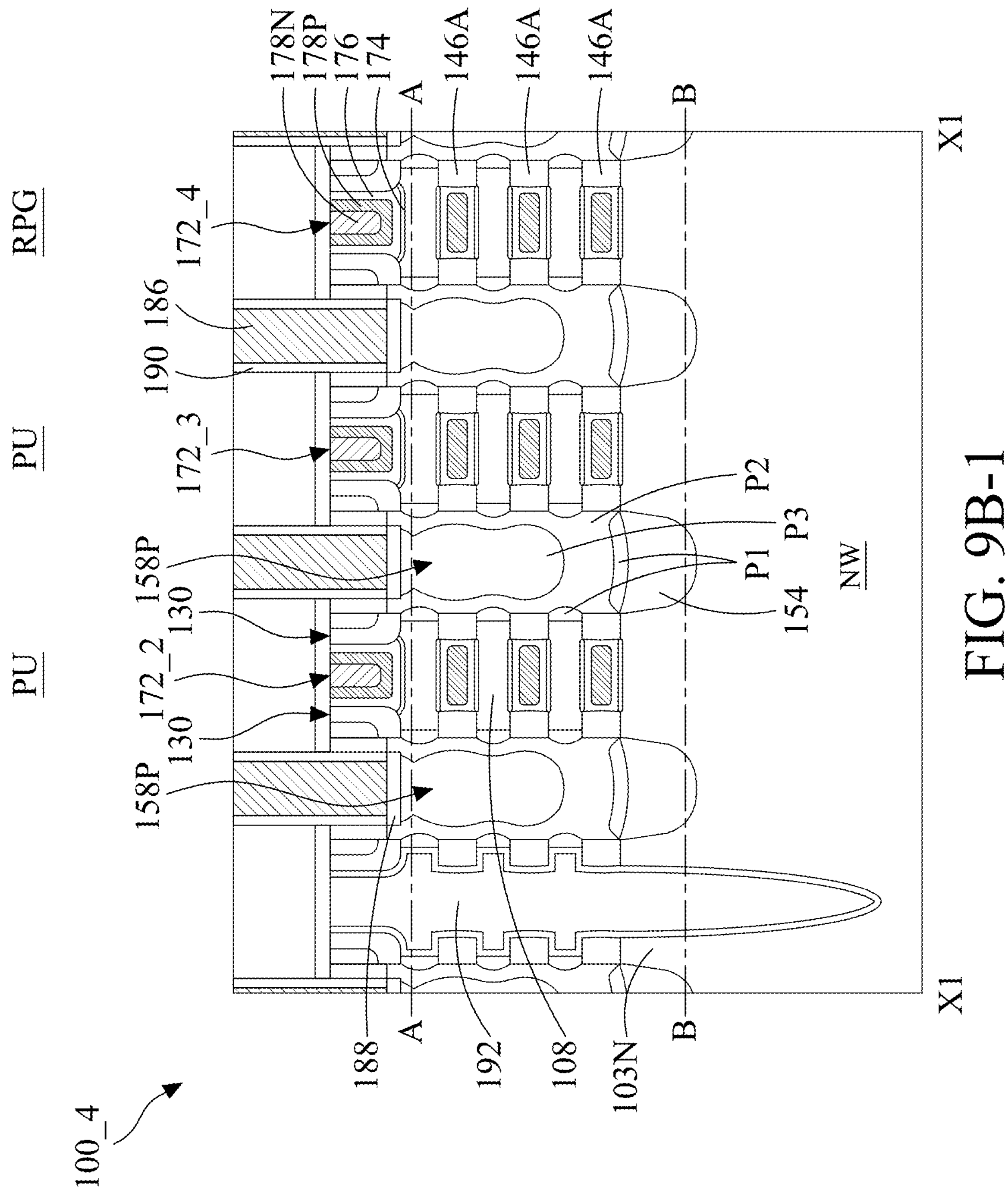
Figures 2, 9B:
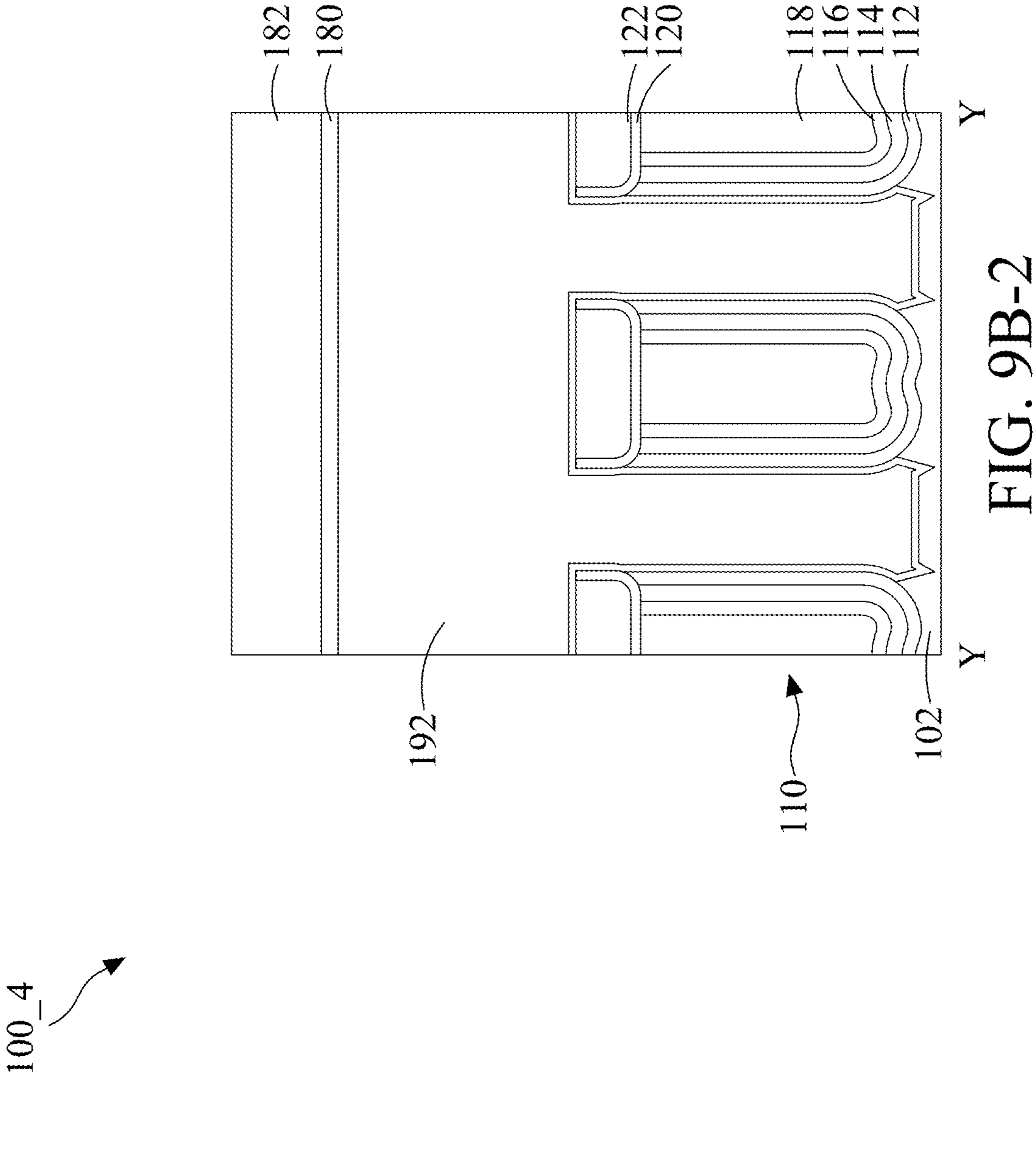
Figures 3, 9B:
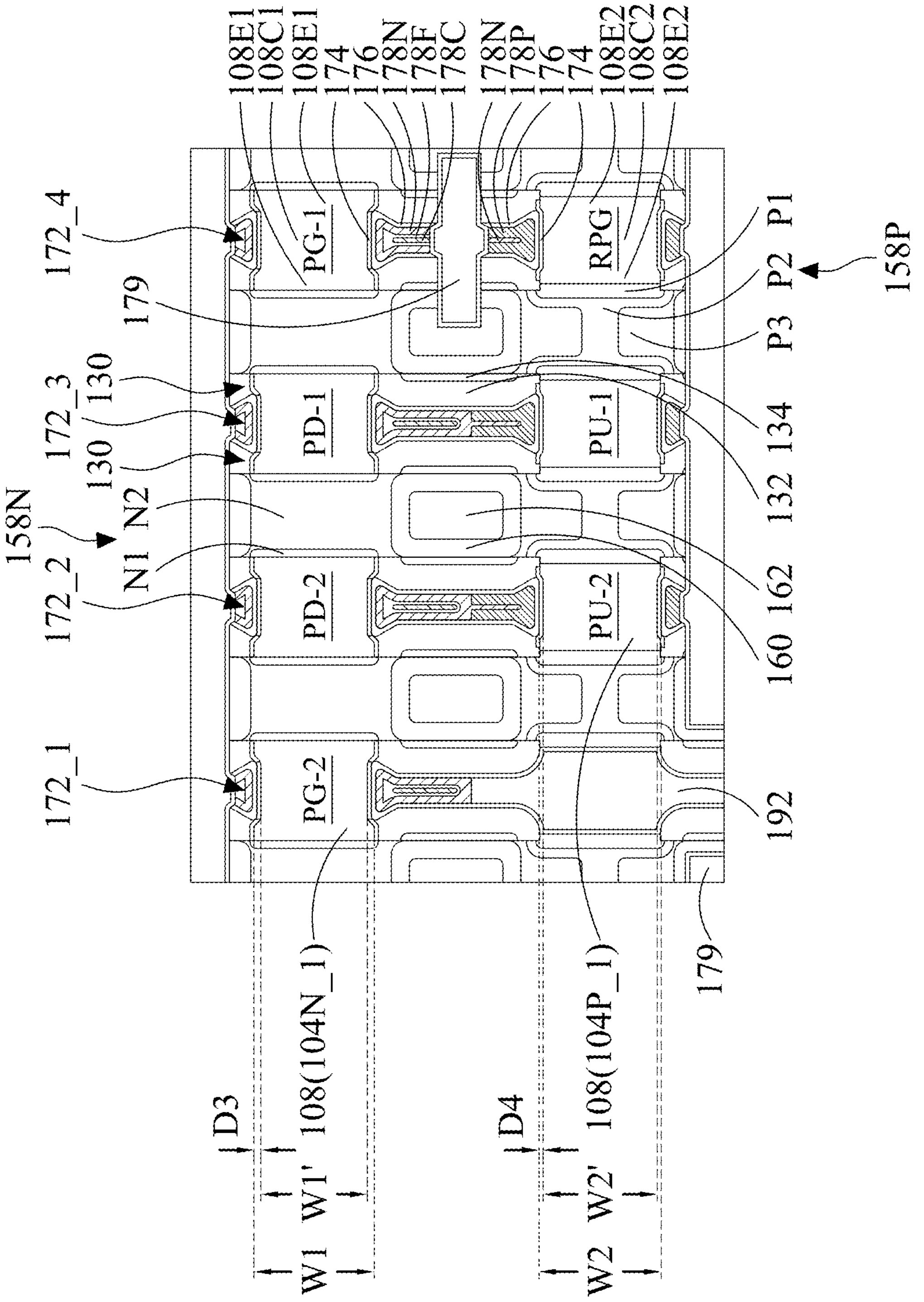

FIG. 8 also illustrates reference cross-sections, in that cross-section X1-X1 is in a plane parallel to the longitudinal axis (X direction) of an active region 104 and through the active region 104P_1, and cross-section Y-Y is in a plane parallel to the longitudinal axis (Y direction) of a gate stack 172 and through a cutting-feature. FIGS. 9A-1 and 9B-1 correspond to cross-section X1-X1, and FIGS. 9A-2 and 9B-2 correspond to cross-section Y-Y, in accordance with some embodiments. FIG. 9B-3 is a plan view corresponding to plan A-A of FIG. 9B-1.

Active regions (104P and 104N (not shown) are formed over the substrate 102, as shown in FIGS. 9A-1 and 9A-2, in accordance with some embodiments. The second active region patterning process discussed above in FIG. 5A-1 is omitted, and thus the active regions 104P keep continuously extending in several SRAM cells 10, in accordance with some embodiments. The steps described above in FIGS. 5A-1 through 5J-2 are performed, thereby forming an isolation structure 110, dummy gate structures 124, gate spacer layers 130, dielectric layers 142I, inner spacer layers 146A, inner spacer layers 146B (not shown), semiconductor isolation features 154, dielectric isolation features 156 (not shown), source/drain features 158N (not shown) and 158P, a contact etching stop layer 160 and a first interlayer dielectric layer 162, as shown in FIGS. 9A-1 and 9A-2, in accordance with some embodiments.

A portion of the dummy gate structure 124_1 corresponding to (overlapping) the active regions 104P_1 and 104P_2 are replaced with a cutting feature 192, as shown in FIGS. 9B-1, 9B-2 and 9B-3, in accordance with some embodiments. The cutting feature 192 is formed to penetrate through the dummy gate structure 124_1, and further through the underlying active regions 104P_1 and 104P_2, in accordance with some embodiments. In some embodiments, the cutting feature 192 extends in the Y direction. The cutting feature 192 may be also referred to as cut poly gate on oxide definition edge (CPODE) pattern. Therefore, the dummy gate structure 124_1 is divided into several segments, in accordance with some embodiments.

The cutting feature 192 is made of a dielectric material such as silicon oxide ($SiO_2$), silicon oxynitride (SiON), silicon nitride (SiN), silicon carbon nitride (SiCN), silicon oxycarbonitride (SiOCN), oxygen-doped silicon carbonitride (Si(O)CN), or a combination thereof. In some embodiments, the cutting feature 192 includes dielectric material with k-value greater than 7.9, such as LaO, AlO, AION, ZrO, HfO, ZnO, ZrN, ZrAlO, TiO, TaO, YO, TaCN, or a combination thereof.

The formation of the cutting feature 192 includes patterning the dummy gate structure 124_1 and the active regions 104P_1 and 104P_2 using photolithography and etching processes to form a cutting trench, depositing a dielectric material for the cutting feature 192 to overfill the cutting trench, in accordance with some embodiments. A planarization process (e.g., CMP, etching back process, or a combination thereof) is then performed on dielectric material formed until the first interlayer dielectric layer 162 is exposed, in accordance with some embodiments. In some embodiments, the process of forming the cutting features 192 may be easily integrated into manufacturing SRAM devices and manufacturing logic devices, thereby reducing the difficulty of manufacturing SRAM devices.

Afterwards, the steps described above in FIGS. 5K-1 through 5M-3 are performed, thereby forming gate stacks 172, gate-cut features 179, an etching stop layer 180, a second interlayer dielectric layer 182, and contact plugs 186, as shown in FIGS. 9B-1, 9B-2 and 9B-3, in accordance with some embodiments.

Figure 10:
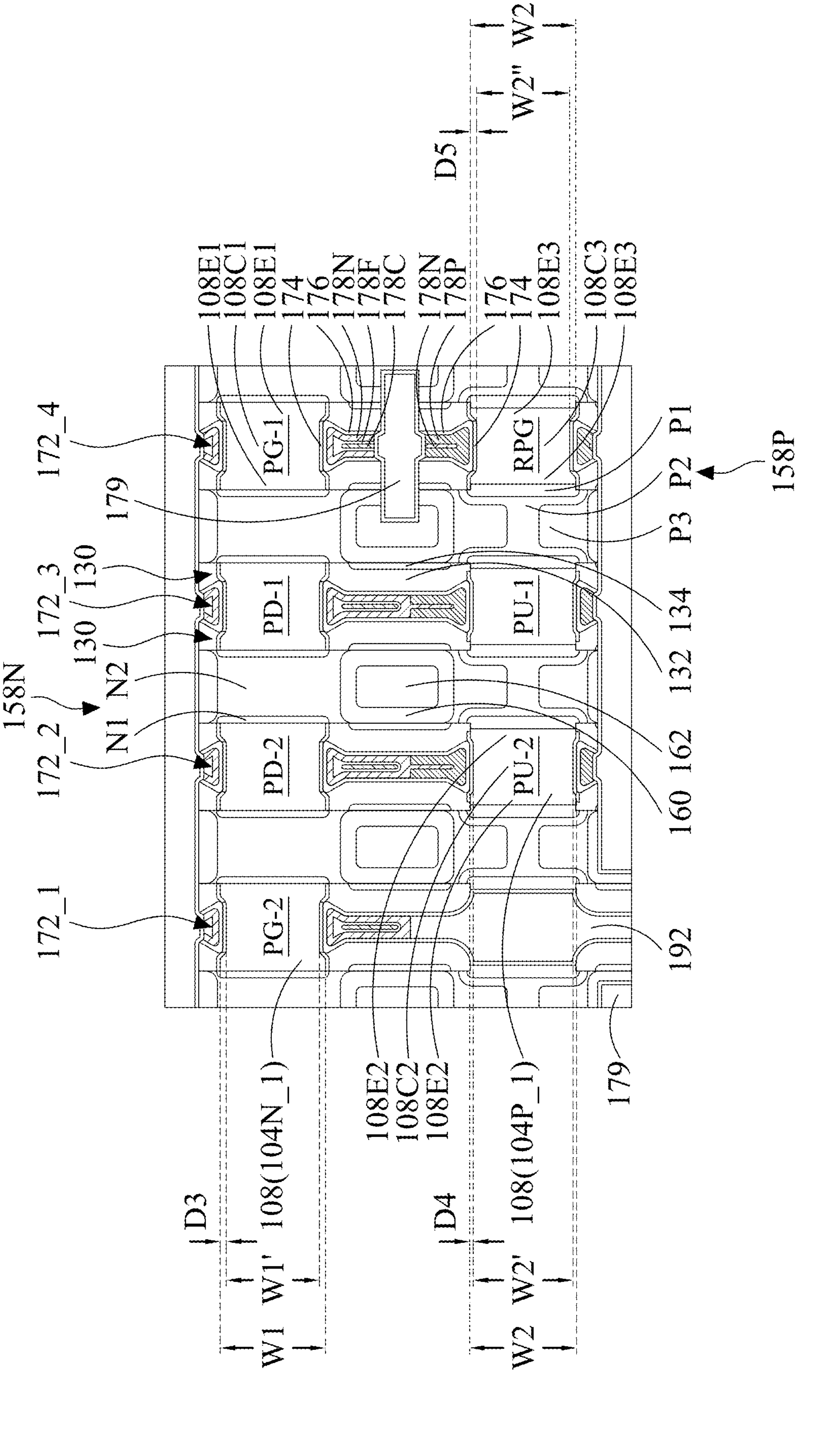
FIG. 10 is a modification of the semiconductor structure of FIG. 6F-3, in accordance with some embodiments of the disclosure.

FIG. 10 is a modification of the semiconductor structure of FIG. 6F-3, in accordance with some embodiments of the disclosure. The embodiments of FIG. 10 are similar to the embodiments of FIGS. 6A-1 through 6F-3 except for a cutting feature 192 is formed through the dummy gate structure 124_1 and the underlying active regions 104P_1 and 104P_2. The formation of the cutting feature 192 may be the same as or similar to that described above in FIGS. 9B-1 to 9B-3.

Figure 11:
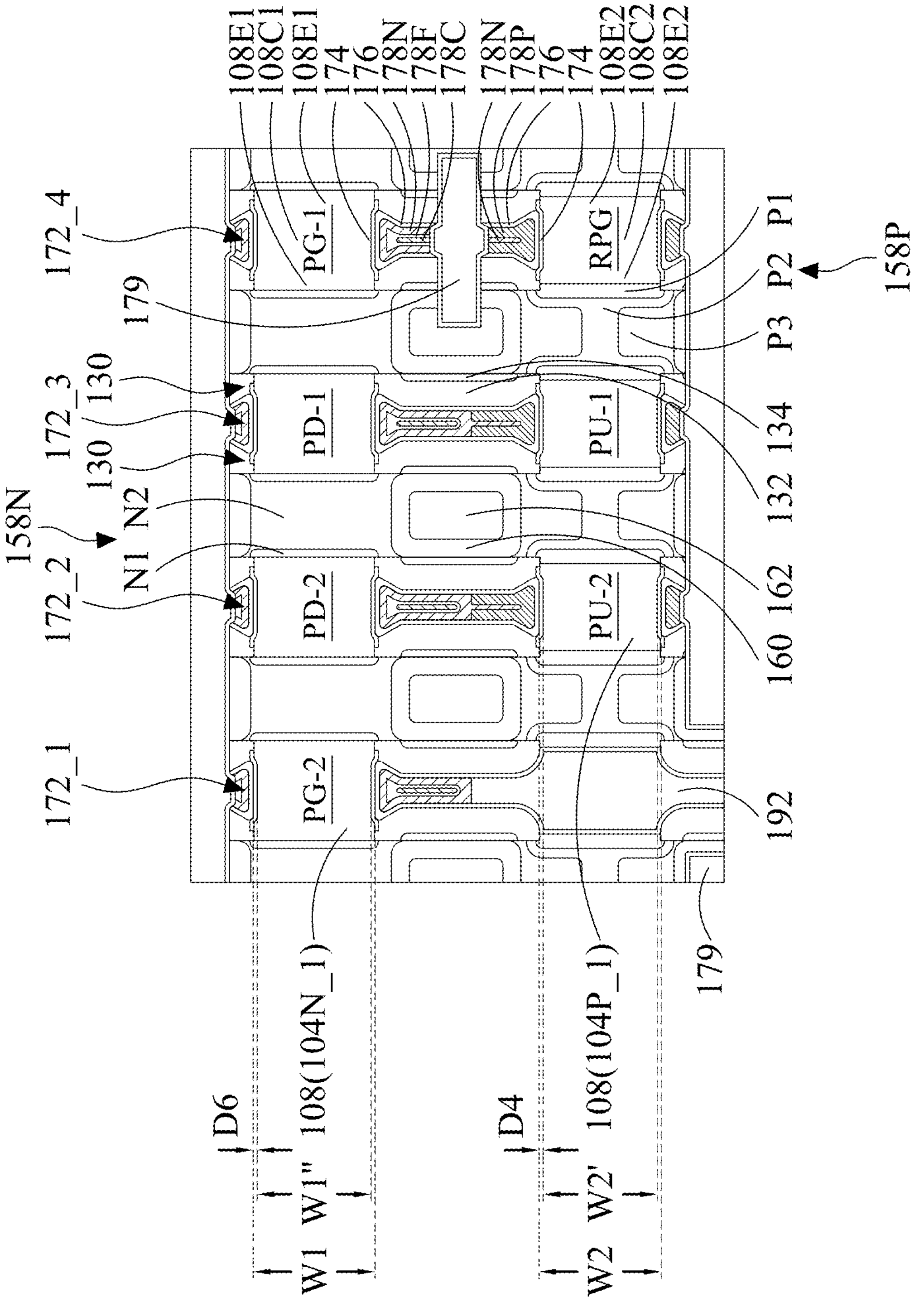
FIG. 11 is a modification of the semiconductor structure of FIG. 7D-3, in accordance with some embodiments of the disclosure.

FIG. 11 is a modification of the semiconductor structure of FIG. 7D-3, in accordance with some embodiments of the disclosure. The embodiments of FIG. 11 are similar to the embodiments of FIGS. 7A-1 through 7D-3 except for a cutting feature 192 is formed through the dummy gate structure 124_1 and the underlying active regions 104P_1 and 104P_2. The formation of the cutting feature 192 may be the same as or similar to that described above in FIGS. 9B-1 to 9B-3.

Figure 12:
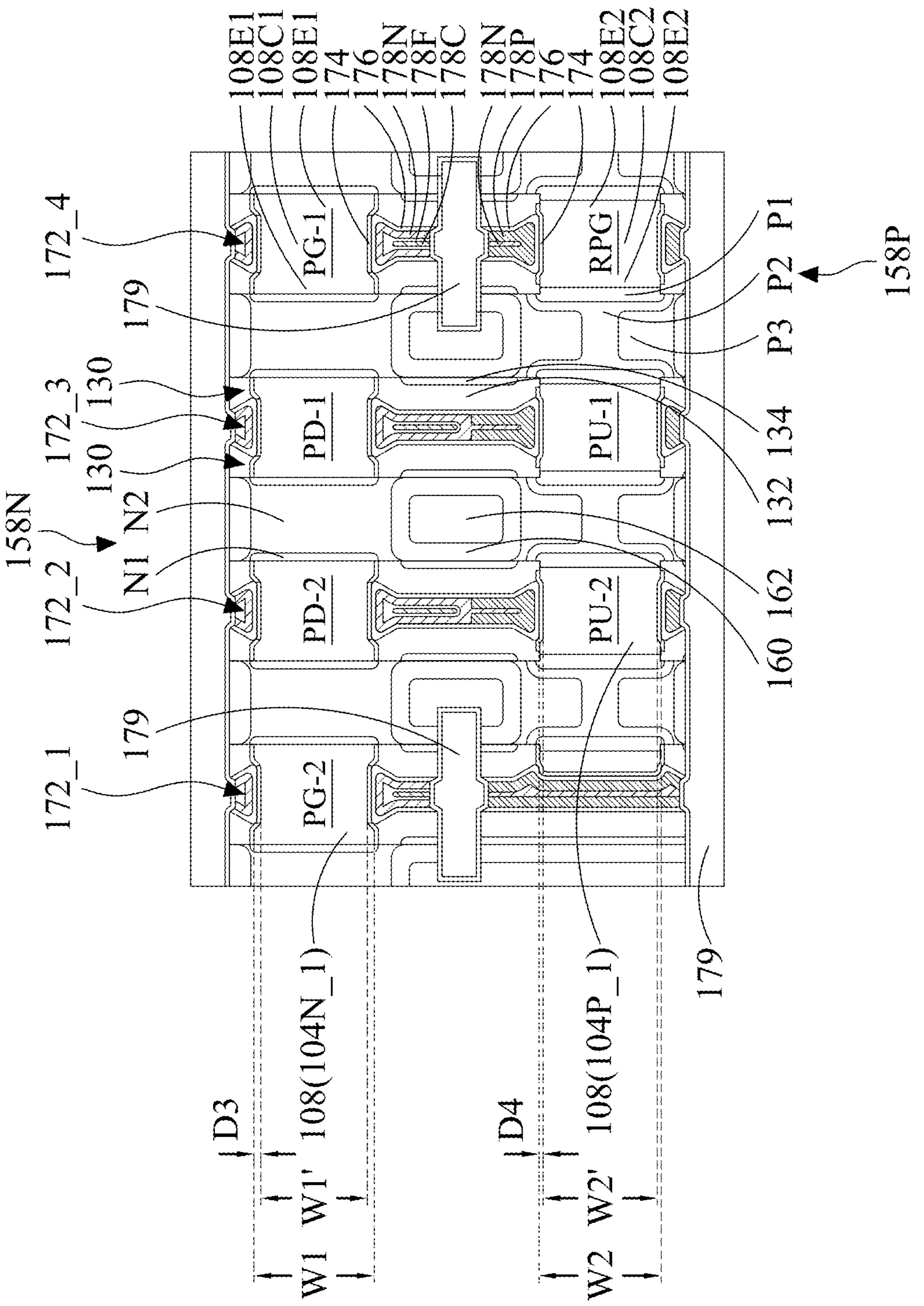
FIGS. 12, 13, 14, 15, 16 and 17 are respective modifications of the semiconductor structures of FIGS. 5M-4, 6F-3, 7D-3, 9B-3, 10 and 11, in accordance with some embodiments of the disclosure.
Figure 13:
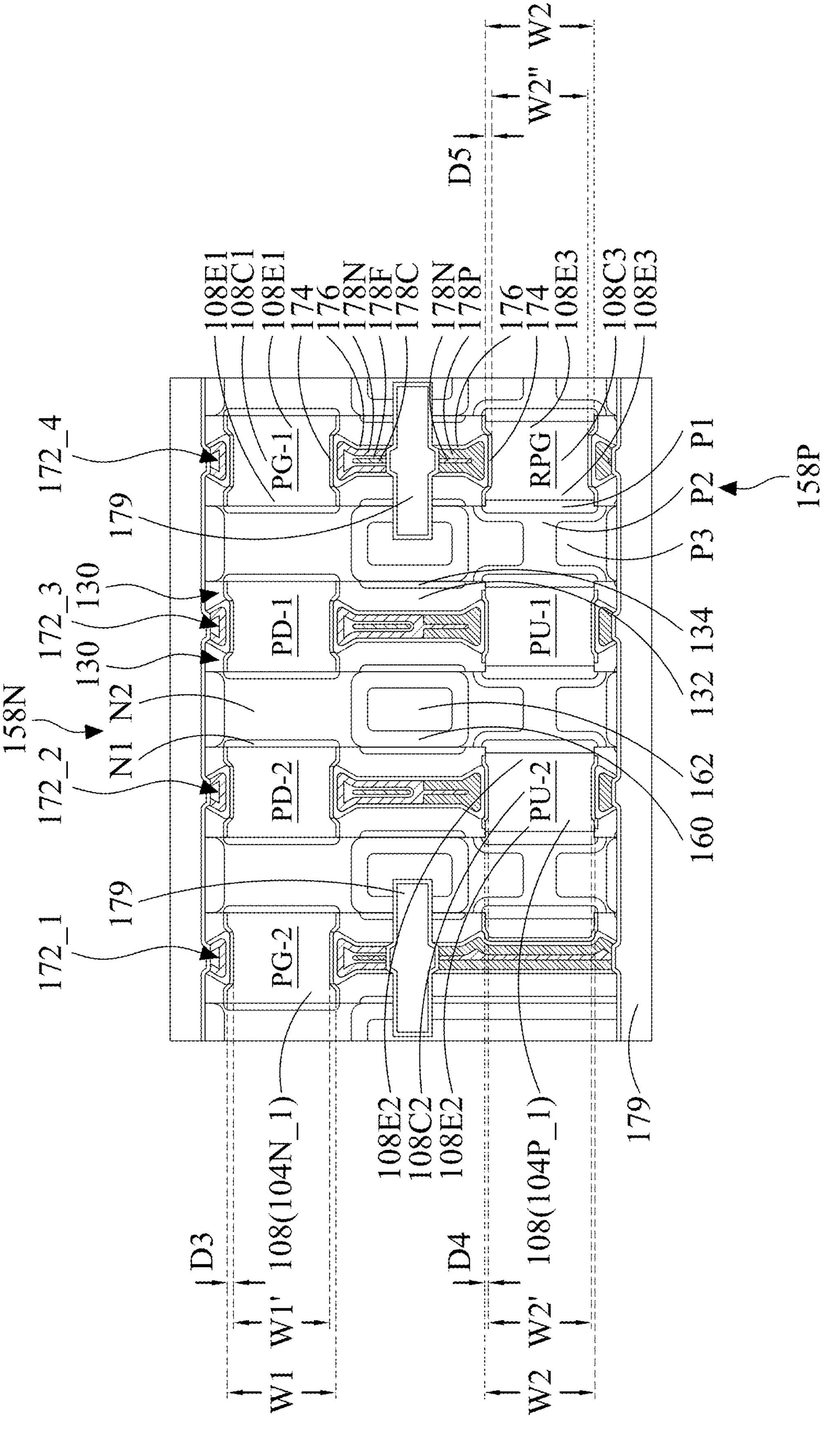
Figure 14:
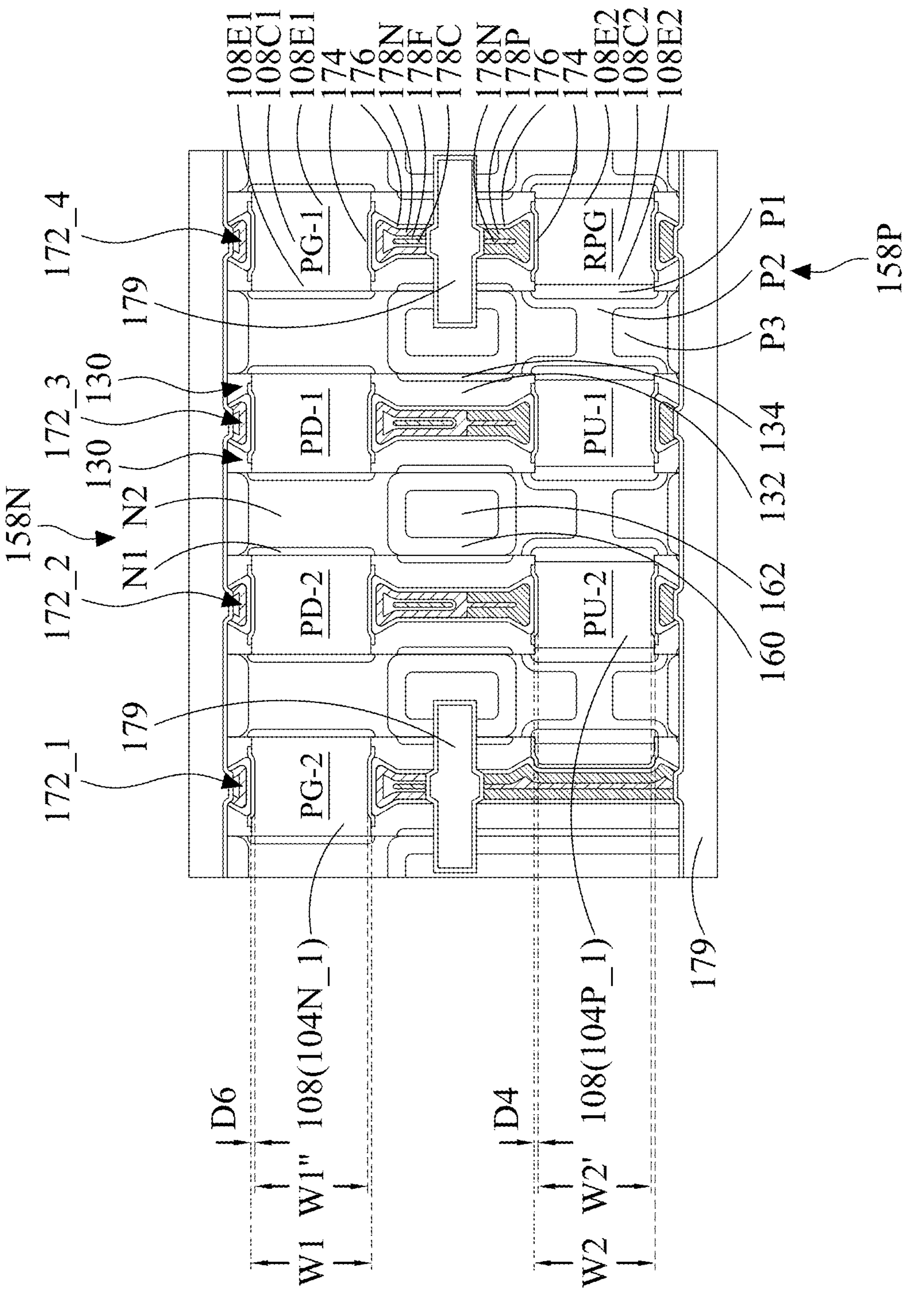
Figure 15:
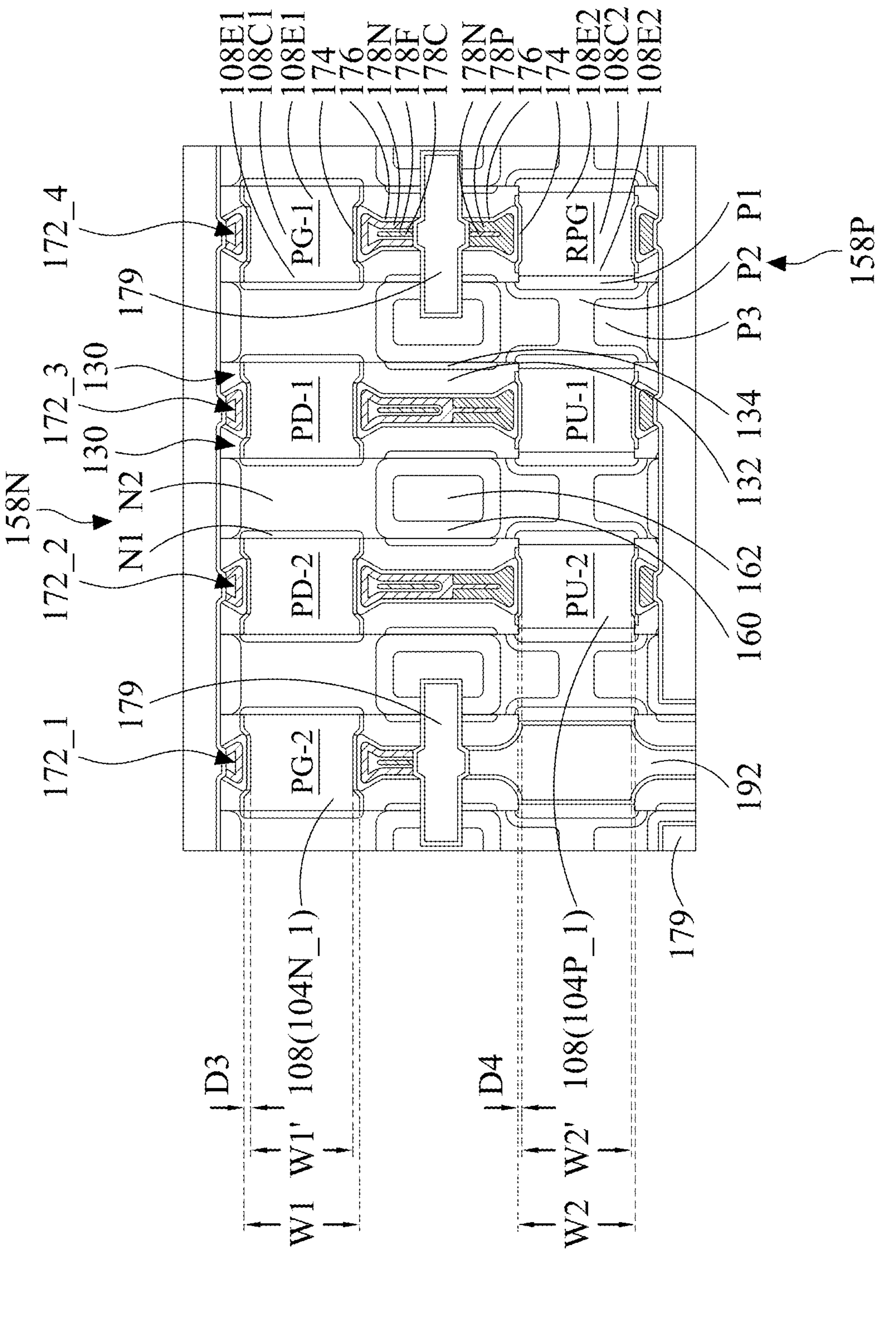
Figure 16:
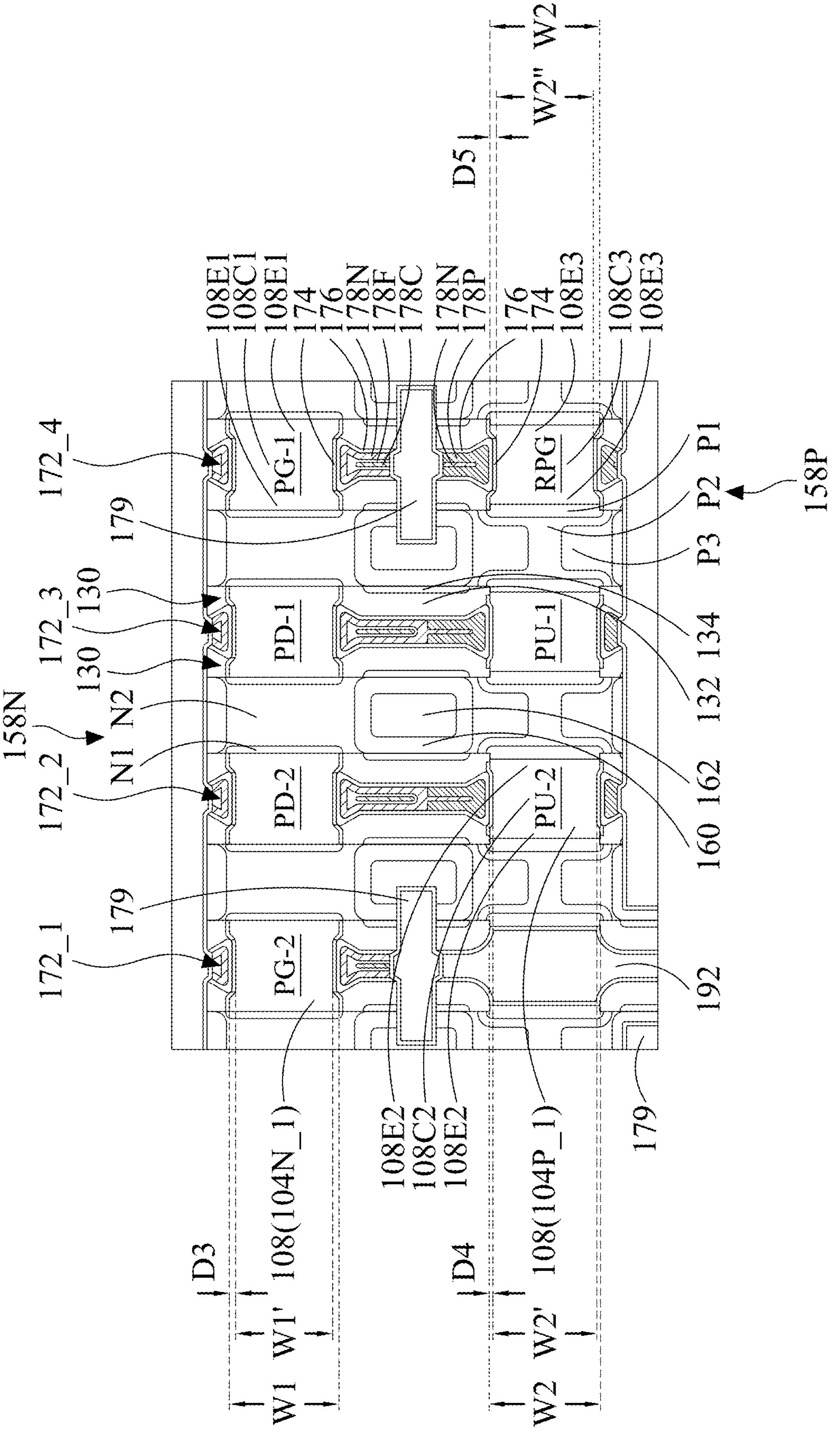
Figure 17:
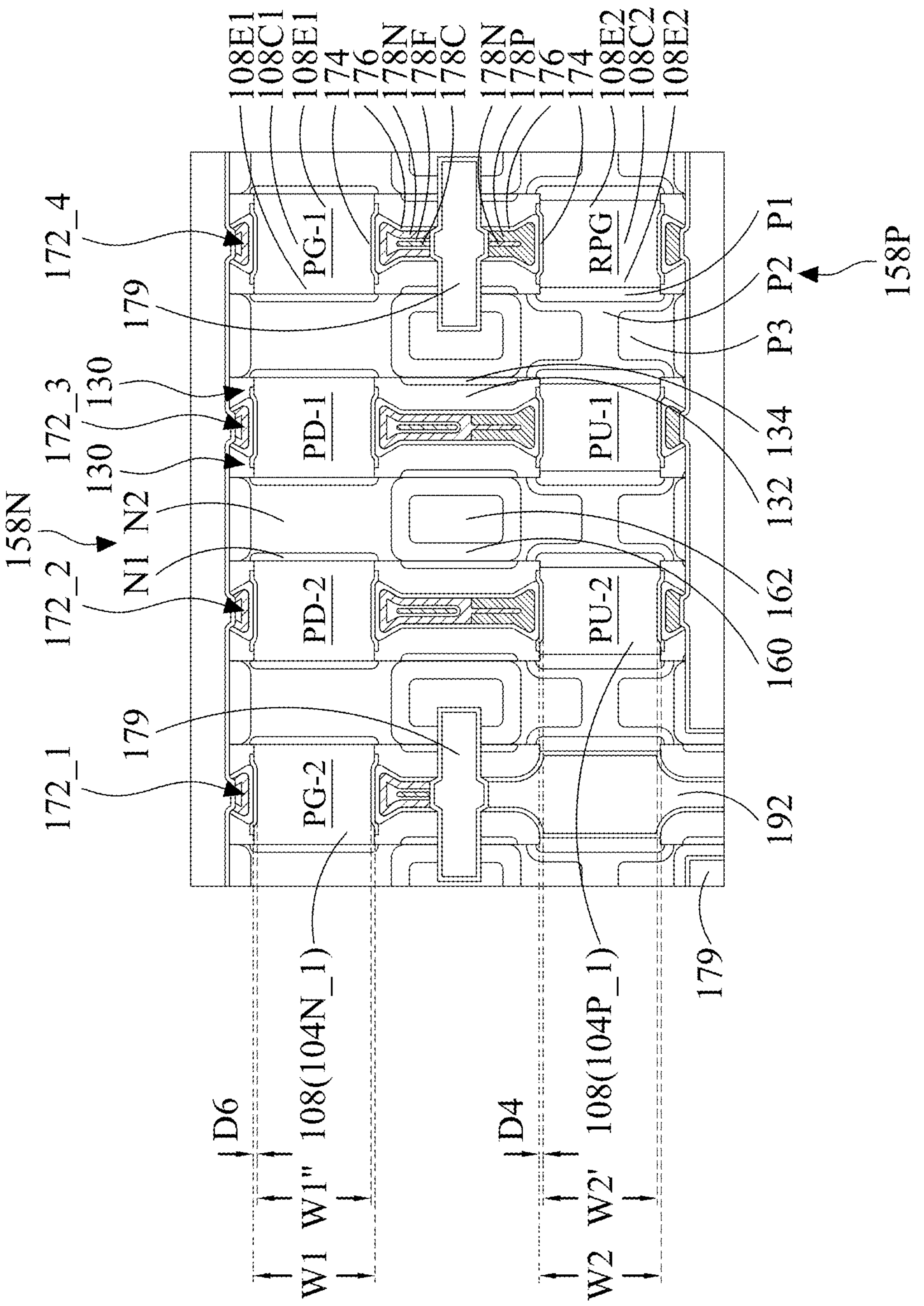

FIGS. 12, 13, 14, 15, 16 and 17 are respective modifications of the semiconductor structures of FIGS. 5M-4, 6F-3, 7D-3, 9B-3, 10 and 11, in accordance with some embodiments of the disclosure. In some embodiment, one gate-cut feature 179 is located within the SRAM cell region, and cuts through the final gate stacks 172_1, as shown in FIGS. 12, 13 and 14. In some embodiment, one gate-cut feature 179 is located within the SRAM cell region, and cuts through the final gate stacks 172_1 and the cutting feature 192, as shown in FIGS. 15, 16 and 17.

As described above, the aspect of the present disclosure is directed to forming a semiconductor structure of a 7T SRAM device including nanostructure transistors. The method includes the DOI process in which the first semiconductor layers 106 of the active region are replaced with the dielectric layers 142I. Due to the relatively high etching selectivity between the dielectric layers 142I and the second semiconductor layers 108, the resulting transistors may have a greater effective channel width. In some embodiments, the formation of the p-channel transistors PU and RPG includes the DOI process, and therefore the performance (e.g., operation speed) of the resulting SRAM device may be enhanced.

In other embodiments, the formation of the pull-up transistors PU includes the DOI process, but the read-port pass-gate transistor RPG does not include the DOI process, and therefore the performance of the resulting SRAM device may be enhanced, e.g., reduction in Vddr. In yet other embodiments, the formation of both the n-channel and p-channel transistors PD, PU, PG and RPG includes the DOI process, and therefore the performance (e.g., operation speed) of the resulting SRAM device may be enhanced.

Embodiments of a semiconductor structure and the method for forming the same may be provided. The method for forming a semiconductor structure may include forming an active region in an SRAM cell region, replacing first semiconductor layers of the active region with dielectric layers, removing the dielectric layers to form channel layers, and forming a gate stack to surround channel layers. The replacement of the first semiconductor layers with the dielectric layers may reduce the loss of the channel layers. Therefore, the performance of the resulting SRAM device may be enhanced.

In some embodiments, a method for forming a semiconductor structure is provided. The method includes forming a first active region and a second active region in an n-type well and a p-type well of a substrate, respectively. Each of the first active region and the second active region includes first semiconductor layers and second semiconductor layers alternatingly stacked. The method also includes replacing the first semiconductor layers of the first active region with dielectric layers, removing the dielectric layers to form a plurality of first gaps, removing the first semiconductor layers of the second active region to form a plurality of second gaps, and forming a first gate stack to fill the plurality of first gaps and the plurality of second gaps.

In some embodiments, a method for forming a semiconductor structure is provided. The method includes forming a first active region and a second active region in a static random access memory cell region. The second active region includes first semiconductor layers and second semiconductor layers alternatingly stacked, and the first active region includes dielectric layers and the second semiconductor layers alternatingly stacked. The method also includes forming a p-type source/drain feature and an n-type source/drain feature on the first active region and the second active region, respectively, removing the dielectric layers of the first active region, removing the first semiconductor layers of the second active region, and forming a gate stack to surround the second semiconductor layers of the first active region and the second semiconductor layers of the second active region.

In some embodiments, a semiconductor structure is provided. The semiconductor structure includes a pull-down transistor including first nanostructures and a first gate stack, a pull-up transistor including second nanostructures and the first gate stack, and a gate spacer layer along the first gate stack. The first gate stack extends in a first horizontal direction. The first nanostructures include respective center portions surrounded by the first gate stack and having a first width in the first horizontal direction, and respective edge portions surrounded by the gate spacer layer and having a second width in the first horizontal direction. The second nanostructures include respective center portions surrounded by the first gate stack and having a third width in the first horizontal direction, and respective edge portions surrounded by the gate spacer layer and having a fourth width in the first horizontal direction. A first ratio of the second width to the first width is greater than a second ratio of the fourth width to the third width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:

forming a first active region and a second active region in an n-type well and a p-type well of a substrate, respectively, wherein each of the first active region and the second active region includes first semiconductor layers and second semiconductor layers alternatingly stacked;

replacing the first semiconductor layers of the first active region with dielectric layers;

removing the dielectric layers which replace the first semiconductor layers of the first active region to form a plurality of first gaps;

removing the first semiconductor layers of the second active region to form a plurality of second gaps; and forming a first gate stack to fill the plurality of first gaps and the plurality of second gaps.

2. The method for forming the semiconductor structure as claimed in claim 1, wherein:

the first gate stack surrounds the second semiconductor layers of the first active region to form a read-port pass-gate transistor of a static random access memory cell region, and the first gate stack surrounds the second semiconductor layers of the second active region to form a pass-gate transistor of the static random access memory cell region.

3. The method for forming the semiconductor structure as claimed in claim 1, wherein removing the dielectric layers further comprises forming a plurality of third gaps, removing the first semiconductor layers of the second active region comprises further forming a plurality of fourth gaps, and the method further comprises:

forming a second gate stack to fill the plurality of third gaps and the plurality of fourth gaps.

4. The method for forming the semiconductor structure as claimed in claim 3, wherein:

the first gate stack surrounds the second semiconductor layers of the first active region to form a first pull-up transistor of a static random access memory cell region, and the second gate stack surrounds the second semiconductor layers of the first active region to form a second pull-up transistor of the static random access memory cell region.

5. The method for forming the semiconductor structure as claimed in claim 1, further comprising:

forming an isolation structure to surround the first active region and the second active region, wherein the isolation structure includes a lining layer along the first active region and the second active region, a first bulk layer nested within the lining layer, and a second bulk layer above tops of the first bulk layer and lining layer and made of a different material than the first bulk layer.

6. The method for forming the semiconductor structure as claimed in claim 5, further comprising:

forming a dummy gate structure across the first active region and the second active region;

forming gate spacer layers alongside the dummy gate structure; and removing the dummy gate structure to form a trench, wherein the second bulk layer is recessed while removing the dummy gate structure, and the first gate stack fills the trench.

7. The method for forming the semiconductor structure as claimed in claim 6, further comprising, before removing the dummy gate structure:

replacing a portion of the dummy gate structure overlapping the first active region with a cutting feature.

8. The method for forming the semiconductor structure as claimed in claim 1, wherein replacing the first semiconductor layers of the first active region with the dielectric layers comprises:

forming a patterned mask layer to cover the second active region;

removing the first semiconductor layers of the first active region to form third gaps;

depositing a dielectric material to fill the third gaps;

removing the dielectric material outside the third gaps; and removing the patterned mask layer.

9. A method for forming a semiconductor structure, comprising:

forming a first active region and a second active region in a static random access memory cell region, wherein the second active region includes first semiconductor layers and second semiconductor layers alternatingly stacked, and the first active region includes dielectric layers and the second semiconductor layers alternatingly stacked, wherein forming the first active region comprises:

forming a stack of alternating the first semiconductor layers and the second semiconductor layers;

etching the stack to form a source/drain recess;

removing the first semiconductor layers of the stack to form gaps continuously extending between the source/drain recess;

depositing a dielectric material to partially fill the source/drain recess and overfill the gaps; and removing a first portion of the dielectric material in the source/drain recess, wherein a second portion of the dielectric material in the gaps forms the dielectric layers of the first active region;

forming a p-type source/drain feature and an n-type source/drain feature on the first active region and the second active region, respectively, wherein the p-type source/drain feature is formed in the source/drain recess;

removing the dielectric layers of the first active region;

removing the first semiconductor layers of the second active region; and forming a gate stack to surround the second semiconductor layers of the first active region and the second semiconductor layers of the second active region.

10. The method for forming the semiconductor structure as claimed in claim 9, wherein:

the second semiconductor layers of the first active region are etched with a first etching amount during removal of the dielectric layers of the first active region, the second semiconductor layers of the second active region are etched with a second etching amount during removal of the first semiconductor layers of the second active region, and the second etching amount is higher than the first etching amount.

11. The method for forming the semiconductor structure as claimed in claim 9, further comprising:

laterally recessing the dielectric layers of the first active region to form first notches;

forming first inner spacer layers in the first notches;

laterally recessing the first semiconductor layers of the second active region to form second notches; and forming second inner spacer layers in the second notches.

12. The method for forming the semiconductor structure as claimed in claim 11, wherein a germanium concentration of the first inner spacer layers is less than a germanium concentration of the second inner spacer layers.

13. The method for forming the semiconductor structure as claimed in claim 11, wherein in a vertical direction, a first dimension of the second inner spacer layers is greater than a second dimension of the first inner spacer layers.

14. A semiconductor structure, comprising:

a pull-down transistor including first nanostructures and a first gate stack;

a pull-up transistor including second nanostructures and the first gate stack; and a first gate spacer layer along the first gate stack, wherein:

the first gate stack extends in a first horizontal direction, the first nanostructures include respective center portions surrounded by the first gate stack and having a first width in the first horizontal direction, and respective edge portions surrounded by the first gate spacer layer and having a second width in the first horizontal direction, the second nanostructures include respective center portions surrounded by the first gate stack and having a third width in the first horizontal direction, and respective edge portions surrounded by the first gate spacer layer and having a fourth width in the first horizontal direction, a first ratio of the second width to the first width is greater than a second ratio of the fourth width to the third width, and in a plan view, the first gate spacer layer includes a first portion connecting between a respective first nanostructure and a respective second nanostructure, the first gate stack includes a first portion connecting between the respective first nanostructure and the respective second nanostructure, the first portion of the first gate spacer layer has a first edge facing an edge portion of the respective first nanostructure, and the first portion of the first gate stack extends in the first horizontal direction beyond the first edge by a first distance.

15. The semiconductor structure as claimed in claim 14, further comprising:

a read-port pass-gate transistor including third nanostructures and a second gate stack; and a second gate spacer layer along the second gate stack, wherein:

the second gate stack extends in the first horizontal direction, the third nanostructures include respective center portions surrounded by the second gate stack and having a fifth width in the first horizontal direction, and respective edge portions surrounded by the second gate spacer layer and having a sixth width in the first horizontal direction, and a third ratio of the sixth width to the fifth width is greater than the second ratio.

16. The semiconductor structure as claimed in claim 14, further comprising:

a read-port pass-gate transistor including third nanostructures and a second gate stack; and a second gate spacer layer along the second gate stack, wherein:

the second gate stack extends in the first horizontal direction, the third nanostructures include respective center portions surrounded by the second gate stack and having a fifth width in the first horizontal direction, and respective edge portions surrounded by the second gate spacer layer and having a sixth width in the first horizontal direction, and a third ratio of the sixth width to the fifth width is less than the first ratio.

17. The semiconductor structure as claimed in claim 16, further comprising:

a first lower fin element extending under the pull-down transistor in a second horizontal direction, wherein the second horizontal direction is perpendicular to the first horizontal direction; and a second lower fin element extending under the pull-up transistor and the read-port pass-gate transistor in the second horizontal direction.

18. The semiconductor structure as claimed in claim 16, further comprising:

a pass-gate transistor including fourth nanostructures and the second gate stack, wherein:

the fourth nanostructures include respective center portions surrounded by the second gate stack and having a seventh width in the first horizontal direction, and respective edge portions surrounded by the second gate spacer layer and having an eighth width in the first horizontal direction, and a fourth ratio of the eighth width to the seventh width is greater than the second ratio.

19. The semiconductor structure as claimed in claim 14, further comprising:

first inner spacer layers between the first nanostructures and directly under the first gate spacer layer; and second inner spacer layers between the second nanostructures and directly under the first gate spacer layer, wherein in a vertical direction, a first dimension of the first inner spacer layers is greater than a second dimension.

20. The semiconductor structure as claimed in claim 14, wherein in a plan view, the first portion of the first gate spacer layer has a second edge facing an edge portion of a respective second nanostructure, and the first portion the first gate stack extends in the first horizontal direction beyond the second edge by a second distance that is less than the first distance.

* * * * *